United States Patent [19]

Zdebel et al.

[11] Patent Number: 4,837,176
[45] Date of Patent: Jun. 6, 1989

[54] INTEGRATED CIRCUIT STRUCTURES HAVING POLYCRYSTALLINE ELECTRODE CONTACTS AND PROCESS

[75] Inventors: Peter J. Zdebel, Mesa; Raymond J. Balda, Tempe; Bor-Yuan Hwang, Chandler; Allen J. Wagner, Phoenix, all of Ariz.

[73] Assignee: Motorola Inc., Schaumburg, Ill.

[21] Appl. No.: 9,322

[22] Filed: Jan. 30, 1987

[51] Int. Cl.$^4$ .................................... H01L 21/265
[52] U.S. Cl. ............................ 437/31; 437/228; 437/968; 437/193; 437/228; 357/34; 357/59
[58] Field of Search ............ 437/29, 31, 32, 33, 437/34, 47, 162, 968

[56] References Cited

U.S. PATENT DOCUMENTS

| | | | |
|---|---|---|---|
| Re. 30,282 | 5/1980 | Hunt et al. | 437/47 |
| 4,319,932 | 3/1982 | Jambotkar | 437/26 |
| 4,324,038 | 4/1982 | Chang et al. | 29/571 |
| 4,381,953 | 5/1983 | Ho et al. | 437/31 |
| 4,430,793 | 2/1984 | Hart | 437/31 |
| 4,445,967 | 5/1984 | Kameyama | 156/648 |
| 4,483,726 | 11/1984 | Isaac et al. | 437/31 |
| 4,495,010 | 1/1985 | Kranzer | 437/31 |
| 4,516,316 | 5/1985 | Haskell | 437/968 |
| 4,536,950 | 8/1985 | Sadamatsu et al. | 29/578 |
| 4,545,113 | 10/1985 | Vora | 437/32 |
| 4,545,114 | 10/1985 | Ito et al. | 437/51 |
| 4,581,319 | 4/1986 | Wieder et al. | 430/314 |
| 4,590,666 | 5/1986 | Goto | 29/511 |
| 4,593,453 | 6/1986 | Tam et al. | 437/34 |
| 4,602,419 | 7/1986 | Harrison et al. | 437/156 |
| 4,602,421 | 7/1986 | Lee et al. | 437/46 |
| 4,604,641 | 8/1986 | Konishi | 357/59 |
| 4,604,789 | 8/1986 | Bourassa | 437/60 |
| 4,608,589 | 8/1986 | Goth et al. | 357/34 |
| 4,611,384 | 9/1986 | Bencuya et al. | 437/38 |
| 4,612,701 | 9/1986 | Cox | 437/72 |
| 4,640,721 | 2/1987 | Uehara et al. | 437/110 |
| 4,641,170 | 2/1987 | Ogura et al. | 357/35 |
| 4,641,416 | 2/1987 | Iranmanesh et al. | 437/31 |
| 4,641,419 | 2/1987 | Kudo | 437/31 |
| 4,648,909 | 3/1987 | Krishna et al. | 437/31 |
| 4,659,428 | 4/1987 | Maas et al. | 437/968 |
| 4,689,872 | 9/1987 | Appels et al. | 437/228 |

OTHER PUBLICATIONS

"At IEDM, New Ways to Boost Chip Speed and Density", *Electronics*, Nov. 27, 1986, pp. 66–68.
A. K. Kapoor et al., "An Improved Single-Poly Bipolar Technology for Linear/Digital Applications", *Proceedings of the 1986 Bipolar Circuits & Technology Meeting*, IEEE, Sep. 11-12, 1986, pp. 33–40.
N. F. Gardner et al., "A 3.9 Gigahertz Practical Prescaler in an Oxide-Walled, Self-Aligned Emitter Technology", *Proceedings of the 1986 Bipolar Circuits & Technology Meeting*, IEEE, Sep. 11-12, 1986, Minneapolis, MN.
H. K. Park et al., "High Speed Polysilicon Emitter--Base Bipolar Transistor", *Proceedings of the 1986 Bipolar Circuits and Technology Meeting*, IEEE, Sep. 11-12, 1986, Minneapolis, MN, pp. 39–40.

*Primary Examiner*—Brian E. Hearn
*Assistant Examiner*—Kevin McAndrews
*Attorney, Agent, or Firm*—Robert M. Handy

[57] ABSTRACT

A process is disclosed for fabricating improved integrated circuit devices. In accordance with one embodiment of the invention integrated devices are fabricated by a process which produces small device areas without relying upon restrictive photolithography tolerances. The process uses four polycrystalline silicon layers to fabricate and contact the device regions, to achieve a relatively planar structure, and to reduce the size of device regions below normal photolithographic tolerances. The process uses a master mask to define the basic footprint of the device in combination with easy to align block-out masks in each lithography step. Means and methods for many types of devices such as complementary lateral and vertical bipolar transistors, JFETs, Sits, MOSFETs, resistors, diodes, capacitors and other devices which can be simultaneously fabricated are also described.

35 Claims, 46 Drawing Sheets

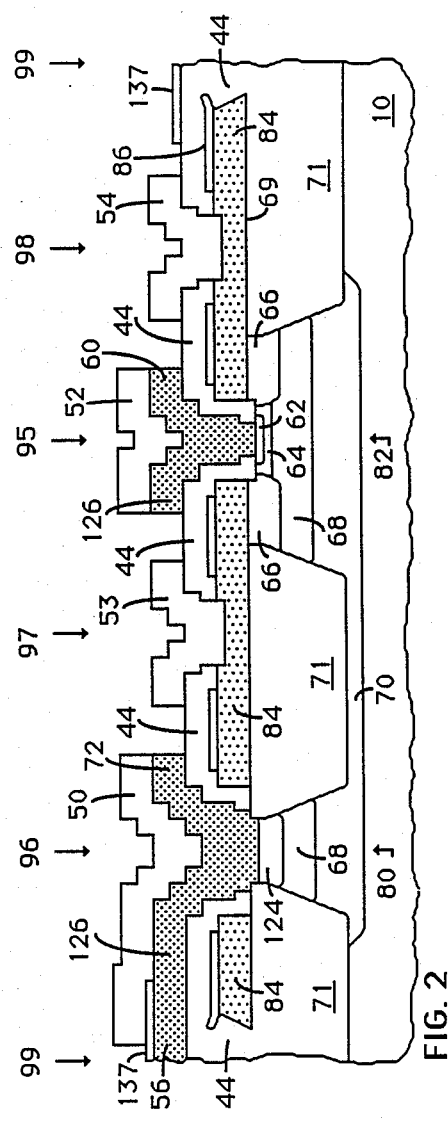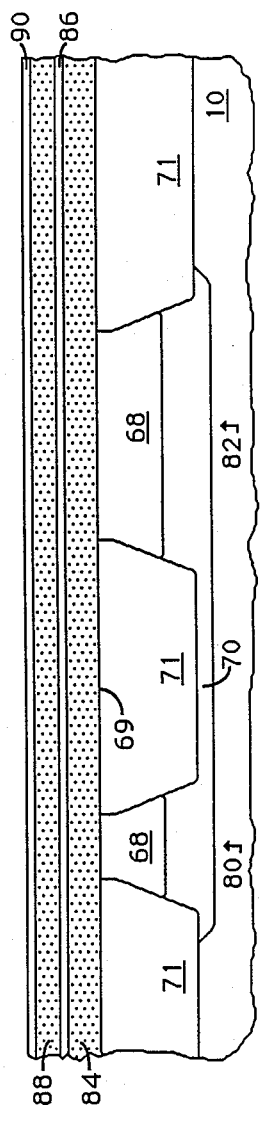

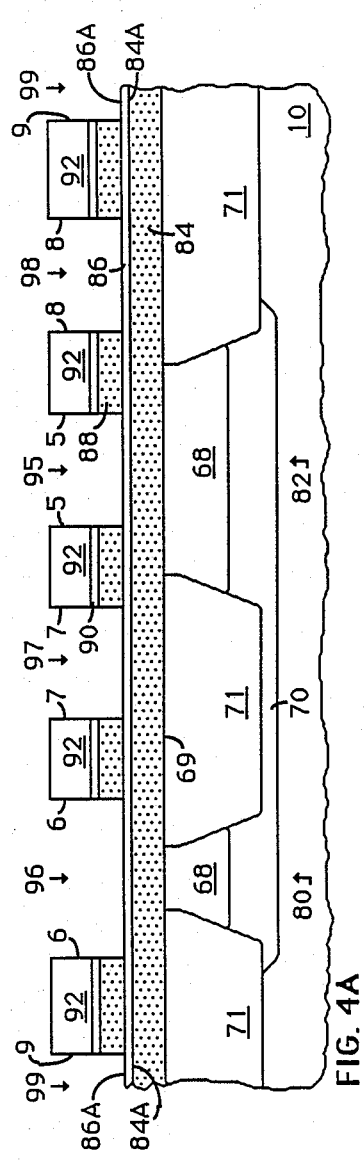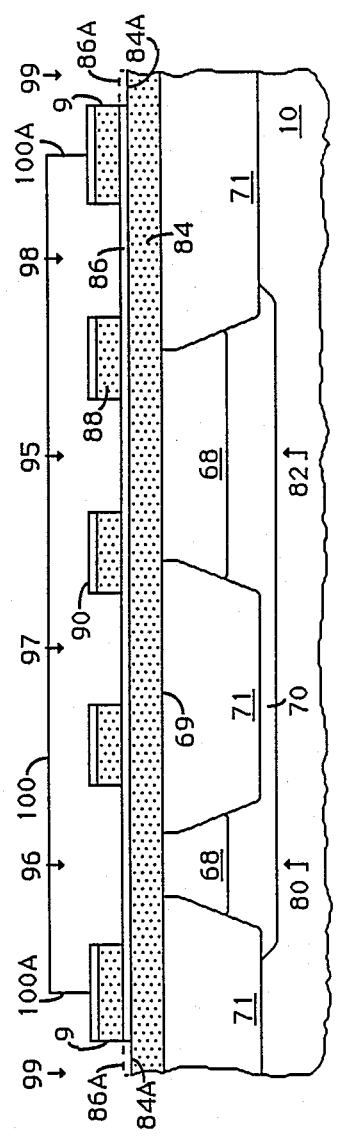

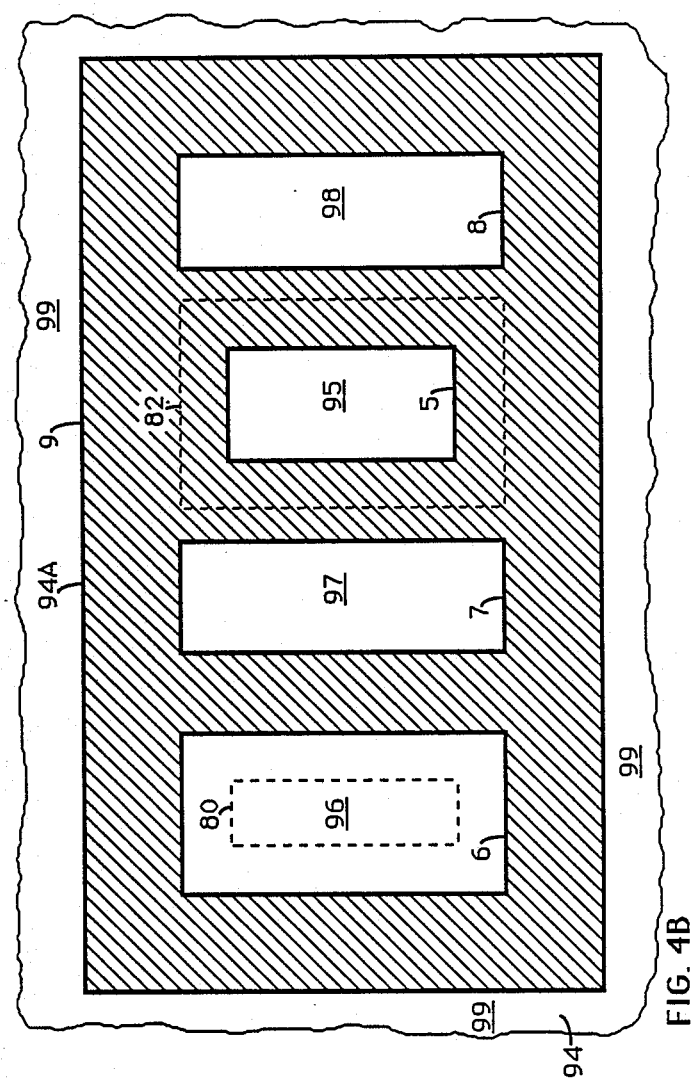

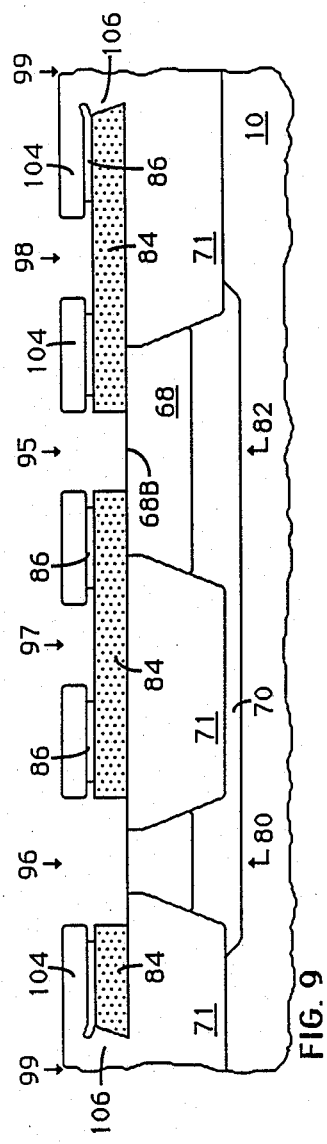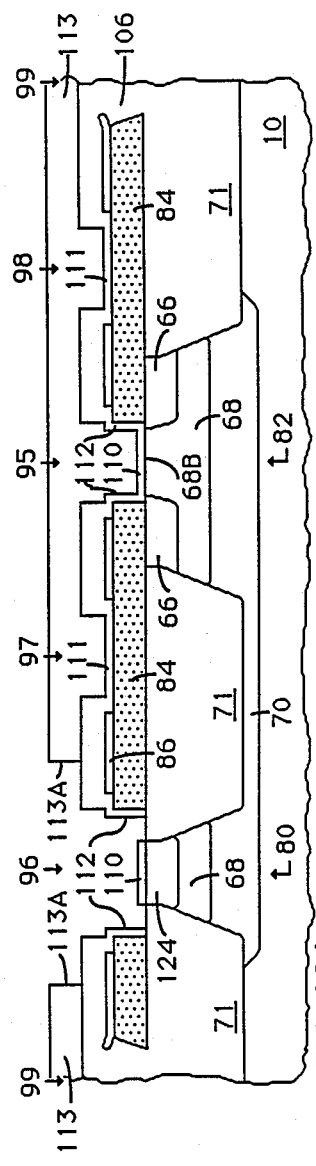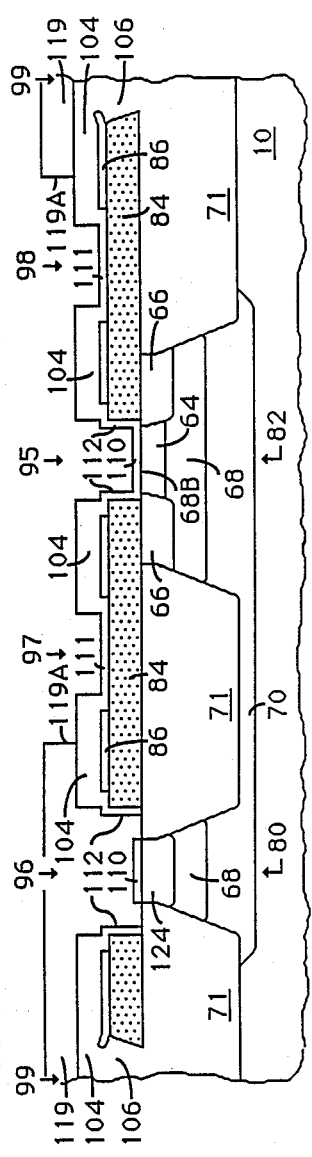

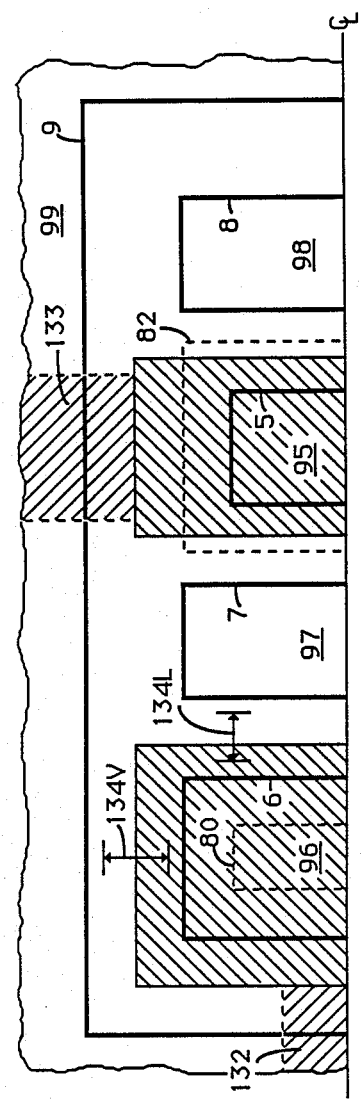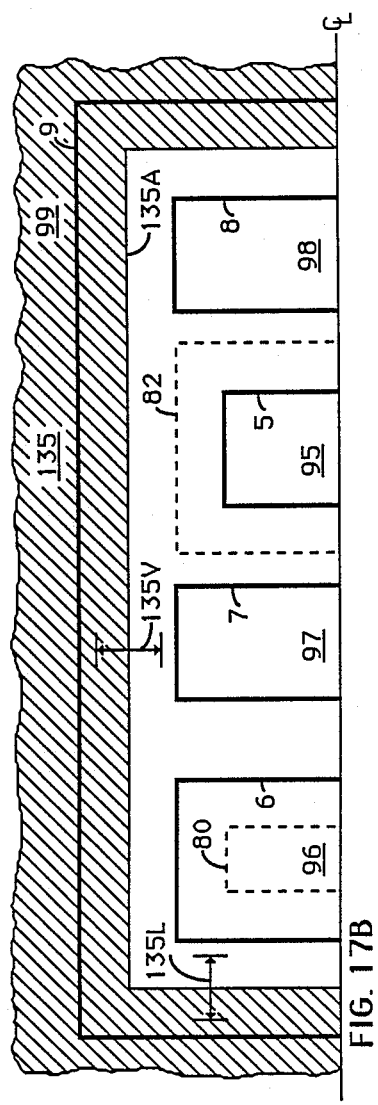

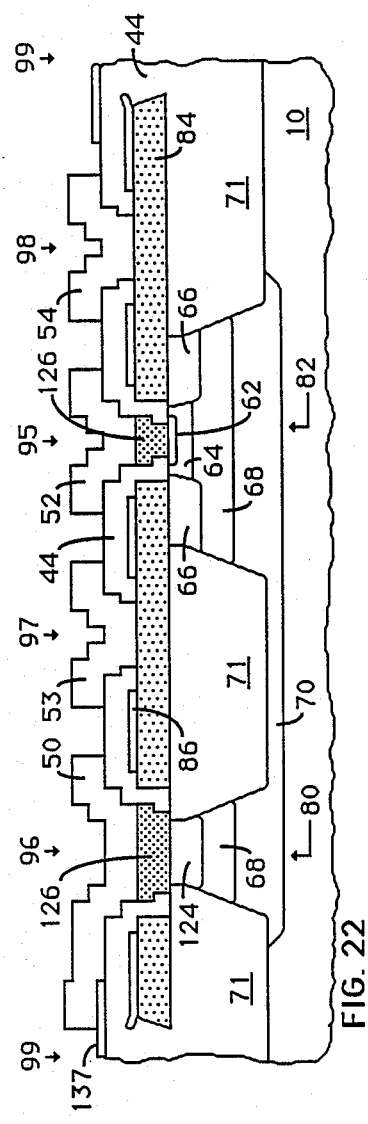
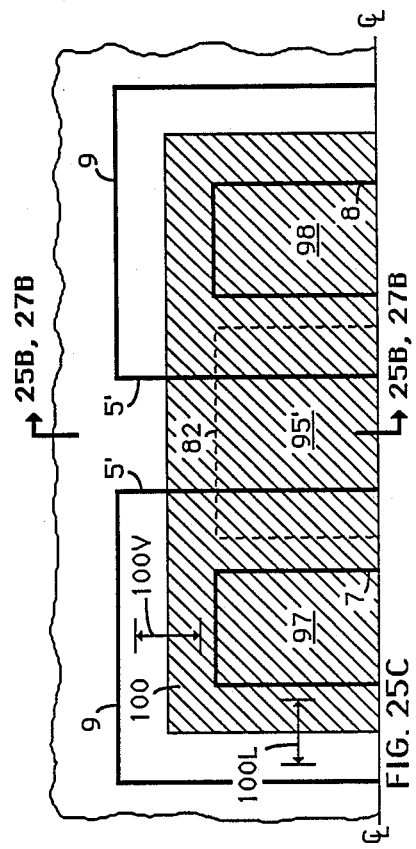
FIG. 22
FIG. 25C

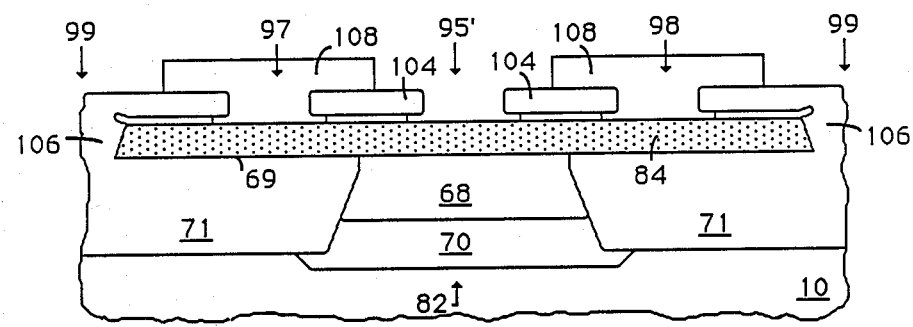
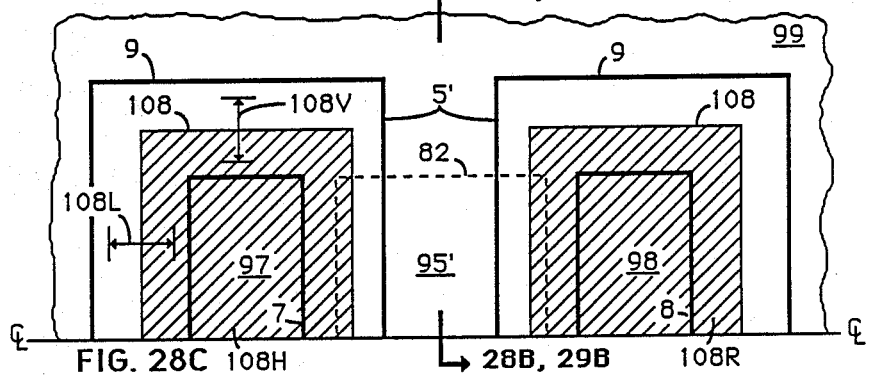
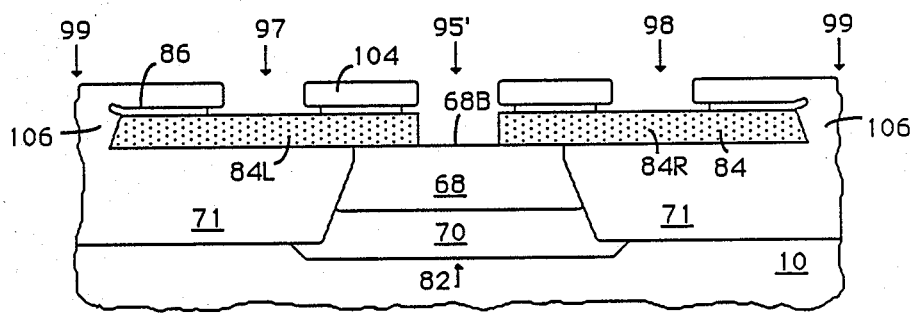
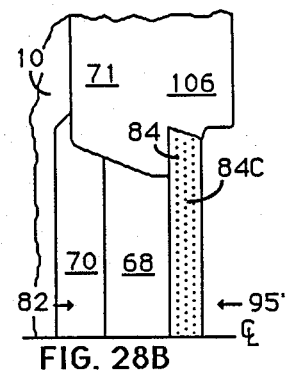
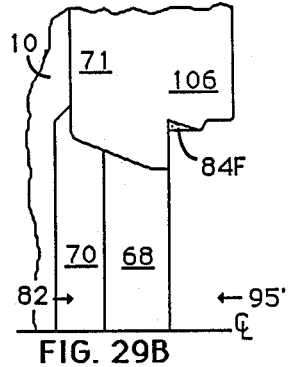

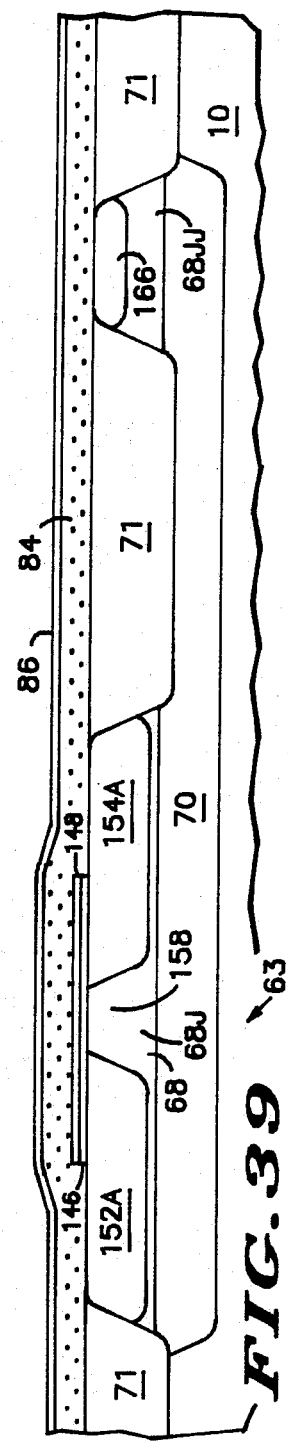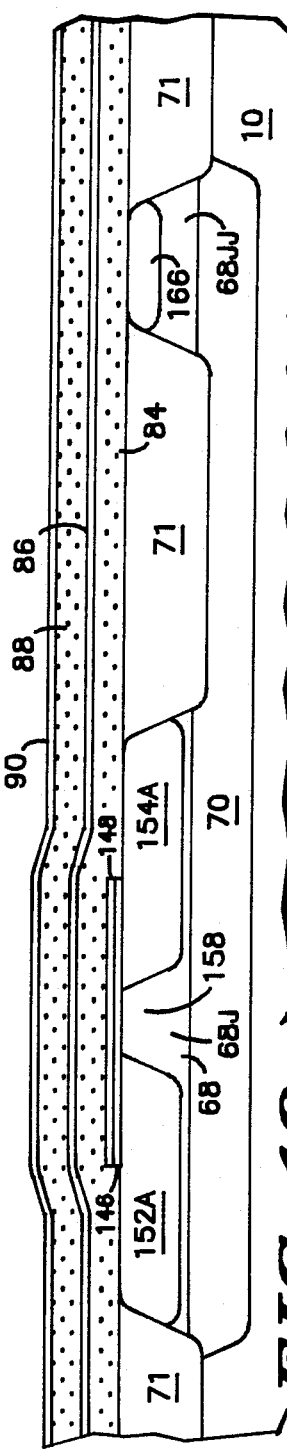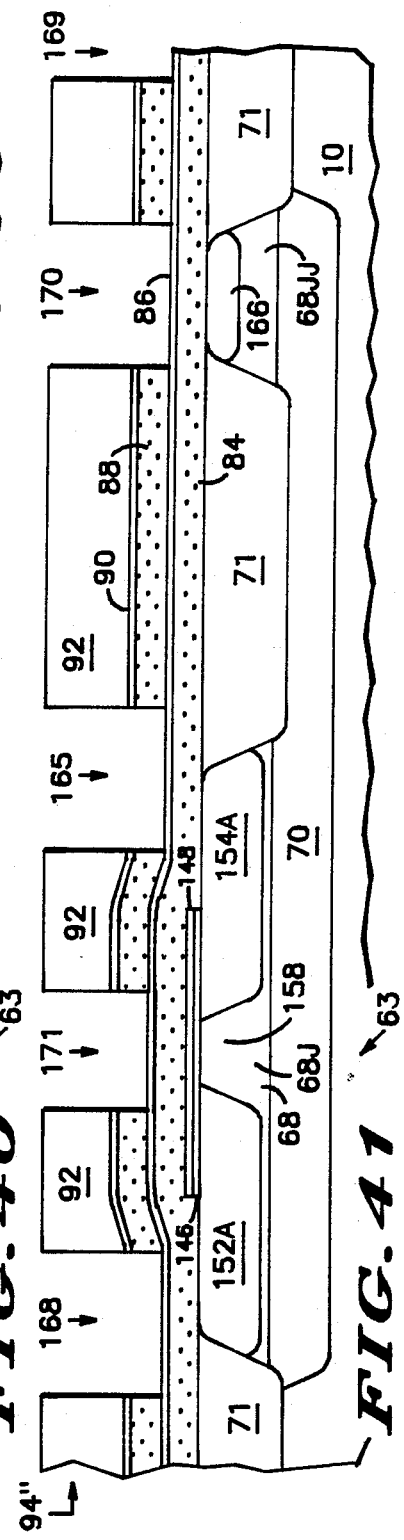

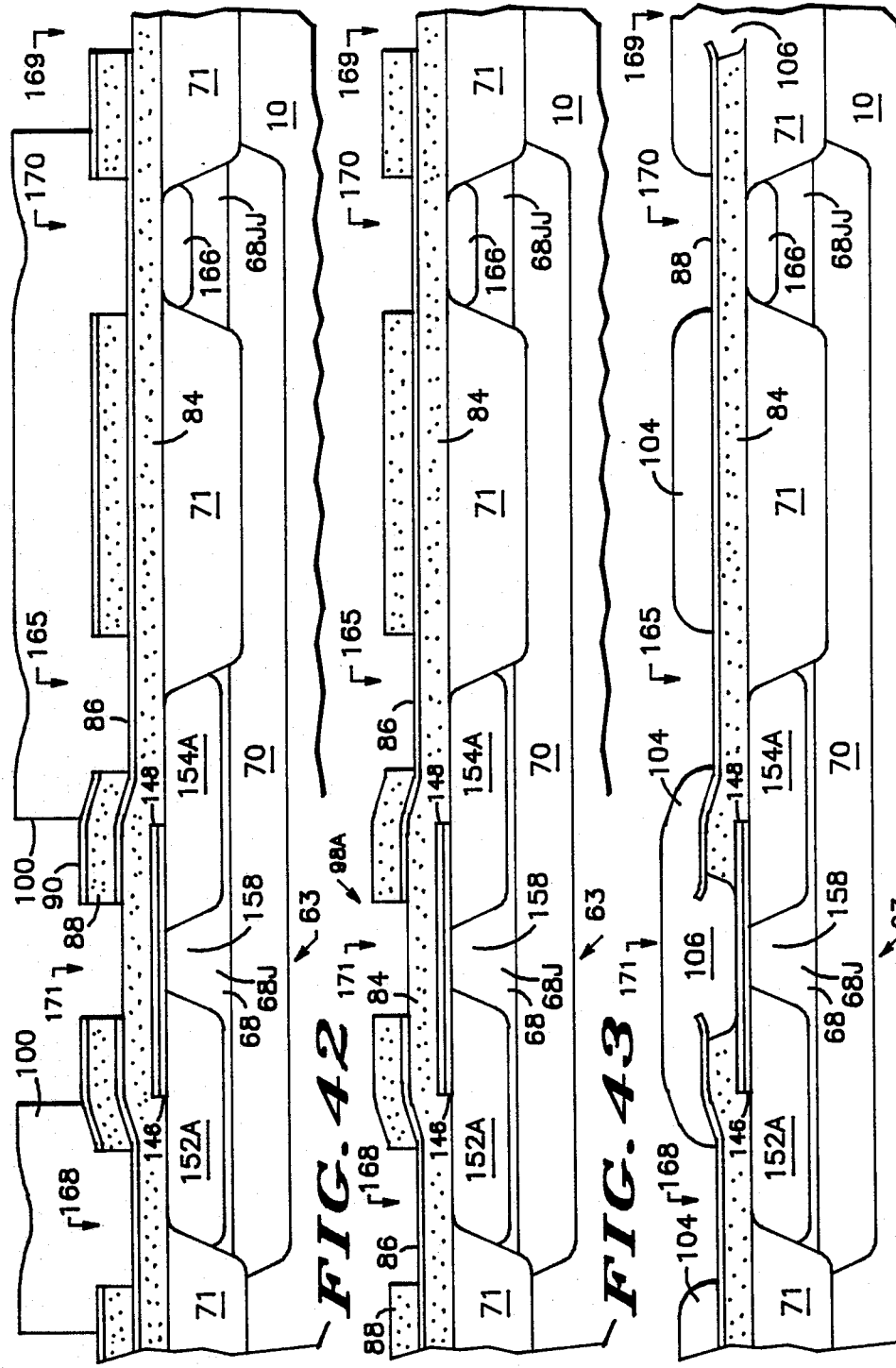

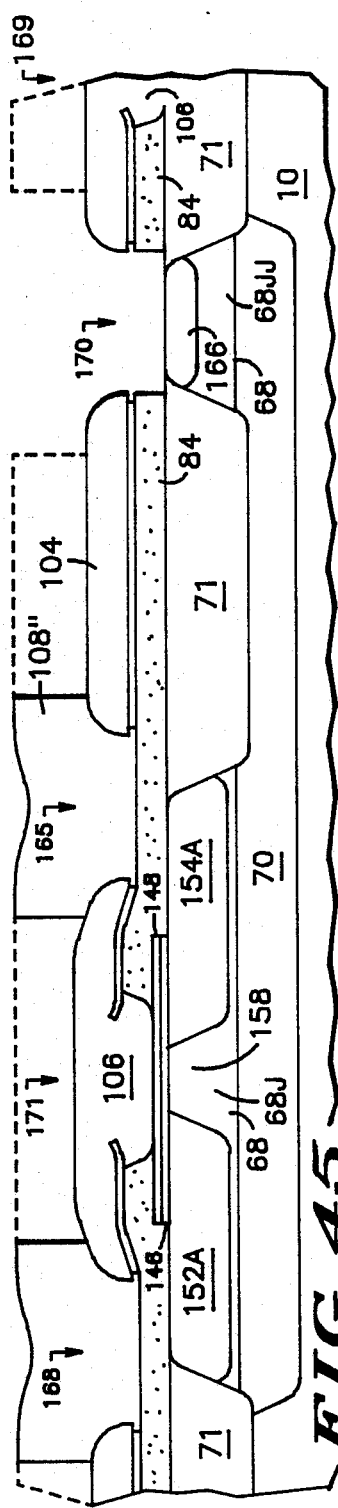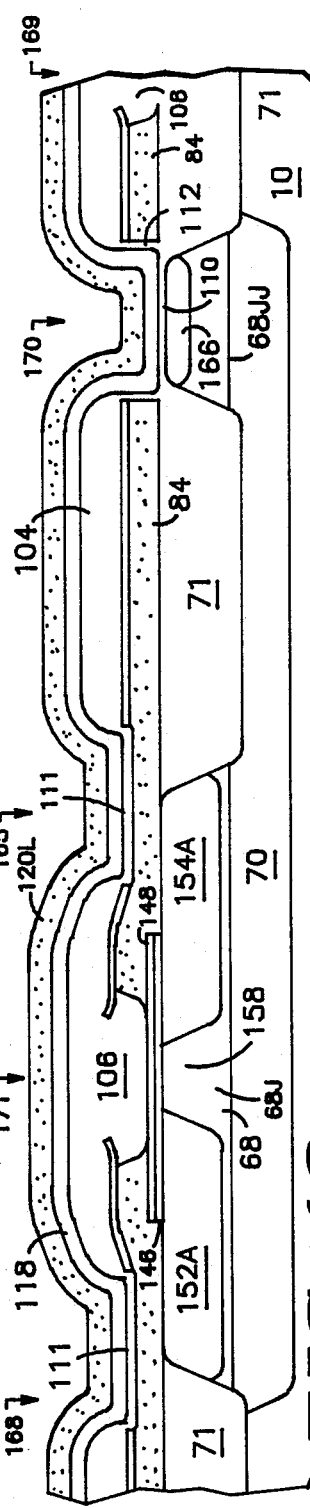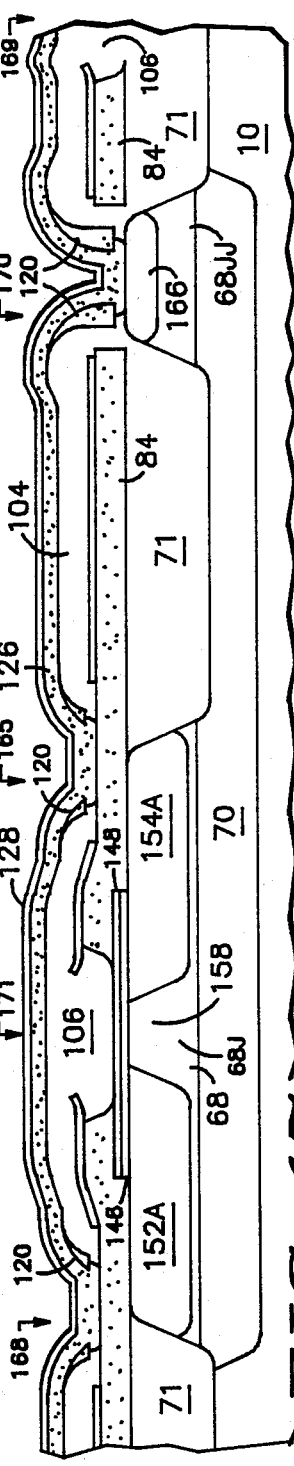

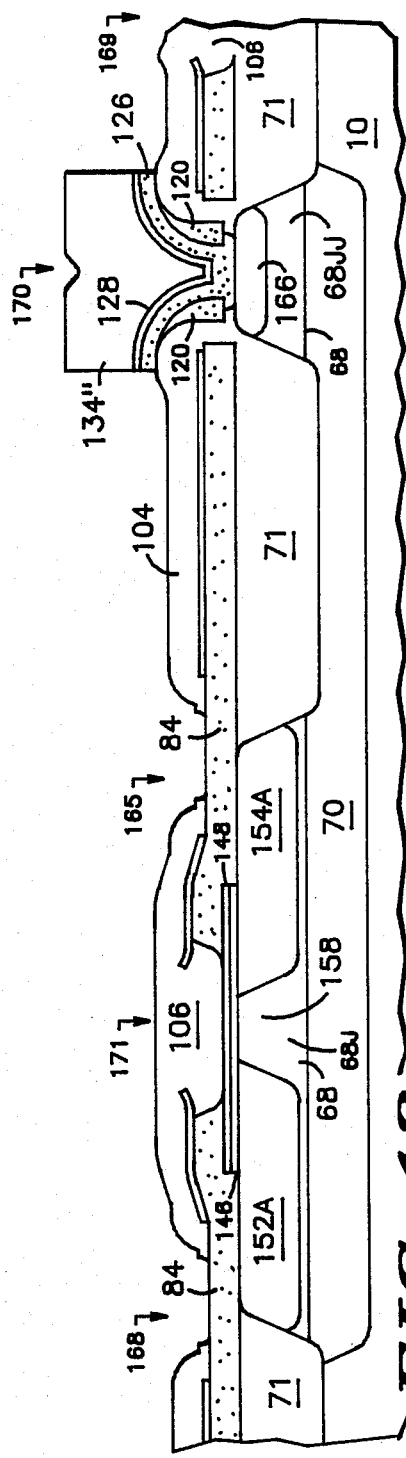
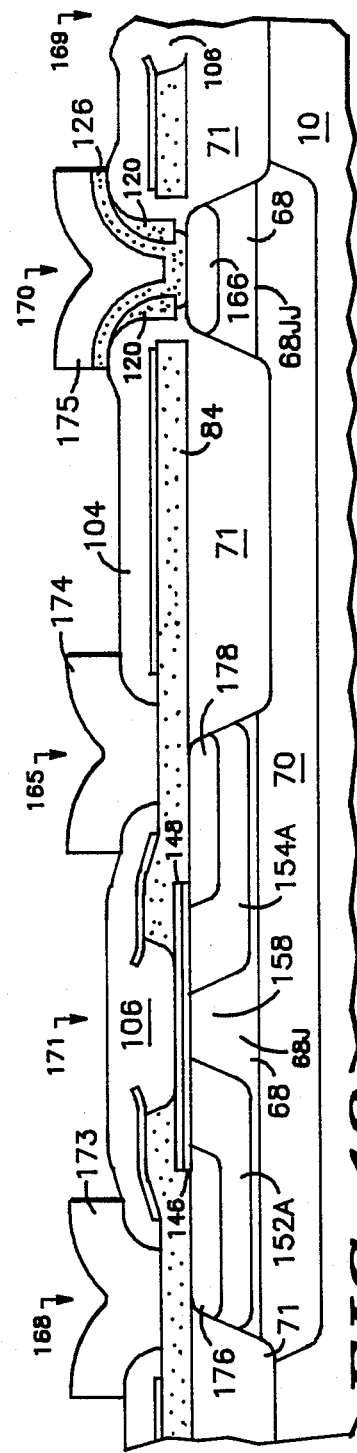
FIG. 48
FIG. 49

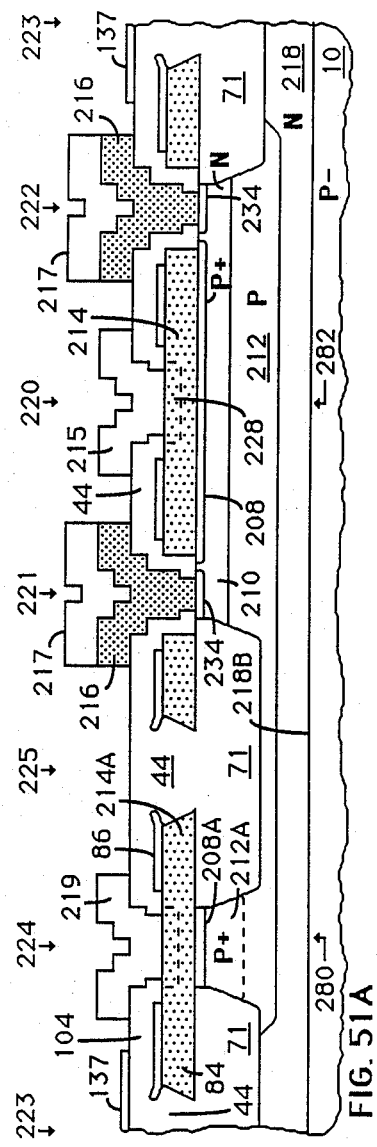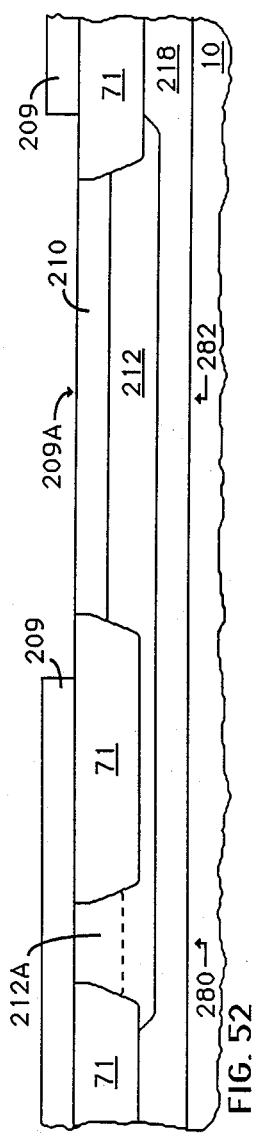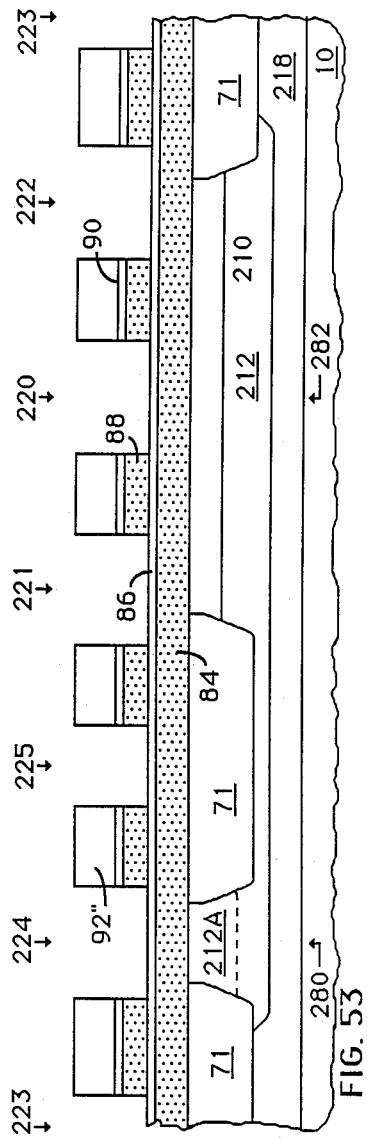

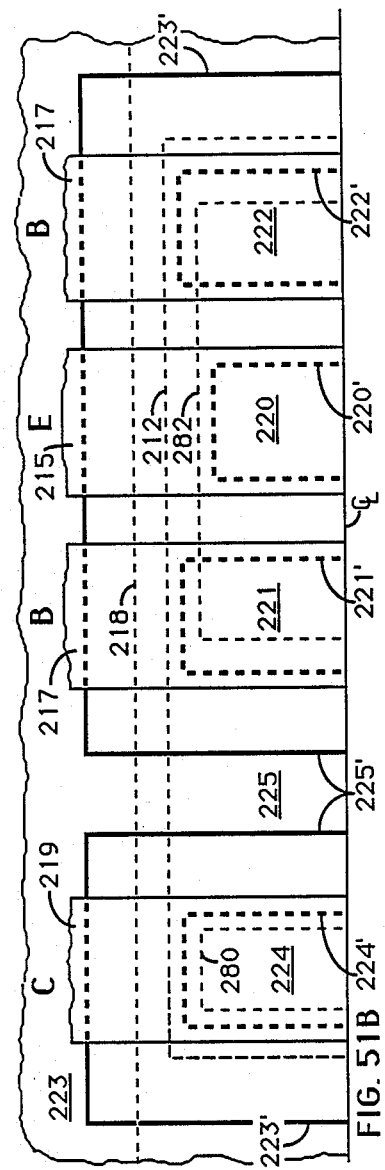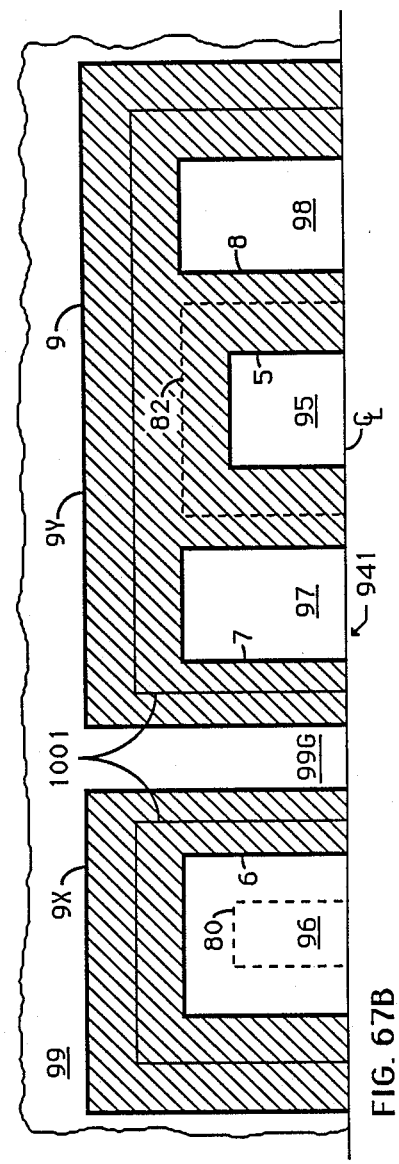
FIG. 51B
FIG. 67B

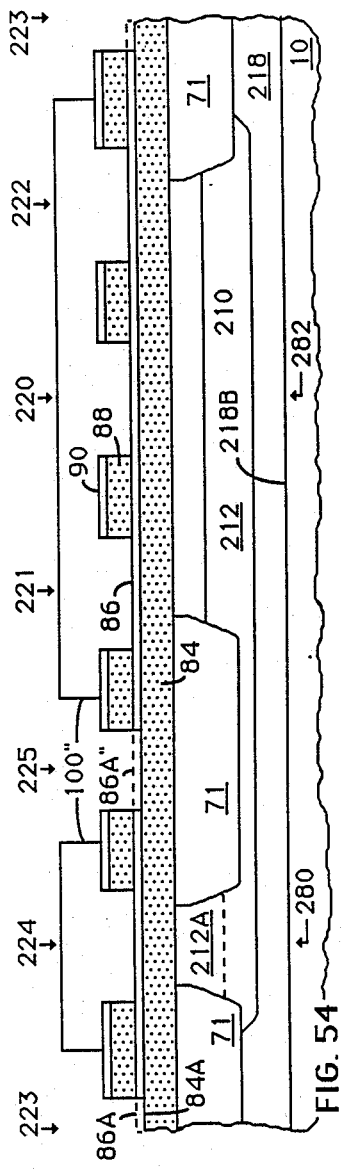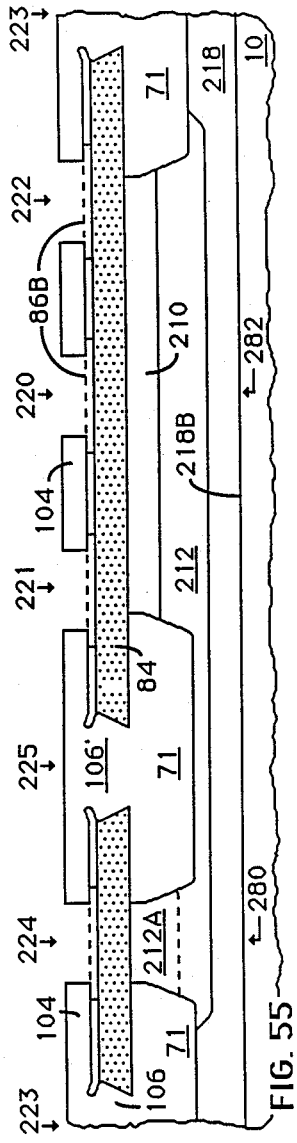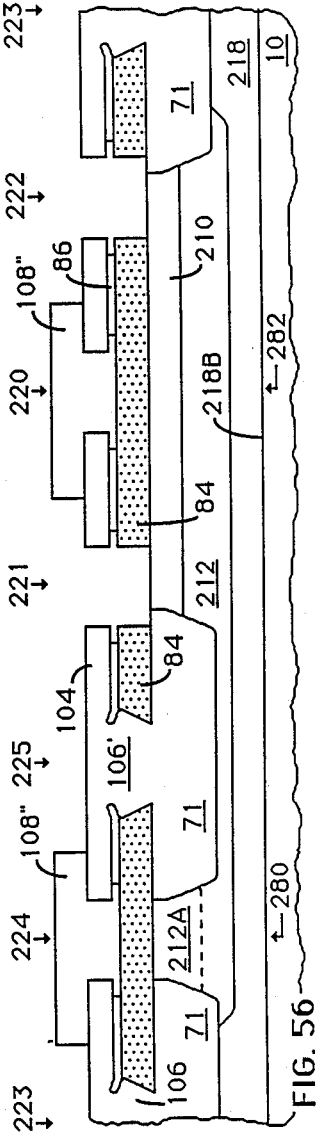
FIG. 54
FIG. 55
FIG. 56

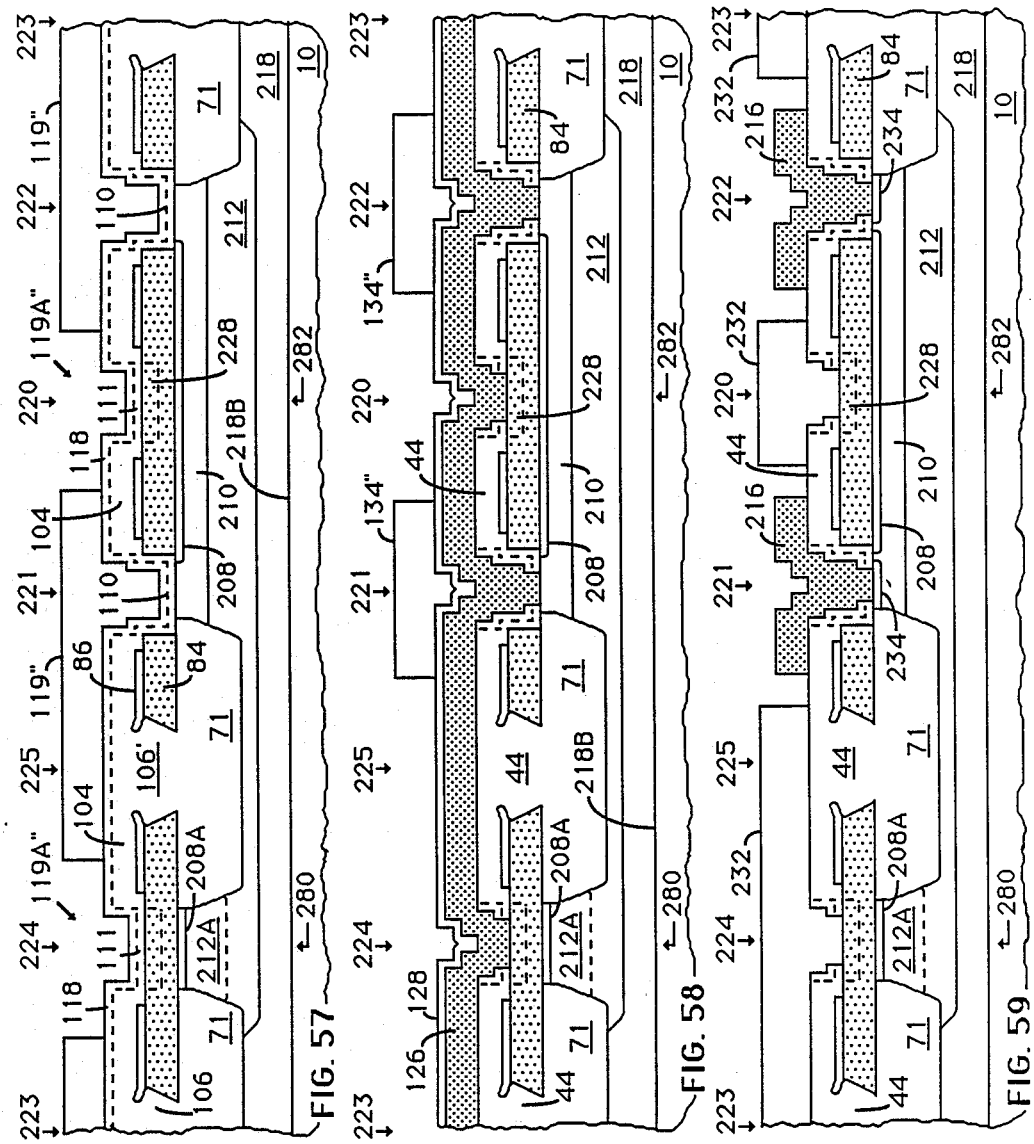

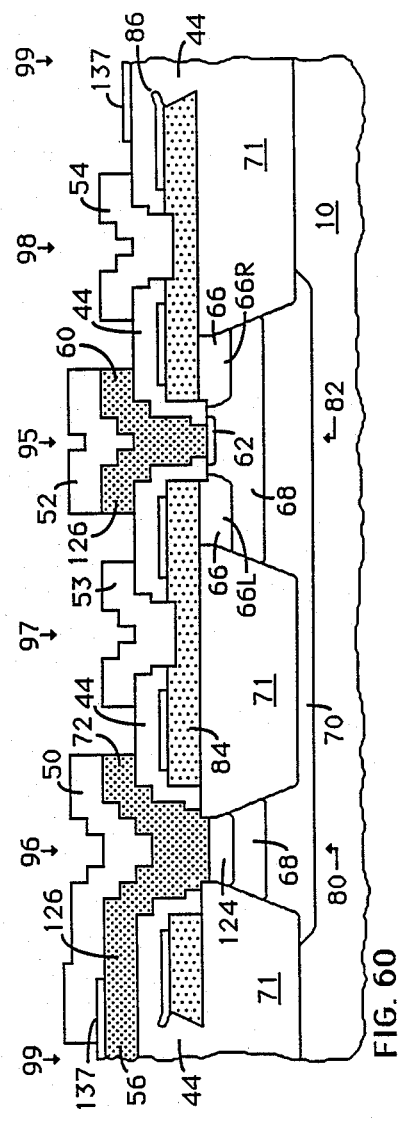
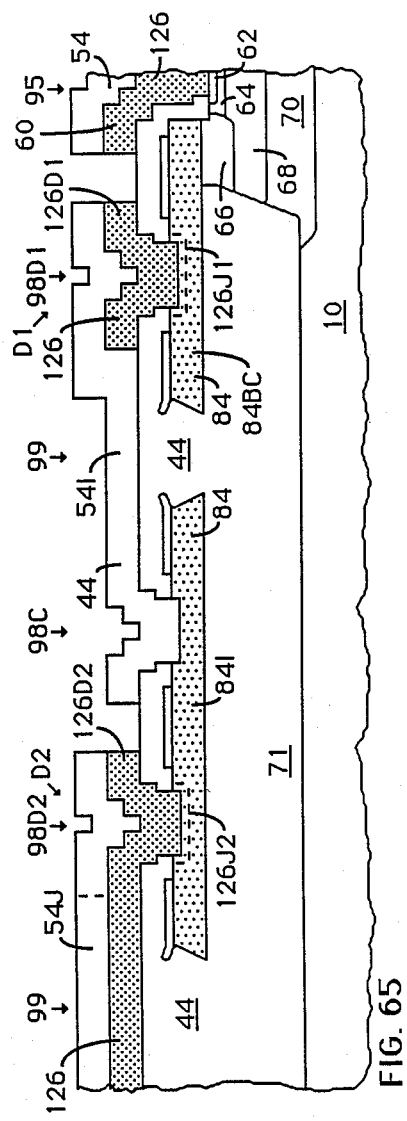
FIG. 60
FIG. 65

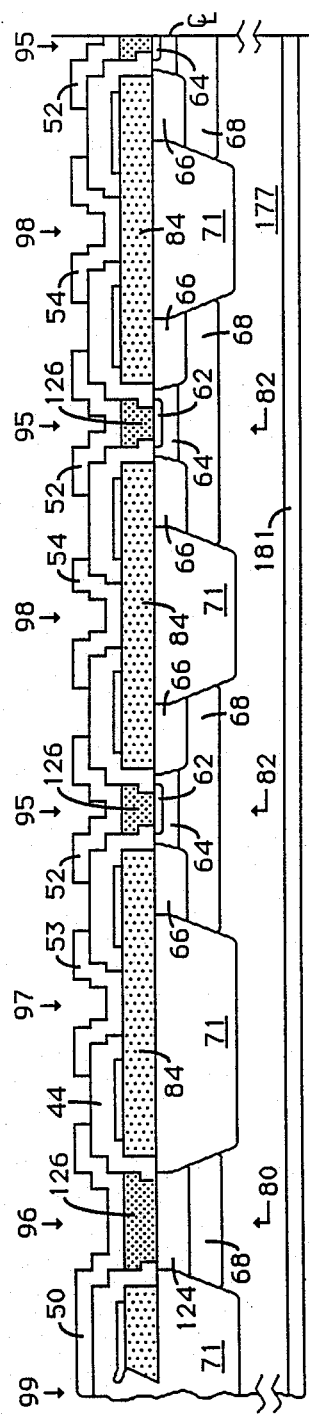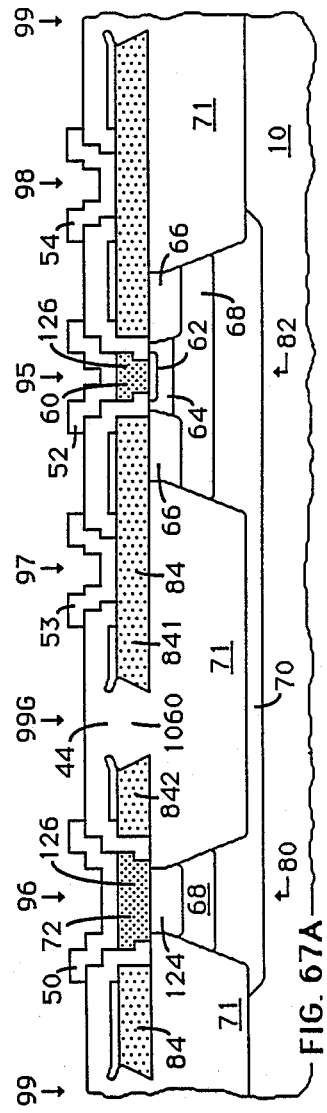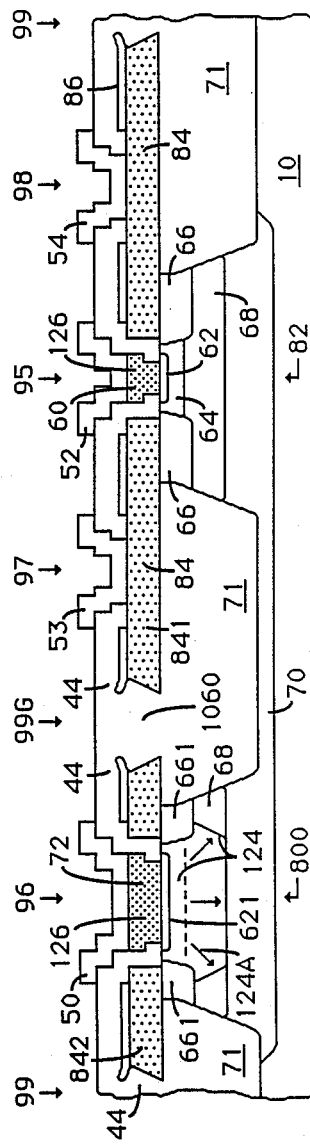

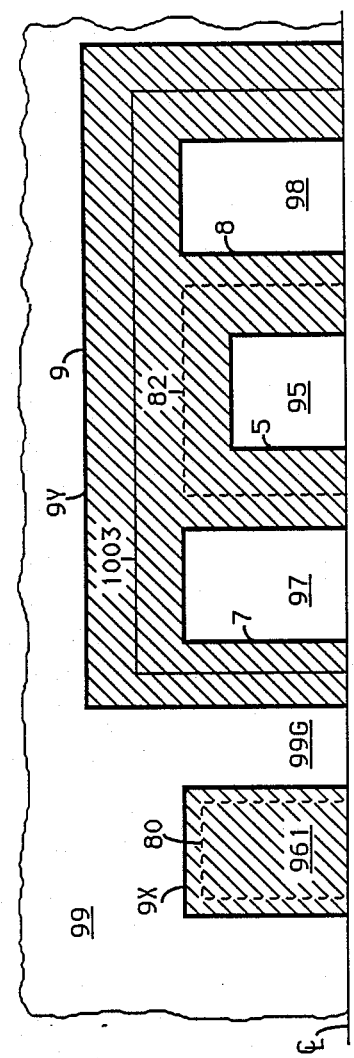
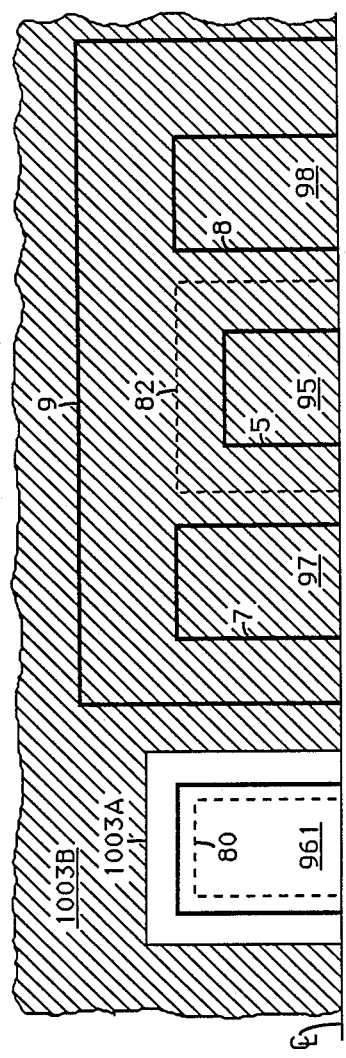
FIG. 70A
FIG. 70B

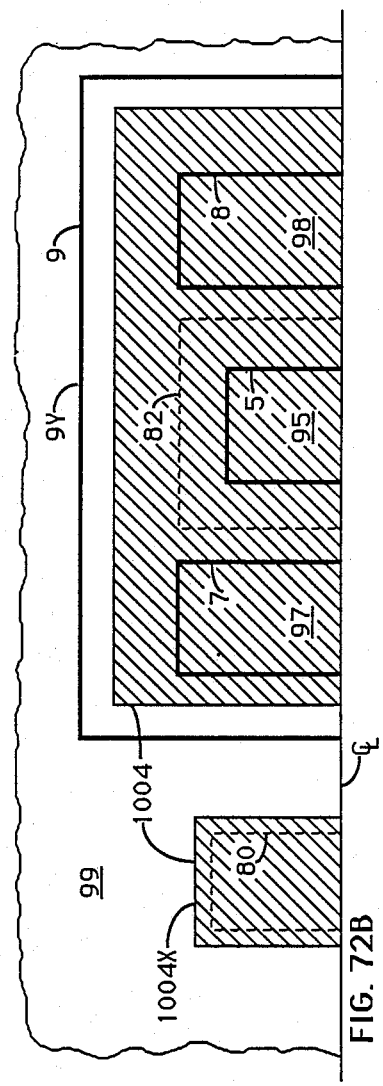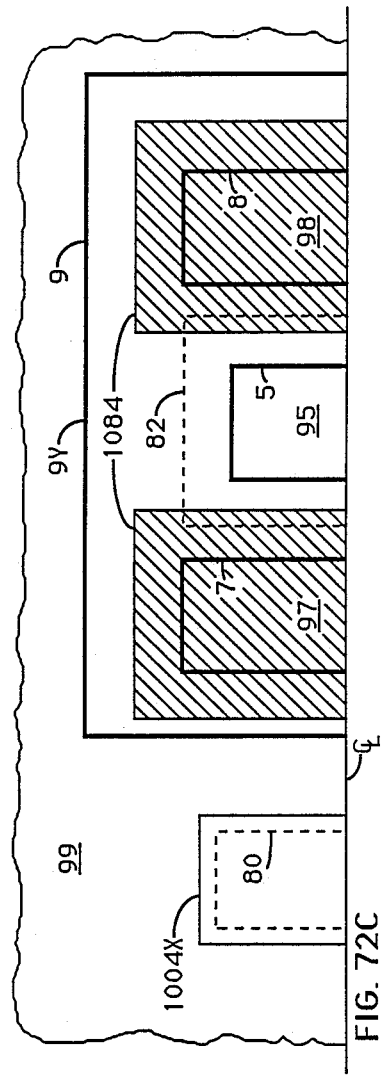

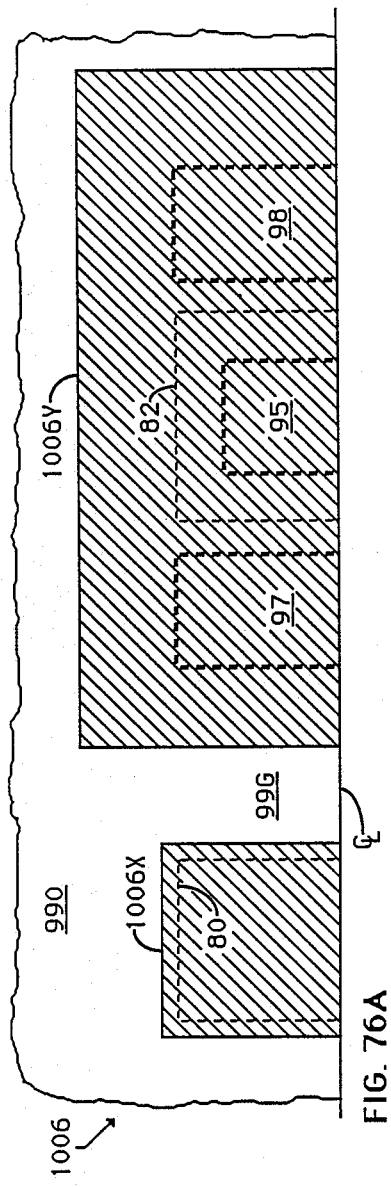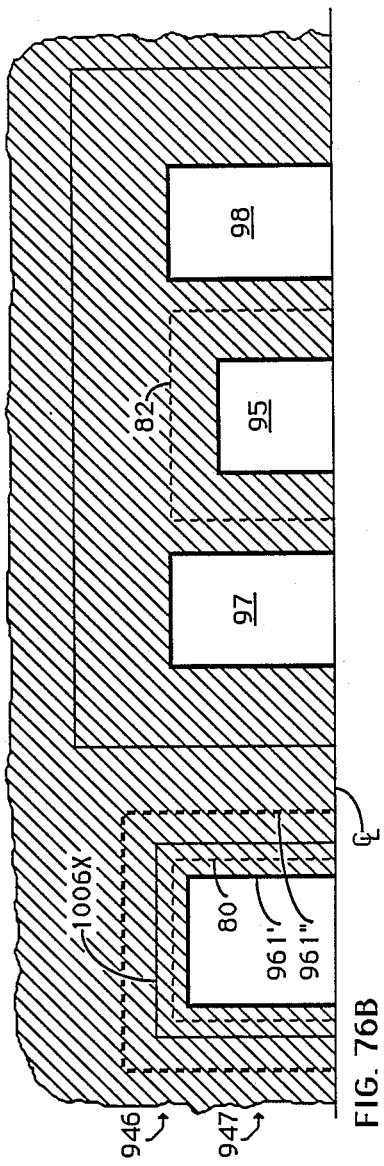
FIG. 76A
FIG. 76B

INTEGRATED CIRCUIT STRUCTURES HAVING POLYCRYSTALLINE ELECTRODE CONTACTS AND PROCESS

BACKGROUND OF THE INVENTION

This invention relates generally to a process for fabricating an integrated circuit structure, and more specifically to devices having polycrystalline silicon contacts and to a process for their manufacture.

There is a need in the integrated circuit art for obtaining smaller and smaller devices without sacrificing device performance. The small device size requires small device regions, precise alignment between regions and minimization of parasitic resistances and capacitances. Device size can be reduced by putting more reliance on fine line lithography, but as device shrinking continues, it becomes impractical or impossible to continue to reduce feature size and achieve the required greater and greater alignment accuracy. As lithography is pushed to the limit, yield and production throughput decrease.

In view of the desire for integrated circuits having higher device counts, smaller device sizes, and greater circuit performance, a need continues to exists for an improved process to manufacture the required devices without resorting to unrealistic photolithography requirements.

Accordingly, it is an object of this invention to provide an improved process and structure for fabricating integrated circuit devices.

It is another object of this invention to provide an improved process and structure for producing integrated circuit devices of reduced size with reasonable photolithography tolerances.

It is yet another object of this invention to provide an integrated circuit process and structure for fabricating improved NPN and PNP transistors and other devices simultaneously.

It is a still further object of this invention to provide an improved process and structure for fabricating device with polycrystalline silicon electrode contacts in integrated form.

As used herein, the words "block-out mask" are intended to refer to a mask or its corresponding patterned resist image or equivalent, which provides one or more open regions and closed regions which need not be precisely aligned to preceding fabrication patterns or masks. A block-out mask is typically used to protect certain opening or predetermined areas of the structure created by one or more earlier masks from etching or implantation steps intended to proceed through the open regions of the block-out mask and other openings in the earlier masks or layers.

The words "intrinsic" or "internal" in connection with a base region or the like are used herein to refer to the active portion of the base of a transistor between the emitter and collector or equivalent. The words "extrinsic" or "external" or "extended" in connection with a base region or the like are used herein to refer to the inactive portion of the base or the like, for example, the portion of a bipolar transistor base laterally exterior to the intrinsic base region which is typically used to provide contact to the intrinsic base region.

BRIEF SUMMARY OF THE INVENTION

The foregoing and other objects and advantages of the invention are achieved through the improved process for fabricating semiconductor devices and the improved device structures disclosed herein. The process is described first.

In accordance with one embodiment of the process, a silicon substrate is provided and a field insulator region is formed therein extending to the substrate surface. A first layer of polycrystalline silicon, a layer of silicon nitride, and a second layer of polycrystalline silicon are deposited overlying the substrate surface and insulating field region. The upper surface of the first poly layer is doped with P type impurities. This layer is eventually used, for example, to dope an external base region in a vertical NPN transistor or equivalent, or the emitter and collector of a lateral PNP, and to provide an interconnection betwen a metallization and the active region of the transistor.

The second layer of polycrystalline silicon is patterned using a master mask to define a master electrode area which contains, for example, the emitter, collector, and base contact areas. The master mask provides the alignment between these device regions so that subsequent masking operations do not require critical mask alignment. Portions of the first poly layer outside the master electrode area are exposed and these exposed portions and the remainder of the second poly layer are converted to oxide throughout their thickness, preferably by thermal oxidation, to form a substantially planar structure. Polycrystalline silicon within the master electrode area is removed, for example, from the emitter and collector areas of the vertical NPN transistor or equivalent areas. Other polysilicon regions remain.

A screen oxide is formed overlying the exposed surface of the substrate and the edges of the remaining polycrystalline silicon exposed in the emitter, collector, or equivalent openings. Where a vertical NPN is desired, for example, an active base region is formed in the silicon substrate by doping through the emitter contact opening. A double implant doping process is preferred.

A spacer is then formed in the emitter or equivalent opening by applying and anisotropically etching a third polycrystalline silicon layer to reduce the lateral dimensions of the emitter or equivalent contact opening. A fourth layer of polycrystalline silicon is deposited contacting the substrate surface in the emitter and collector or equivalent areas. The fourth poly layer is doped. In the case of a vertical NPN for example, this dopant is diffused into the substrate to form an emitter region which is self aligned within the active base region. Metallized emitter and collector contacts for this vertical NPN are made to the fourth poly layer and metallized base contacts are made to the first poly layer.

Many device types such as vertical NPN and PNP transistors, lateral NPN and PNP transistors, field effect and static induction transistors, resistors, capacitors and diodes are fabricated by the methods and structure of the present invention in a highly compatible manner.

The invention, together with other embodiments thereof, will be further understood after a review of the following detailed description of preferred embodiments taken together with the illustrative drawings.

BRIEF DESCRIPTION OF THE DRAWINGS

FIGS. 1 and 2 illustrate, in schematic top view and cross-section, respectively, a vertical NPN transistor fabricated in accordance with the invention.

FIGS. 4B, 5B, 8B, 10B, 11B, 16B, and 17B illustrate masks or mask patterns used in fabricating semiconductor devices, especially the vertical NPN transistors of FIGS. 1–2 in accordance with the process of the invention.

FIGS. 3, 4A, 5A, 6–7, 8A, 9, 10A, 11A, 12–15, 16A, 17A, and 18–22 illustrate in simplified schematic cross-section, the vertical NPN transistor of FIGS. 1 and 2 during various stages of production, using the masks of FIGS. 4B, 5B, 8B, 10B, 11B, 16B, and 17B in accordance with the invention.

FIGS. 24B, 25C, 28C, 30C, and 33C illustrate masks or mask patterns used in fabricationg the transistor of FIGS. 23A–B. FIGS. 24A, 25A–B, 26, 27A–B, 28A–B, 29A–B, 30A–B, 31, 32A–B, 33A–B, 34, and 35A–B illustrate in simplified schematic form, cross-sections of the lateral PNP transistor of FIGS. 23A–B during various stages of fabrication in accordance with the invention and using the masks of FIGS. 24B, 25C, 28C, 30C, and 33C.

FIGS. 36–50 illustrate in simplified schematic form, cross-sections during various stages of fabrication of lateral PNP transistors having a remotely located base contact, according to further embodiments of the present invention.

FIGS. 51A–B and 52–59 show views of a vertical PNP transistor fabricated according to a further embodiment of the invention. FIG. 51B is a simplified schematic top view of the vertical PNP analogous to FIG. 1 for the vertical NPN, and FIG. 51A is a simplified schematic cross-section of the vertical PNP analogous to FIG. 2 for the vertical NPN.

FIGS. 52–59 are simplified schematic cross-sections of the device of FIGS. 51A–B but during different stages of fabrication.

FIG. 60 is a simplified schematic cross-sectional view through a JFET and FIGS. 61–62 are similar views of MOSFETs, fabricated according to further embodiments of the invention.

FIGS. 60–62 are otherwise analogous to FIGS. 2, 23B, and 51A.

FIGS. 63A–B are simplified schematic cross-sectional and top views, respectively, of a discrete device fabricated according to another embodiment of the present invention, analogous to the views in FIGS. 2 and 1 respectively.

FIG. 64A is a simplified schematic top view of the resistor, and FIGS. 64B–D are simplified schematic cross-sectional views through the device of FIGS. 64A during different stages of manufacture.

FIGS. 65–66 are simplified schematical cross-sectional views of poly diode devices fabricated according to another embodiment of the invention.

FIGS. 67A–77B show various additional embodiments for fabricating collector contacts to, for example, a vertical NPN transistor. FIGS. 67A, 68A, 69A–C, 71A–D, 73A–E, 75A–C, and 77A–B are simplified schematic cross-sectional views of the various embodiments and at different stages of manufacture, otherwise analogous to cross-sections of FIGS. 4A, 5A, 6, 7, 8A, and 9. FIGS. 67B, 68B, 70A–B, 72A–C, 74A–B, and 76A–B illustrate masks or mask images in simplified schematic form used in fabricating the various embodiments of collector contacts, and otherwise analogous to masks shown in FIGS. 4B, 5B, and 8B.

DETAILED DESCRIPTION OF PREFERRED EMBODIMENTS

The invented process and arrangements of layers and regions are useful for forming a wide range of device types and structures having utility as individual devices or in combinations. In order to facilitate an understanding of the present invention, there will first be described a process and arrangement for forming a vertical bipolar transistor, particularly a vertical NPN transistor on a P-type substrate. Examples of how the invented process and arrangements may be adapted to form other types of devices and structures will be presented later. However, those of skill in the art will understand, based upon these descriptions, that the particular device examples used are chosen to facilitate understanding of the invention and are not intended to be limiting or infer that the invented process or arrangement is useful only for the exemplary devices. Those of skill in the art will appreciate that the invention processes and arrangements disclosed are applicable to other types of devices and structures in addition to those particularly illustrated herein.

VERTICAL NPN TRANSISTORS

Formation of a vertical bipolar transistor is described first, in particular a vertical NPN transistor formed on a P-type substrate. Vertical NPN transistors are much used in the integrated circuit art. Accordingly improved means and methods for their formation have great utility and importance. Those of skill in the art will appreciate that the conductivity types shown herein may be reversed if it is desired to form a vertical PNP on an N-type substrate. Formation of a vertical PNP transistor on a P-type substrate is described later.

Figure 1:
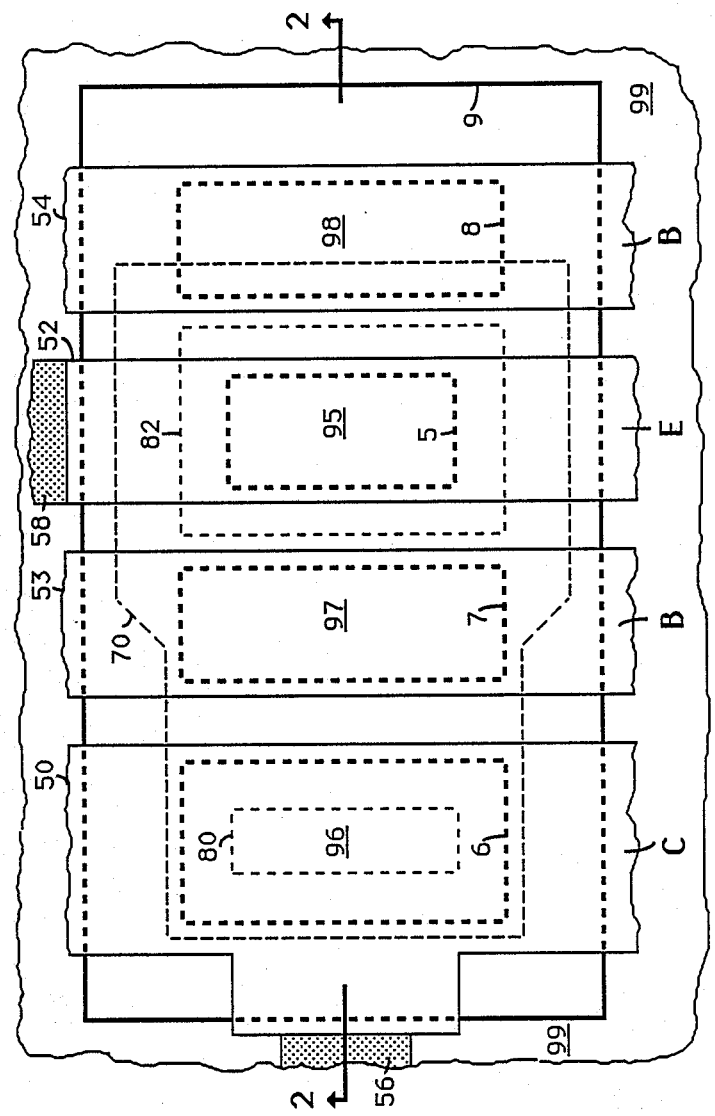

FIG. 1 illustrates, in plan view, the top surface of an NPN transistor suitable for integration in accordance with one embodiment of the invention. FIG. 1 also shows the overlay of several of the process masks utilized to achieve the completed device. The device includes collector contact 50, emitter contact 52, and two base contacts 53, 54. Optional polycrystalline silicon collector resistor 56 and emitter resistor 58 are also illustrated. Heavy solid and dashed lines 5–9 show the location of a master mask for defining openings 95–99 relative to buried layer 70, collector epitaxial island 80 and emitter epitaxial island 82, which are shown by lighter dashed lines. The shape of buried layer 70 is not critical to the present invention. It is desirable that buried layer 70 include and extend between emitter epi-island 82 and collector epi-island 80. Dashed outlines 80 and 82 in FIG. 1 are intended to represent the approximate shape and extent of the epi-islands at the surface of the single crystal semiconductor substrate. The subsurface portions of the epi-islands may be larger. Generally, the portions of the substrate external to outlines 80 and 82 are regions of insulating field dielectric which extend into the substrate a predetermined distance and serve as isolation walls or barriers to electrically separate different devices or device regions. The various features of the structure will be more clearly understood by means of the cross-section shown in FIG. 2.

FIG. 2 illustrates a schematic cross-sectional view through the device of FIG. 1 on the centerline as shown. The process for arriving at the illustrated structure will be described later.

Emitter metal 52 contacts polycrystalline silicon region 60 which, as will be explained, is formed from fourth layer 126 of polycrystalline silicon. Poly region 60, in turn, contacts diffused emitter 62 of the bipolar transistor structure. Also illustrated are active base 64, extended base 66 and the collector. The collector includes N-type epitaxial 68 and heavily doped N+ buried layer 70. Region 71 is a dielectric isolation region, e.g., isolation walls. Region 84 is a polycrystalline semiconductor region for contacting extended base 66. Region 44 is a dielectric region separating poly region 84 from poly regions 60 and 72. Poly region 72 is another portion of fourth poly layer 126 which is formed between collector contact region 124 and collector electrode 50.

In FIG. 2, poly emitter contact 60, poly collector contact 72 and the sidewall portions of dielectric 44 may extend slightly downward below surface 69 into epi-region 68 in epi-islands 80 and 82. This is because a small amount of epi-region 68 in islands 80, 82 between dielectric isolation walls 71 is consumed during fabrication of the device, as for example during thermal oxidation of the substrate surface. For simplicity and because the amount is small, this detail is omitted from various device cross-sections shown later. Based on the description given herein, those of skill in the art will understand that this effect is present where semiconductor is consumed.

The left portion of FIG. 2 shows a cross-section through the collector contact. Collector contact metal 50 is in electrical contact with N type doped polycrystalline silicon region 72 which, like polycrystalline silicon region 60, was formed from fourth polycrystalline silicon layer 126. Poly silicon region 72 contacts collector contact region 124 and is in electrical contact with the active collector through the portion of epitaxial region 68 in epi-island 80 and through buried layer 70. Region 71 is a dielectric isolation region separating epi-islands 80 and 82 and isolating the device from other adjacent devices.

FIG. 2 illustrates, in cross-section, two base contacts to the exemplary vertical NPN transistor. Base contact metal 53, 54 directly contacts P-type polycrystalline region 84 which contacts extended base 66. Polycrystalline region 84 was originally formed from a first polycrystalline silicon layer. In the illustrated embodiment, base contact poly-region 84 surrounds emitter 62, but this is not essential.

The process steps used to achieve the structures illustrated in FIGS. 1 and 2 will now be described. For ease of understanding, this process will be described in terms of particular exemplary fabrication techniques and conditions. It is not intended, of course, that the invention be limited to these exemplary embodiments. For example, isolation between devices is provided, in this embodiment, by recessed oxide isolation region 71. The process is equally applicable to other isolation techniques such as, for example, trench isolation. The illustrative device is an NPN transistor having a double base contact and a non-walled emitter, i.e., an emitter which does not abut isolation walls 71. Those of skill in the art will understand that the process described is also applicable to other structures and techniques. Non-limiting examples of several other structures and variations are given later.

The process is started in conventional fashion with the formation of buried layer 70, epitaxial collector layer 68, and recessed isolation walls 71. These initial steps are well known in the art and, therefore, are only described in general terms. FIG. 1 illustrates the composite of buried layer 70 and epi-islands 80, 82 protruding through isolation 71. Buried layer 70 is shown in subsequent cross-sections but for simplicity is omitted from the various illustrations of the masks used. Epi-islands 80, 82 are shown on the masks to provide a common reference. P+ channel stops (not shown) may be provided under isolation 71 if desired. Those of skill in the art will understand how to accomplish this.

The NPN device is fabricated on P-type silicon substrate 10 having, typically, a resistivity of about 8-25 ohm centimeter. However, other resistivities can also be used depending upon the desired device characteristics. Using conventional masking and photolithography, N+ buried layer 70 is formed, for example in the region shown in FIG. 1. N-type epitaxial layer 68 (see FIGS. 2) is grown overlying P-type substrate 10 and N+ buried layer 70. The thickness and doping of the epitaxial layer are selected dependent upon the type of device being implemented. For a macrocell array fabricated in emitter coupled logic (ECL) technology, the epitaxial layer conveniently has a thickness of about 0.5-2 micrometers and a resistivity of about 0.2-1.5 ohm centimeter. Other thicknesses and resistivities may also be used.

Localized recessed oxide 71 (see FIG. 2) is formed to isolate between devices and within particular device structures. This is conveniently accomplished by thermal oxidation. To do this, sequential layers (not shown) of silicon dioxide and silicon nitride are formed overlying the surface of the epitaxial layer. The silicon nitride layer is selectively patterned to leave nitride over the regions where epi-islands are desired and removed where field oxide isolation regions or walls are desired. The field region, that is, the area of silicon located laterally outside the desired epi-islands is first etched to a depth of, for example, about 0.45-0.50 micrometers, and then may be implanted, as needed, for example to provide channel stops. The etched field region is then oxidized, preferably by high pressure steam oxidation, to form localized recessed oxide 71 in those regions not covered by the oxidation resistant silicon nitride mask. The oxidation is continued for a sufficient time to cause the recessed oxide to extend into the silicon substrate to a depth greater than the thickness of the N-type epitaxial layer. The field oxidation also causes the growth of a thin oxide on top of the masking silicon nitride. This latter oxide, along with the masking nitride and underlying oxide are stripped from the silicon substrate. The field oxide is left in place. The resulting oxide isolated structure, illustrated in FIGS. 1-2 has field oxide generally surrounding epi-islands 80, 82.

As the field oxide is grown and extends vertically into the epitaxial layer, oxidation also progresses laterally beneath the silicon nitride oxidation mask. Where device dimensions are small, this lateral encroachment of the field oxide is significant. Taking this into account, the resultant structure after field oxidation is complete provides small, isolated epitaxial island 80 for the collector contact region and a larger, isolated epitaxial region 82 for the emitter/base region. Both regions are defined by the combination of the nitride oxidation mask and the encroachment of the field oxide beneath the oxidation mask. This portion of the process is well known in the art. Any convenient method of producing isolation walls may be used.

Epi-islands 80 and 82 or equivalent may be used for a variety of device regions besides the collector region and emitter/base regions of the NPN transistor being described here. Examples of the use of such epi-islands for other device regions will be provided later and those of skill in the art will appreciate that the description herein is by way of example and not intended to be limiting.

The surface of epi-region 68 is cleaned to avoid the formation of undesirable interfacial oxide between the epi-layer and layer 84 of polycrystalline semiconductor which will be subsequently deposited. Following cleaning, a series of layers are deposited on surface 69 of epi-region 68 and oxide region 71, as illustrated in FIG. 3. FIG. 3 shows a schematic cross-section corresponding to FIGS. 2, but at an earlier stage of fabrication.

Two layers 84, 86 are conveniently deposited on surface 69 using low pressure chemical vapor deposition (LPCVD). First layer 84 is a layer of polycrystalline semiconductor, preferably silicon having a thcikness conveniently of about 385 nanometers. Larger or smaller thicknesses may be used for layer 84 according to relationships with other layers which will be subsequently explained. Second layer 86 is conveniently a layer of silicon nitride or a sandwich of oxide plus nitride or a layer of other oxidation resistant material having a thickness of, for example, about 70–120 nanometers. Poly silicon layer 84 will be used to form poly silicon base contact regions 84 of FIG. 2. Where an NPN transistor is being formed, layer 84 is doped by ion implantation of, for example, boron. The doping may be performed during or anytime after deposition of layer 84, but is conveniently performed after deposition of layers 84 and 86 through nitride layer 86 and before deposition of layers 88 or 90. Poly silicon layer 84 is conveniently doped with singly ionized boron at an energy of about 70 KeV to a dose of about $1 \times 10^{16}$ cm$^{-2}$, although other doping levels may also be used depending on the desired device and circuit characteristics. The implantation is preferably arranged so that the relatively high dose of boron is located near the upper surface of polycrystalline silicon layer 84, just below silicon nitride 86.

After the boron implantation, two further layers 88, 90 are deposited, for example by LPCVD, over silicon nitride layer 86. Layer 88 is desirably an undoped layer of polycrystalline silicon having a thickness conveniently of about 180 nanometers. Larger or smaller thicknesses may be used for layer 88, taking into account the thickness of other layers, as will be subsequently explained. Layer 90 is formed overlying poly layer 88. Layer 90 conveniently prevents contamination of poly layer 88 and serves as a hard mask for subsequent lithographic patterning of the underlying layers. Layer 90 may be of any material suitable for such purposes. Layer 90 is conveniently of silicon oxide having a thickness of about 20–40 nanometers.

Processing of the structure continues with the application of layer 92 of photoresist overlying oxide layer 90 as shown schematically in FIG. 4A. The photoresist is patterned using master mask 94, represented by the shaded region in FIG. 4B, containing images 95–99 for locating various device regions. Master mask 94 provides self-alignment of the critical device areas, for example in the case of the vertical NPN transistor, the collector contact, the base contact or contacts, the emitter contact, and the emitter-base active region. In accordance with one embodiment of the invention, master mask 94 defines the master electrode area which includes emitter contact opening 95, collector contact opening 96, and base contact openings 97, 98 located within perimeter 9 and surrounded by external region 99. Region 99 identifies the region, outside perimeter 9 of master mask 94. Openings or windows 95–98 located within perimeters 5–8 respectively are used in the subsequent process to form the "footprints" of the device terminals, and in the case of the vertical bipolar device, the active emitter-base region. Perimeter 5, although referred to generally herein as the emitter opening or emitter contact opening, is used in conjunction with epitaxial island 82 formed within field oxide 71 to locate both the base and emitter of the device as well as the emitter contact. Variations and further embodiments, in addition to the basic NPN transistor, are discussed later. Base contact openings 97, 98 are located within perimeters 7, 8, respectively. Collector contact opening 96 is located within perimeter 6.

Master mask 94 is aligned to epi-islands 80, 82 as shown in FIG. 4B. In a preferred embodiment, the minimum geometry of any feature included in the master mask is a dimension, such as for example, about 1.5 micrometers, which can be processed easily with standard photolithography alignment tools. As will become apparent, fine geometry devices having features less than the minimum geometry size can be readily produced by the inventive process and structure without resorting to more difficult photolithography. The process may be readily scaled to smaller dimensions as lithographic and process resolution improve.

A particular feature of the present invention is that the master mask automatically self-aligns the emitter, base, and collector contacts and outer device periphery, so that, when metal is subsequently applied thereto, only one alignment tolerance (master mask to metal mask) need be accommodated. This allows devices having smaller metal pitch and therefore smaller overall size to be constructed as compared to the prior art processes which do not provide such self-alignment of the emitter, base, and collector contacts and the device periphery. As will be subsequently explained, other device types may be built on the same substrate using the same basic process sequence described herein, and they will also have the same minimum pitch advantage. As will be further explained, part of the self-alignment feature may be sacrificed to gain other advantages. These trade-offs are particularly noted.

Using master mask 94 to expose photoresist layer 92, the process continues by defining master mask pattern 94 in photoresist layer 92 and subsequently in layers 90 and 88, as illustrated schematically in FIG. 4A.

Photoresist is an organic material and has a potential for contaminating other parts of the process. Accordingly, in a preferred process the resist is used only to pattern layer 90 and then is removed. When layer 90 is of oxide it is conveniently patterned using wet chemical etchants such as a 10:1 solution of ammonium fluoride and hydrofluoric acid or by reactive ion etching. Other etching means well known in the art may also be used. For further etching it is desirable to use a differential etching process which attacks polysilicon layer 88 more rapidly than mask layer 90 or underlying nitride layer 86. Polysilicon layer 88 is subsequently patterned by reactive ion etching or other suitable differential etching means, using patterned layer 90 as an etch mask. Emitter window 95 is desirably located so as to be laterally within epitaxial island 82 and surrounded by but not over field oxide 71. Collector window 96 is located so as to at least partly overlap island 80. It is desirable that window 96 laterally enclose island 80 and extends beyond island 80 over adjacent field oxide 71. Base windows 97, 98 are desirably located over a portion of field oxide 71. The significance of these desirable relationships between the master mask windows and the field oxide will become apparent in the following description. Reactive ion etching of polysilicon layer 88 stops automatically when nitride layer 86 is exposed because of the differential etch rate for polycrystalline silicon and silicon nitride.

Master mask 94 is thus replicated in second poly layer 88 as illustrated in FIG. 4A, and the alignment of the remaining photolithography steps are thereafter relatively non-critical. The critical alignment between device regions is established automatically by master mask 94 in combination with epi-islands 80 and 82.

Figure 5B:
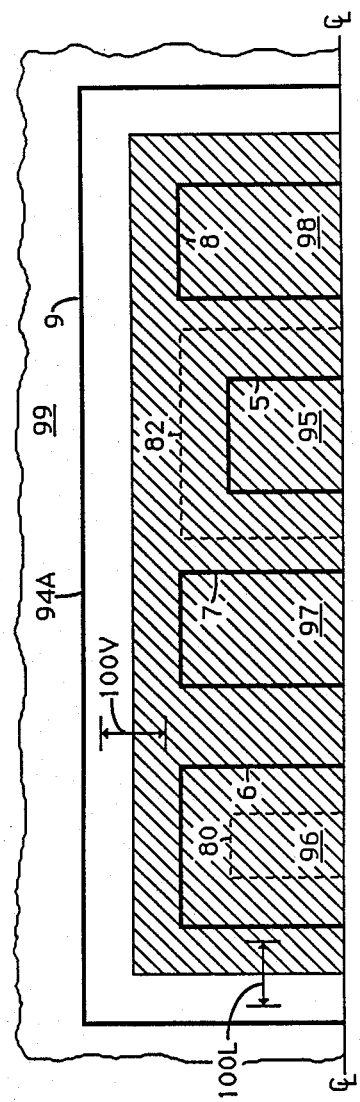

The process is continued by the use of first block-out mask 100 as illustrated schematically in FIGS. 5A-B. FIG. 5B is a top view showing first block-out mask 100, represented by the shaded area, overlaid on master mask 94 (as replicated in oxide 90, and represented by the heavy outlines), and on epi-islands 80, 82 (represented by the light dashed outlines). This same convention for showing the relative location of the current mask, the master mask image and the epi-islands is followed in subsequent figures. First block-out mask 100 protects the open portions within master electrode perimeter 9, covering emitter window 95, collector window 96, and base windows 97-98. The large allowable tolerance in alignment of mask 100 with respect to the etched result from the proceeding use of master mask 94 is illustrated by arrows 100V and 100L. Edge 100A of mask 100 should be aligned to fall on the portion of oxide layer 90 which remains laterally exterior to openings 95-98.

As illustrated in FIGS. 5A-B, first block-out mask 100 is used in conjunction with the remaining portions of oxide layer 90 and poly layer 88 as an etch mask to permit removal of portion 86A of silicon nitride layer 86 which is not protected by mask 100 or oxide 90 and poly layer 88. The exposed nitride is etched by any convenient method, as for example, reactive ion etching. This removes portion 86A of nitride layer 86 and exposes corresponding portion 84A of layer 84 in region 99 outside border 9 of master electrode area 94A. Subsequently, photoresist 100 is removed with, for example, organic photoresist stripper, oxygen plasma, or other suitable means. Thereafter the remainder of oxide layer 90 is removed by, for example, dip etching in a dilute hydrofluoric acid etchant solution. Other suitable etching or removal techniques known in the art may also be used.

Figure 6:
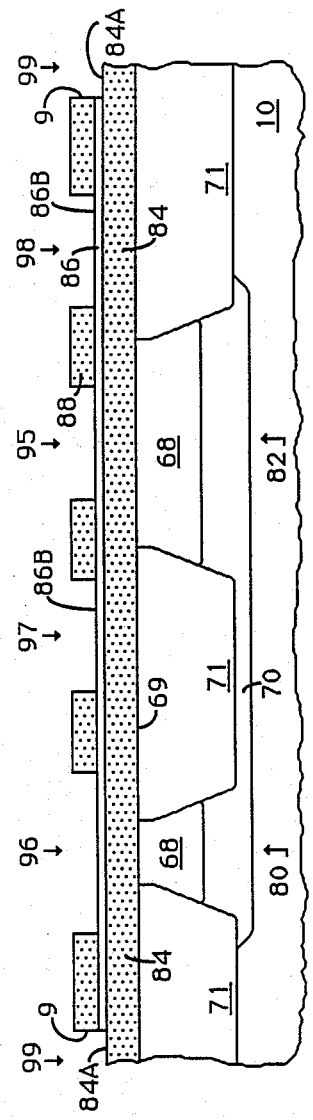

The result of the preceding steps is shown in FIG. 6. Within the confines of master electrode area 94A, remaining portions of polysilicon layer 88 are exposed while portions 86B of nitride layer 86 still cover part of polysilicon 84 and protect it from oxidation.

Figure 7:
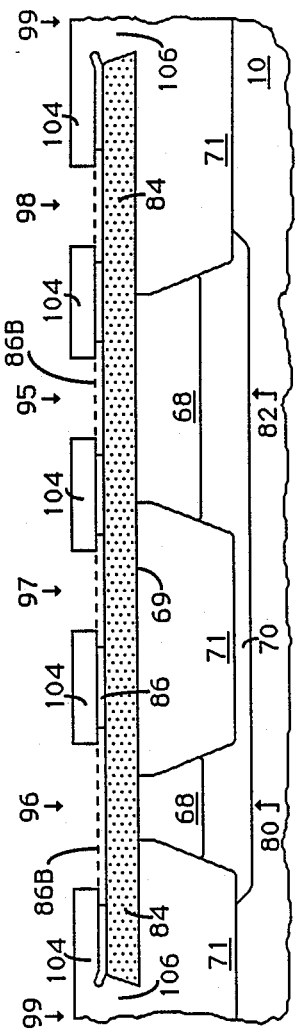

The structure is then oxidized to convert the exposed polysilicon to a dielectric, e.g., silicon dioxide, as illustrated in FIG. 7. The polysilicon which is oxidized includes the remaining portions of poly layer 88 as well as portions 84A of poly layer 84 exposed outside edge 9 of master electrode area 94A. The silicon dioxide which results from this oxidation step includes oxide layers or regions 104 and 106. Oxide layer 104 having, for example, an oxide thickness of about 400 nanometers results from the oxidation of the remaining portions of poly layer 88. Oxide region 106 having, for example, an oxide thickness of about 855 nanometers results from the oxidation of exposed portion 84A of poly layer 84.

The oxidation of the two polycrystalline silicon layers is preferably done using a relatively low temperature, high pressure oxidation process to minimize the total amount of time the structure is exposed to elevated temperatures. Use of high pressure (e.g., about twenty-five atmospheres) results in comparatively rapid oxidation at comparatively low temperature (e.g., about 750° C.). Other temperatures and pressures may be used, but limiting the time at elevated temperatures is important to prevent excessive redistribution of the boron already implanted at the upper surface of polycrystalline silicon layer 84. It is important that redistribution of this implanted dopant be limited so that the boron dopant does not substantially diffuse into single crystal silicon epitaxial layer 68 at this time.

During the oxidation step, polycrystalline silicon region 84A and the remaining parts of layer 88 are oxidized simultaneously. Layer 84 is oxidized only in region 84A beneath region 99 outside master electrode area 94A where portion 86A of nitride layer 86 has been removed. The remaining part of nitride layer 86 within master electrode area 94A protects the remainder of poly layer 84 over what will become the active transistor area, and only poly layer 88 is oxidized within master electrode area 94A. The oxidation step is self-limiting with respect to poly layer 88, since it terminates when the oxidation front reaches underlying silicon nitride layer 86. The termination of the oxidation is easy to observe since the color changes abruptly from a milky appearance to a typical oxide color when the oxidation is complete. The oxidation of exposed portion 84A of poly layer 84 is also self limiting and substantially stops when the entire thickness of portion 84A of poly layer 84 is consumed by the oxidation and the oxidation front reaches underlying field oxide 71. Although this oxidation process has been described in terms of a single oxidation of the two polycrystalline layers (i.e., layer 88 and portion 84A of layer 84), the two layers could be oxidized separately by first oxidizing poly layer layer 88, then removing portion 86A of silicon nitride layer 86 and subsequently oxidizing portion 84A of poly layer 84.

The above-described oxidation of parts of poly layers 84 and 88 is designed, in acordance with the invention, to provide a substantially planar surface. During oxidation of portions of poly layers 84 and 88 to form oxide regions 106 and 104, the volume occupied by the oxide expands to approximately 2.2 times the volume occupied by the silicon from which the oxide is derived. This increase in volume is taken into account in selecting the thicknesses of the various layers so that the resulting surface is substantially planar. Accordingly, the thickness of poly layers 84, 88 and silicon nitride layer 86 are selected so that, after oxidation, the thickness of oxide 106 formed from poly 84A is about equal to the combined thickness of oxide 104, formed from poly 88, plus silicon nitride layer 86 plus the remaining (unoxidized) portion of poly layer 84. The resultant surface, except for a minor discontinuity at the intersection between oxides 104 and 106, is substantially planar. This is a particular feature of the present invention. Although specific thicknesses or thickness ranges have been indicated in this preferred embodiment for layers 84, 86, 88, other thicknesses of these layers having the relationship described above can also be utilized.

Another important feature of the invention is that, during the oxidation of poly layer 88, the emitter opening defined in this layer is reduced in width by the lateral encroachment of the thermally grown silicon dioxide. The oxidation of 180 nanometers of, for example, polycrystalline silicon in layer 88 results in about 400 nanometers of silicon dioxide in layer 104. The increase in thickness of oxide 104 as compared to poly silicon layer 88 of about 220 nanometers also produces a lateral expansion of the silicon dioxide into the emitter opening by an equal amount. The emitter opening, therefore, is reduced in width by about twice the increase in thickness since the oxide encroaches equally from both sides of the emitter opening. This is a first step, in accordance with the invention, in reducing the feature size below that produced by the photolithographic process. The reduction in feature size is controlled by a well defined and self-limited process so that the reduction in feature size is dependent only upon the control of the thickness of deposited poly layer 88 and the volume change associated with the oxidation. Means for accurately controlling the thickness of deposited polycrystalline silicon layers are well known in the art and the volume change is fixed for the chemical reaction being carried out.

As will be appreciated by those of skill in the art, other materials besides polysilicon can be used for layers 84 and 88 and the like, provided that they are oxidizable to form insulating dielectrics, and in the case of layer 84 also conductive and suitable to act as a dopant source for formation of doped region 66 (see FIG. 2) in region 68, and the like. Where different materials are used, the ratios of the thicknesses of layers 84 and 88 should be adjusted so that, after oxidation, the upper surfaces of resulting oxide regions 104 and 106 are substantially level. Intermetallic compounds, particularly binary or ternary silicides are examples of useful substitute materials. Other materials may also serve provided they have properties equivalent to the properties of polysilicon utilized herein. As used herein, it is intended that the words polysilicon or poly or polycrystalline silicon or polycrystalline semiconductor be interpreted as including such equivalent or substitute materials.

Figure 8B:
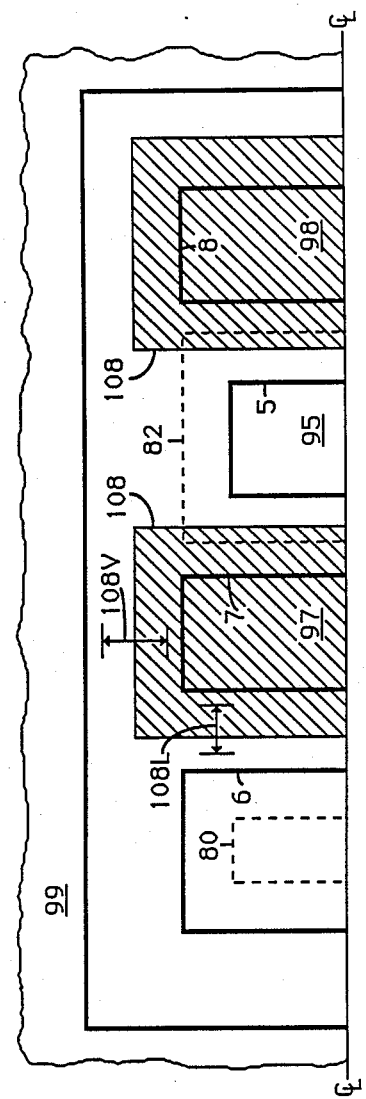
Figure 8A:
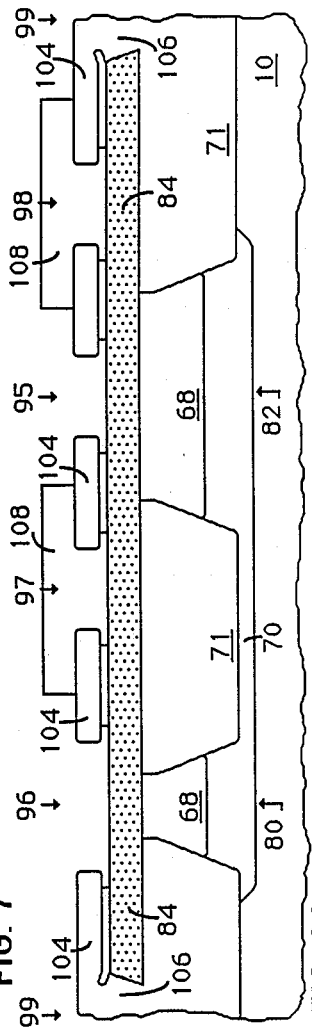

Portions 86B of silicon nitride layer 86 which are exposed in emitter opening 95, collector opening 96, and base openings 97–98 are removed by etching, (See FIGS. 6–7 and 8A). Hot phosphoric acid or a mixture of hot phosphoric acid and sulfuric acid or reactive ion etching are examples of suitable etchants or etching techniques. The exposed nitride is etched using previously formed oxides 104 and 106 as etch masks. Isotropic etching results in the remaining portions of layer 86 under oxide regions 104 to be slightly undercut, as is shown in FIG. 7. However, anisotropic etching, such as for example reactive ion etching, may also be used in which case there is substantially no undercutting of nitride layer 86 beneath oxide regions 104.

Photoresist is then applied to the surface of the substrate and patterned using a second block-out mask to leave patterned photoresist block out mask 108 protecting base contact area 97, 98 (see FIGS. 8A–B). Second block-out mask 108 is shown by the shaded area in FIG. 8B and in cross-section in FIG. 8A. Alignment of block-out mask 108 is not critical, it only being necessary that mask 108 cover base contact openings 97, 98 without interfering with adjacent collector contact opening 96 or emitter contact opening 95. The photoresist of the second block-out mask can conveniently cover all areas of the device except emitter and collector contact openings 95, 96 and other areas of polysilicon layer 84 which are desired to be etched if any. The available alignment tolerance is indicated approximately by arrows 108V and 108L.

Mask 108 protects polycrystalline silicon layer 84 over the base contact area and any other location where contact is desired to be made to first poly layer 84. The portions of polycrystalline silicon layer 84 exposed in emitter opening 95 and collector opening 96 are etched to expose surface 68B of underlying monocrystalline silicon region 68 (see FIG. 9). Reactive ion etching is a convenient technique, but other methods may also be used. The polysilicon removal process should be carefully controlled to avoid significant etching of underlying monocrystalline silicon 68 because such etching may be deleterious to the operation of the resulting transistor. Reactive ion etching is anisotropic and results in substantially vertical walls at the edges of openings 95, 96 through polycrystalline silicon layer 84, as illustrated schematically in FIG. 9. Because of mask 108, polycrystalline silicon 84 is not etched from base contact areas 97, 98. Oxide 104, formed from the oxidation of polycrystalline layer 88, is used as an etch mask during the etching of polycrystalline silicon layer 84. As noted previously the lateral dimensions of openings 95–98 in layer 84 are reduced by the sideways growth of oxide 104 in the openings. Mask 108 is then removed.

The structure of FIG. 9 is conveniently oxidized to form oxide layer 110 on the exposed monocrystalline silicon in emitter opening 95 and collector opening 96. Oxide 111 is formed on the portion of polycrystalline silicon 84 exposed in base contact regions 97, 98, and oxide 112 is also formed on the exposed sidewalls of polycrystalline silicon 84. The result is shown schematically in FIG. 10A. The three oxides are preferably formed simultaneously by thermal oxidation, although other techniques can also be used. Oxide 110 conveniently has a thickness of about 40 nanometers. Oxides 111 and 112 will typically have a slightly greater thickness because polysilicon, particularly boron doped polysilicon, oxidizes faster than single crystal material. Oxide 110 is used as a screen oxide for a subsequent implant doping of region 68 under openings 95, 96. Oxide 111 prevents etching of polycrystalline silicon layer 84 in a subsequent silicon etch. Oxide 112 forms a lateral side-wall liner oxide to isolate polysilicon layer 84 from the adjacent emitter and collector sites to be subsequently formed. The enhanced oxidation of poly layer 84 is advantageous in this application, as it increases the lateral thickness of the sidewall liner oxide 112. Anodic oxidation is an example of an alternative technique for forming oxides 110–112 from underlying silicon. Also, layers 110–112 may be deposited and/or may be formed from other dielectric materials.

During the oxidation step and during an anneal following the previous reactive ion etch, the boron implanted in polycrystalline silicon layer 84 is distributed throughout that layer and into underlying epitaxial silicon 68 to form external or extrinsic base region 66 (see FIG. 10A). Defining collector contact area 96 at the master mask step so that the edges of contact area 96 are located on field oxide 71 (and the subsequent replication of that pattern in poly layer 84) insures that none of the P-type doping from layer 84 is diffused into the N-type collector contact area. This is a particular feature of this embodiment of the present invention.

Figure 10B:
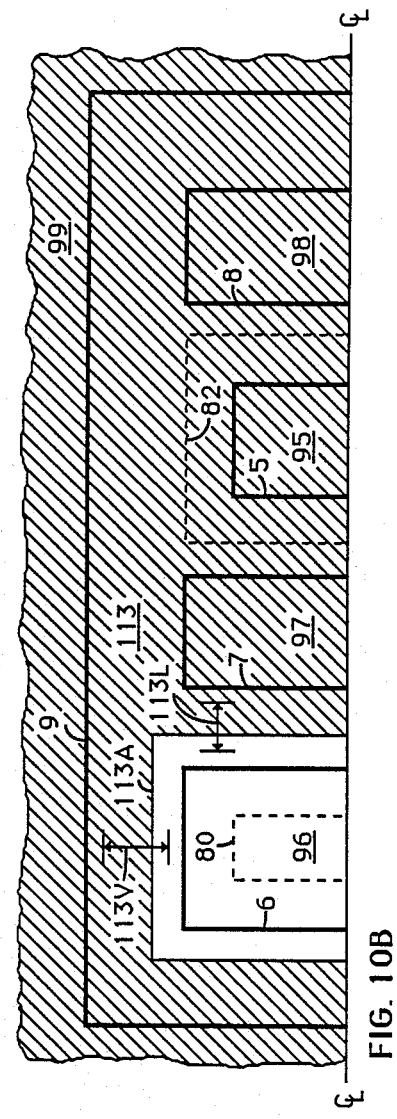

Photoresist is again applied to the surface of the device and is patterned using third block-out mask 113, as illustrated in FIGS. 10A–B. Mask 113, shown by the shaded area in FIG. 10B and in cross-section in FIG. 10A, covers all of the device area except for collector contact region 96. Opening 113A through third block-out Mask 113 exposes collector epitaxial island 80. The third block-out mask is designed with a wide alignment tolerance, as indicated by arrows 113V and 113L. Photoresist or other suitable masking material patterned by block-out mask 113 is used as an ion implant mask for the implantation of deep collector contact 124 (see FIG. 10A). For an NPN transistor, phosphorous is conveniently implanted into collector epitaxial island 80 to form heavily doped collector contact region 124 locally extending all or part way through epitaxial layer 68 in island 80 to underlying buried layer 70. Redistribution of the implanted phosphorous is carried out during subsequent high temperatue processing steps to insure penetration to underlying layer 70. (This detail has been shown by way of illustration in FIG. 68A, but for simplicity has been omitted elsewhere.) Other suitable impurities may also be used. This deep collector contact implant can also be performed prior to the deposition of polysilicon layer 84. This is preferred when a vertical PNP is to be integrated and where the phosphorous implant also forms the PNP base.

Figure 11B:
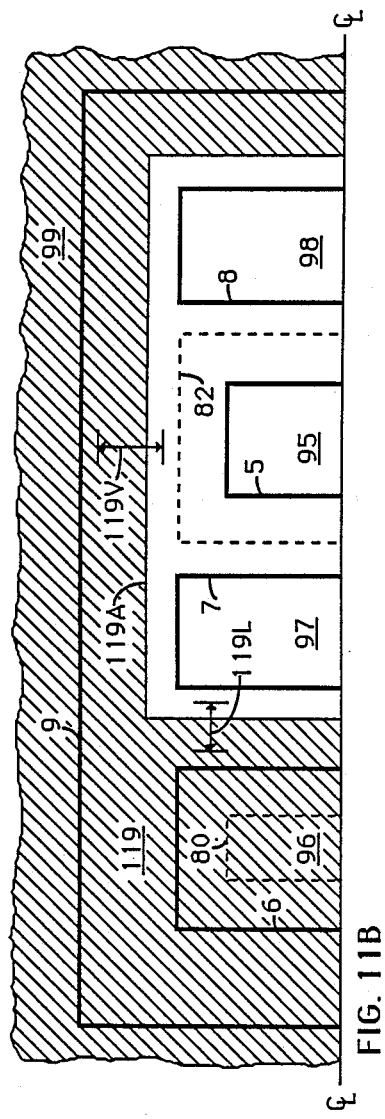

Third block-out mask 113 is cleaned from the surface and an additional layer of photoresist or other masking material is applied. The new photoresist layer is patterned with a fourth block-out mask as illustrated schematically in FIGS. 11A–B. Fourth block-out mask 119 covers collector island 80 and contact area 96 and has opening 119A to expose emitter island 82, emitter contact 95, and base contact areas 97, 98. Again, a large alignment tolerance is allowed for block-out mask 119, as indicated schematically by arrows 119V and 119L. Fourth block-out mask 119 is used to protect the remainder of the device during implantation of active base region 64 see FIG. 11A). Oxide 110 in opening 95 acts as a screen oxide during the implantation and has other useful functions as will be subsequently explained.

Figure 12:
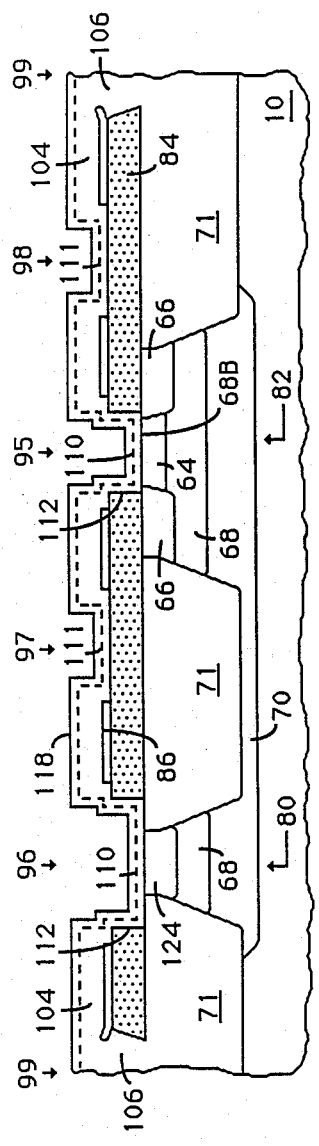
Figure 13:
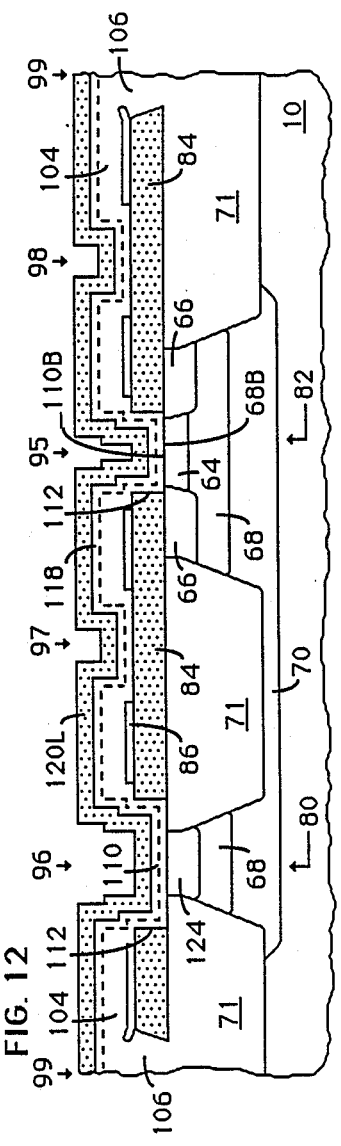

Two additional layers are next formed overlying the surface of the device structure (see FIGS. 12–13). First, layer 118, preferably of silicon oxide and having a thickness of about 100 nanometers is deposited, preferably by LPCVD although other techniques may also be used. This is covered, in turn, with layer 120L, preferably of polysilicon and having a thcikness of about 250 nanometers. Layer 120L is referred to as the third poly layer. Layer 120L need not be doped.

Layer 118 provides an additional oxide liner or spacer to increase the lateral isolation between boron doped base contact polycrystalline silicon 84 and the emitter and collector contacts to be subsequently formed. Layer 118 also serves to increase the vertical isolation thickness between layer 120L and the extrinsic base region being formed in underlying epitaxial region 68 outside intrinsic base region 64. When formed of polysilicon, layer 120L is conveniently deposited by low pressure chemical vapor deposition (LPCVD). This is a conformal deposition and, after anisotropic etching, provides an additional sidewall spacer in the emitter region and collector contact regions, as shown in FIG. 14 and explained below.

Layer 120L is anisotropically etched, typically by reactive ion etching. Because of the anisotropic nature of the etch, layer 120L is removed from lateral surfaces, leaving material 120 (e.g., polycrystalline silicon) on the vertical surfaces. The resultant structure is illustrated in FIG. 14. The anisotropic nature of reactive ion etching allows the polycrystalline silicon, for example, to be etched from lateral surfaces and even allows as much as a 50% over-etch without appreciably affecting the lateral thickness of sidewall polycrystalline silicon 120. Because layer 120L can be etched selectively with respect to layer 118, over etching of layer 120L does not significantly effect layer 118. The result of the two depositions, i.e., layers 118 and 120L, is to further reduce the width of the emitter opening 95. Again, the width of emitter opening 95 is narrowed without relying on photolithography or etching of holes. Instead, the narrowing in width is varied by adjusting the thickness of layers 118 and 120L. LPCVD processes are convenient for layers 118 or 120L because the thickness may be easily controlled. The thickness of layers 118 or 120L can also be adjusted to account for slight errors in the original photoresist-determined dimensions of the emitter region. Thus some error in etching of holes or openings at the master mask stage of the processing can be corrected by the selection of the oxide or polycrystalline silicon deposition thickness. Layer 120L is desirably formed from polysilicon because it is easily differentially etched with respect to the underlying layers. Other materials having this same feature could be used in place of polysilicon for layer 120L. It is desirable that layer 120L be conductive although that is not essential. Silicides and refractory nitrides are examples of useful alternatives.

Figure 14:
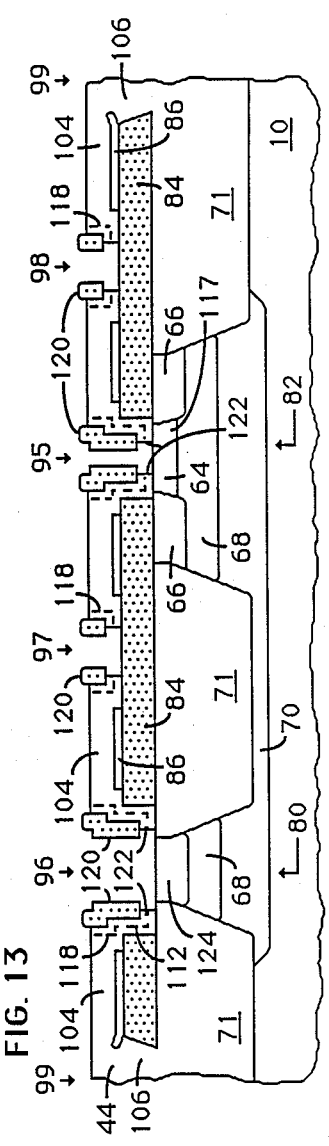

Referring now to FIG. 14, deposited oxide 118 is conveniently etched, preferably by anisotropic means such as reactive ion etching, without a photoresist mask, to expose the underlying thermal oxide 110. Thermal oxide 110 is then conveniently etched (e.g., by wet or dry etching) to expose surface 68B of monocrystalline silicon region 68 under emitter contact hole 95 and collector contact hole 96 and to expose polycrystalline silicon layer 84 in base contact regions 97, 98. If isotropic etching is used it partly undercuts the oxide under remaining portion 120 of polycrystalline silicon layer 120L as shown in FIG. 14, but leaves a portion of thermal oxide 112 along the sidewall of polycrystalline silicon layer 84 in emitter opening 95 and collector opening 96 as well as a portion of doped oxide 110 on the monocrystalline silicon region at the periphery of emitter contact region 95. However, anisotropic etching may be used in which case there is essentially no undercutting of the oxide beneath poly region 120, or a combination of anisotropic and isotropic etching may be used to control the amount of undercutting if that is desired.

The remaining portion of thermal oxide 110 is here labeled with the number 122. If reactive ion etching is used for layer 118 and/or 110, the etching should be timed so as not to entirely etch the oxide down to the monocrystalline silicon, but leave at least some of the thermal oxide 110 to protect the surface of the monocrystalline silicon from the reactive ion etch. The subsequent etch of the remaining oxide should also be controlled, as the actual emitter area is defined by the lateral etching of oxide layers 110 and 118 beneath the remaining polysilicon portions 120. A low bias dry etch or a wet etch should be used to finally clear layer 110 in openings 95–98.

The summation of all the elevated temperature steps for deposition, anneal, and/or specifically for redistribution, serve to redistribute the boron dopant to form the active base 64 and the extended base 66. The same high temperature conditions also serve to drive-in or further redistribute the ion implant for deep collector contact 124. Active (intrinsic) base 64 results from the redistribution of the deep base ion implant. Extended (extrinsic) base 66 results from out-diffusion of boron dopant from overlaying boron doped polycrystalline silicon layer 84. The presence of remaining portion 122 of boron rich oxide 110 performs the important function of preventing the depletion of dopants from monocrystalline silicon portion 117 in the region where the active and extended bases meet, i.e., between active base 64 and extended base 66. This avoids excessive resistance between active base 64 and extended base 66 and minimizes the contribution to unwanted base resistance from this region.

Intermediate portion 117, however, is more lightly doped than the remainder of the extended base and serves as a spacer between heavily doped extended base 66 and the highly doped emitter to be subsequently formed. The spacing between heavily doped extended base region 66 and the heavily doped emitter is necessary to maintain acceptable base-emitter junction characteristics. The creation of this spacer having a controlled intermediate doping is a particular feature of this embodiment of the invention. For simplicity, in FIGS. 15–22 and 2, the number 44 is used to refer collectively, to the remaining portions of oxide or dielectric regions 104, 106, 110, 118, and 122 which are depicted in detail in FIGS. 14 and prior views.

Figure 15:
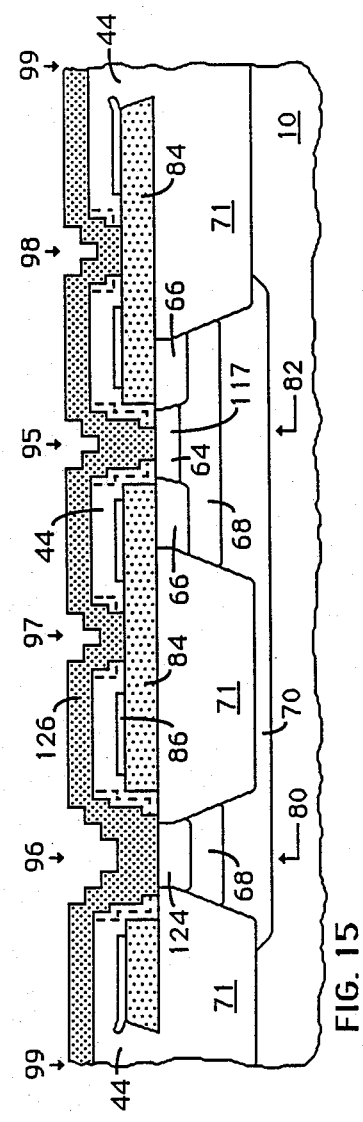
Figure 16A:
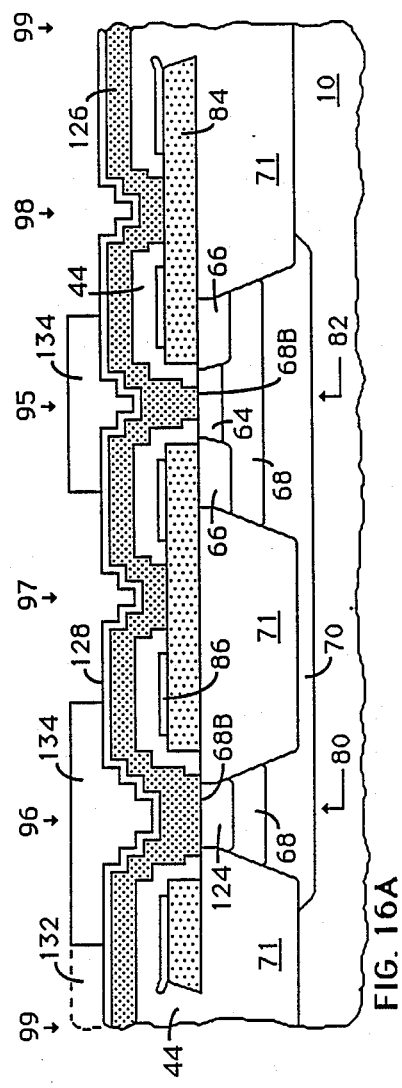

Fourth layer of polycrystalline silicon 126 and overlaying layer 128 of silicon oxide are deposited, for example by LPCVD on layer 44 (See FIGS. 15–16A). Polycrystalline silicon layer 126 has a thickness of about 200–300 nanometers and is used to form the emitter contact, collector contact, and, where desired, emitter and collector resistors. Polycrystalline silicon layer 126 may be deposited doped or deposited undoped and subsequently generally or locally doped. For emitter and collector contacts on NPN devices arsenic doping is convenient. While polysilicon is a particularly convenient material for layer 126, other materials which are conductive and which can be used as a dopant source and contact for substrate region 68 are also suitable. It is also desirable that layer 126 be differently etchable with respect to the underlaying dielectric regions. Binary and ternary silicides are examples of useful alternative materials for layer 126, having these combinations of properties in varying degrees. Those of skill in the art will understand how to choose the most suitable material based on the description herein.

Layer 128 functions as a protective layer or screen for subsequent ion implants and serves as an etch mask for the pattening of polylayer 126. It also prevents photoresist from being deposited directly on polycrystalline silicon layer 126 which might cause contamination thereof. While silicon oxide is a preferred material for layer 128, other materials having the properties to act as an implant screen and an etch mask can also be used. Such materials are known in the art.

There are a number of possible variations in the process at this point depending upon whether or not emitter or collector resistors are used, and depending upon the value of those resistors. If no resistors are to be used, or if the resistors can be formed from polycrystalline silicon having the same sheet resistivity as that of the emitter and collector electrodes, a blanket arsenic implant is applied at this time. Thereafter, a layer of photoresist is applied to the surface of the device and fifth block-out mask 134 as illustrated in FIGS. 16A–B is used to pattern the photoresist. Fifth block-out mask 134 protects the portion of oxide 128 (and poly 126) in collector contact opening 96 and emitter contact opening 95. Fifth block-out mask 134 may also include portions 132 and 133 (see FIGS. 16A–B) to protect collector poly resistor region 56 and/or emitter poly resister region 58 (see FIG. 1). Fifth block-out mask 134 is aligned to master mask 94 and allows for considerable alignment tolerance as illustrated by arrows 134V and 134L.

Figure 17A:
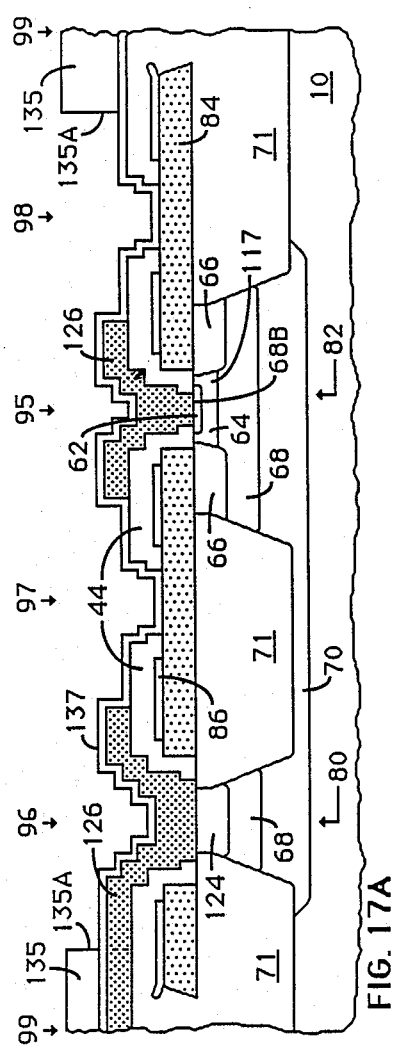

Patterned resist block-out mask 134 is used to mask oxide layer 128 which is then etched in the regions outside of resist 134 by, for example, reactive ion or wet chemical etching. Other etching methods can also be used. In a preferred embodiment, mask 134 is then removed and underlying patterned oxide layer 128 is used as an etch mask to pattern polycrystalline silicon layer 126. As a result of this patterning step, arsenic doped polycrystalline layer silicon 126 is left contacting the emitter region and the collector region, respectively, and is elsewhere removed. The result is illustrated in FIG. 17A which is discussed more fully later. Where polysilicon emitter or collector resistors are desired or where fourth poly-layer 126 is being used for other purposes, these resistor or other regions of layer 126 would be included within the fifth block-out mask and, of course, would not be removed.

The structure is annealed to redistribute the arsenic in polysilicon 126, and to drive the arsenic into surface 68B of monocrystalline silicon region 68 to form emitter region 62 within active base 64 and precisely spaced between and alined with extended base region 66. Arsenic is also driven from polysilicon layer 126 into collector contact 124 below opening 96 to further enhance the conductivity of that region.

After removal of the undesired portions of layer 128 as described above, passivating layer 137, preferably a layer of silicon nitride, is formed overlaying the structure (see FIG. 17A). This layer may be formed, for example, by plasma enhanced chemical vapor deposition or LPCVD. This passivating layer conveniently has a thickness of about 100–200 nanometers and functions as an insulting spacer between the remaining portions of polysilicon layer 126 and unrelated portions of a metal layer to be subsequently deposited. Passivating layer 137 is photolithographically patterned using sixth block-out mask 135 illustrated in FIGS. 17A–B. Etching through sixth block-out mask 135 provides single open window 135A in layer 137 over the transistor to simultaneously expose emitter, collector, and base contact areas. It is not necessary, as is common with prior art processes, to open individual windows to each of contact areas 95–98; single large window 135A is sufficient. This is because the device areas outside of the individual contacts are not harmed by the subsequent etching steps and need not be separately covered. This avoids having to open very small individual contact windows which is more difficult to do. Thus, yield is enhanced by this approach which is a particular feature of an embodiment of this invention. As indicated by arrows. 135V and 135L, alignment of sixth block-out mask 135 to the master mask pattern need not be precise.

Figure 18:
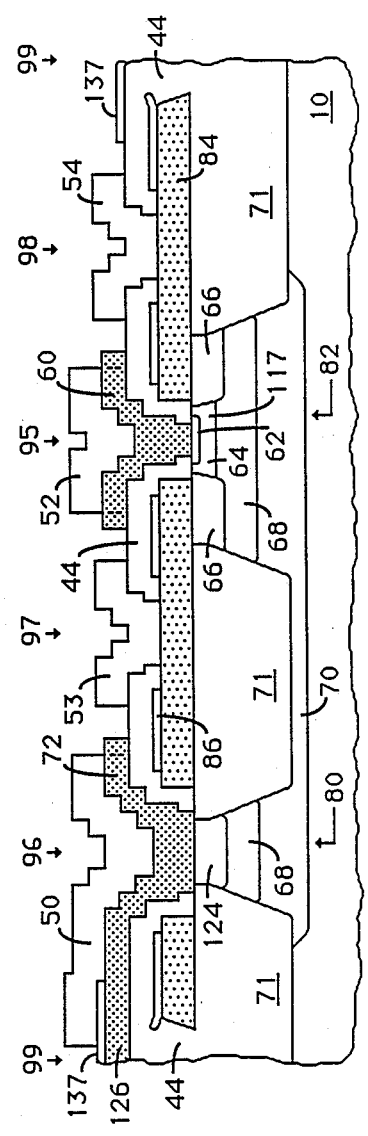
Figure 19:
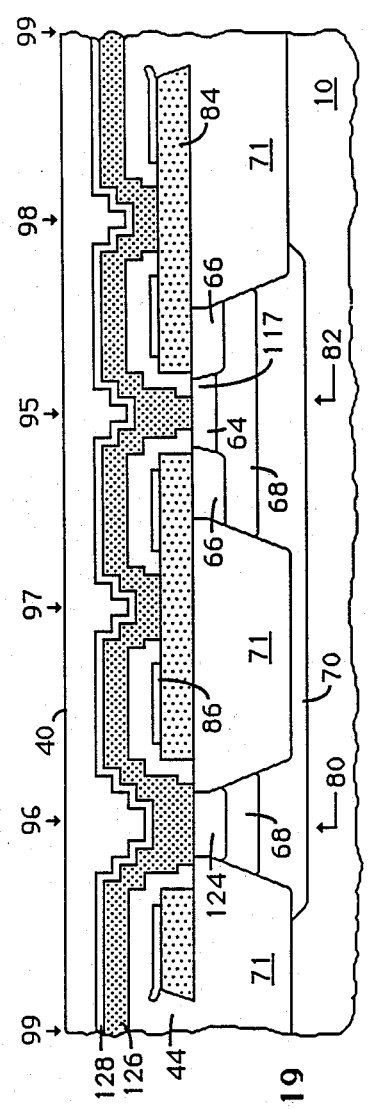

A layer of metallization is applied to the device surface, overlying silicon nitride layer 137 and extending into the contacts through opening 135A in silicon nitride layer 137. Aluminum is useful for the metallization, but other conductors can also be employed. As used herein, the words "metal" or "metallization" are intended to included metals, metal alloys or mixtures, semi-metals or intermetallics, and other substantially conductive materials. A composite metallization is preferred comprising, for example, a first layer of PtSi in contact with the silicon, followed by a TiW barrier layer, followed by either Al, or AlSi or ALCuSi in conventional proportions. The metal layer is patterned lithographically to leave stripes 52, 50, and 53-54 of metal overlying the emitter, collector, and base electrode regions, respectively, as illustrated in FIGS. 1, 2 and 18. FIGS. 2 and 18 also illustrate the remaining portions of silicon nitride passivation layer 137 surrounding the contact area outside of boundary 135A. Metal contact electrodes 52, 50, and 53-54 are formed with minimum metal width and a minimum spacing between adjacent metal runs, commensurate with the spacing on the original master mask.

In accordance with a further aspect of the invention, metal strips 52 and 50 contacting the emitter and collector regions are desirably made narrower than the polysilicon contact electrodes formed from poly layer 126. This is shown in FIG. 18. The mask for patterning metal stripes 52 and 50 can also be used as an etch mask during removal of those portions of polysilicon emitter and collector electrodes 126 which extend beyond the width of metal stripes 52 and 50, as it illustrated by the dotted lines through layer 126 at the edges of stripes 50 and 52 in FIG. 18. This situation is also illustrated in FIG. 2 where polysilicon contact 60, formed from layer 126 has been etched using metal stripe 52 as a mask, polysilicon contact 72, also formed from layer 126, has been etched at the right using metal stripe 50 as a mask, but at the left has (optionally) not been etched so that portion 56 of layer 126 may be (optionally) retained to act as a series collector resistor.

This aspect of the invention has several important benefits. First, precise etching and alignment of the polycrystalline contact electrodes is not necessary. It is inherently provided. This overcomes a problem in the prior art. Second, patterning the polysilicon in this manner allows maximum contact area between the polysilicon electrode and the overlying metal electrode even though both metal and poly are of minimum width (after etching). This, in turn, minimizes the contact resistance between the two materials while avoiding alignment tolerance area penalties. Third, precise centering of the metal stripes to original contact windows 95-98 is not needed, as it frequently is with the prior art, since poly regions 60, 72 and 84 are self-aligned and provide for intermediate connection to the active regions of the device. This reduces the alignment tolerance that must be provided, allowing even more compact structures, to be built, as compared to the prior art.

In the final structure, as illustrated in FIGS. 1 and 2, contact to base region 64 of the transistor is made through base metal stripes 53 and 54. These metal stripes contact boron doped polycrystalline silicon base electrode 84 which in turn contacts extended base 66, and which in turn contacts active base 64. Heavily doped polysilicon region 84 and heavely doped extrinsic base regions 66 extend the base connection to a location immediately adjacent emitter 62, thus minimizing unwanted base resistance. Emitter 62 is contacted by metal stripe 52 through heavily doped polysilicon electrode 60 formed from layer 126. In a similar manner, transistor collector region 68 in epi-island 80 is contacted by a metal stripe 50 through heavily doped polycrystalline silicon electrode 72 formed from layer 126, deep collector contact 124, and buried layer 70. While collector contact diffusion 124 is shown in these figures as extending only partway through epi-region 68 in island 80, those of skill in the art will appreciate that with each thermal cycle following its implantation, region 124 progresses deeper into the substrate until by the end of the process the whole region of epi-island 80 between the surface and buried layer 70 has enhanced doping. The doping in region 124 is further enhanced by dopant from fourth poly layer 126. These combine to minimize collector series resistance in epi-island 80. For simplicity, this detail has been omitted from the figures. Contacts to the base, emitter, and collector are all self-aligned and minimize unwanted resistance.

The device structure and process described above illustrate the fabrication of an NPN transistor in accordance with specific preferred embodiments of the invention. In accordance with further embodiments of the invention, many variations in this basic process are contemplated, as well as additional active and passive devices which can be simultaneously fabricated as part of an integrated circuit or the like.

For example, higher value emitter and collector resistors are formed in polycrystalline silicon layer 126 by doping the poly layer in two steps. First a comparatively moderate arsenic implant is used to achieve the desired resistivity for forming resistors. A photoresist mask (not shown) is then applied over patterning oxide 128 and is used as an ion implantation mask to mask a second higher dose arsenic implant into layer 126. This photoresist mask protects the polycrystalline silicon resistors from this second implant. This second implant provides the higher doping desired for the collector contact and emitter areas. After these implants, a further photoresist mask is used to pattern oxide 128 and then polycrystalline silicon 126 in the desired pattern for resistors and contact electrodes. This process can be varied, as needed, to achieve different values of emitter and collector resistors, and the like.

Vertical NPN transistors of the type illustrated in FIGS. 1-2 and having emitter contact opening 95 of approximately 1.5×4 micro-meters, as drawn, were constructed according to the method and arrangement described above. The resulting emitter dimensions were about 0.7×3.2 micrometers. Such devices showed $f_t$ values of typically 15-16 GHz and dc gain values of typically 80-120. Integrated ring oscillators formed from the devices of FIGS. 1-2 exhibited typical gate propagation delays of about 70 picoseconds at 800 microamps gate current.

CONTACT PLANARIZATION

The structure described above has a planar oxide except in the vicinity of the contacts, particularly the emitter and collector contacts, or more generally, the contacts made to the underlying single crystal islands by poly layer 126. In these regions poly 126 and some of the overlying metal may have steps. In accordance with a further embodiment of the invention, planarity of the final structure is improved to facilitate further processing. In addition, the planarizing process eliminates the fifth block-out mask previously used to pattern poly layer 126.

Figure 20:
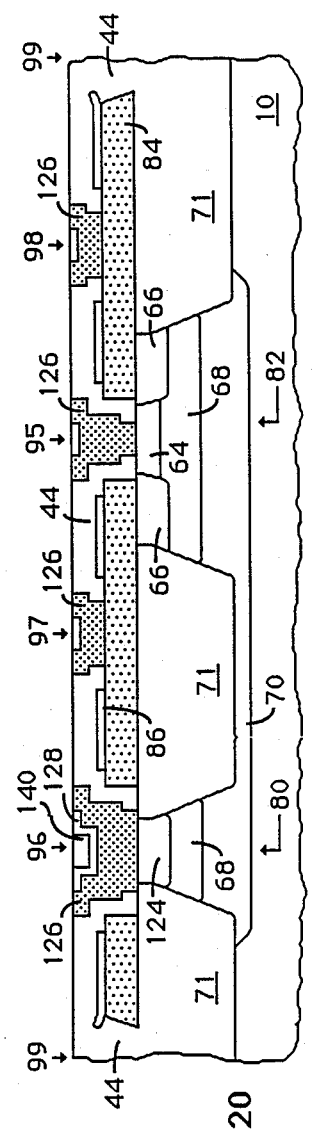
Figure 21:
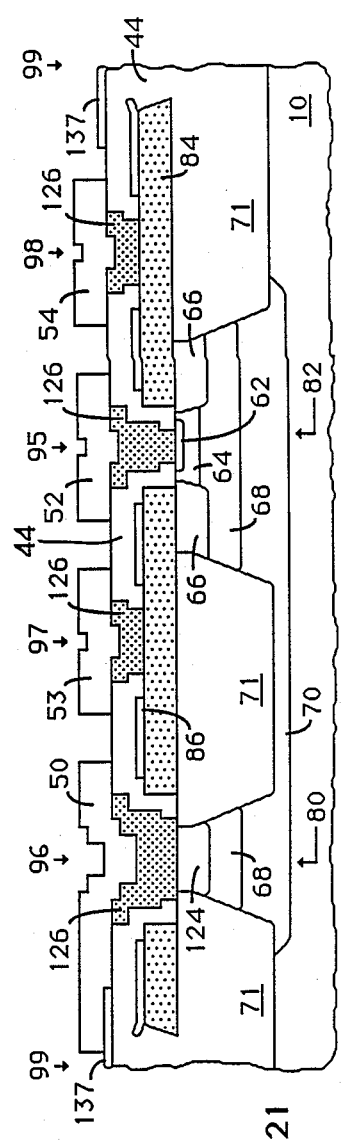

The process steps for planarizing the contact structure begin after deposition of fourth polysilicon layer 126. The structure at this point in the process is as illustrated in FIG. 15. Oxide layer 128 may or may not be used. Referring now to FIGS. 19–22 a layer of planarizing material 140 is applied either directly overlaying polycrystalline silicon layer 126 or over optional layer 128. Planarizing material 140 may be for example, a conventional semiconductor grade photoresist, but other planarizing materials may also be used. Planarizing layer 140 fills depressions such as that found over the collector structure in opening 96, thereby tending to level the topology of the structure. The coated structure is planarized by a substantially uniform etch-back. Reactive ion etching in an etch chemistry which has an etch ratio of polysilicon to photoresist about in the range of 1:1 to 2:1 is suitable, with as close to 1:1 as can be achieved being preferable. The effect of such a planarizing etch is illustrated in FIGS. 20–22 which show the structure of FIG. 19 for different amounts of planarizing etch-back. In FIG. 20 the planarizing etch has penetrated through the thickness of planarization layer 140 and polysilicon layer 126 on the flat surface portion of oxide 44. If the remaining portions of planarizing layer 140 are removed at this point, the surface of oxide 44 around openings 95–98 will have been cleared of polysilicon from layer 126, while the portions of polysilicon layer 126 in contact with regions 64 and 124 in contact opening 95, 96 and with layer 84 in openings 97, 98 will remain. In this situation it is desirable that layer 126 be deposited undoped and then locally doped N-type over emitter and collector openings 95, 96 and P-type over base contact openings 97, 98 so as to have the proper doping to correspond to the desired doping of the immediately underlying layers of the vertical NPN device. The local doping may be performed before or after the planarizing etch and the doping type adjusted to suit the requirements of the particular type of device being fabricated. The result after metallization is shown in FIG. 21.

However, etching may be continued, as in FIG. 22 through any remaining planarizing material until poly 84 is reached in openings 97, 98. Openings 97, 98 may then be cleared of polysilicon 126 while portions of polysilicon 126 still remain in openings 95, 96. This is because openings 97, 98, unlike openings 95, 96, extend only up to rather than through layer 84. In this situation poly layer 126 may be deposited doped with the type required for forming emitter 62 and enhancing collector contact region 124, since it is entirely removed from oppositely doped layer 84 during the etch back. The result after metallization is shown in FIG. 22.

In either FIGS. 21 or 22 a more planar surface is thus achieved, with no large polycrystalline silicon steps and with the recess over the collector and emitter contact regions at least partly if not completely filled. It is desirable that the planarizing etch be sufficiently selective so as to attack the polysilicon and the planarizing material at a higher rate than oxide 44, so that a substantial thickness of oxide 44 is left. For this reason, it is deisirable that layer 128 not be used or be very thin where planarization of fourth poly layer 126 is to be employed.

Following completion of the planarizing etch-back depicted in FIGS. 19–22 and removal of the planarizing material a first metal layer is applied and patterned into emitter, collector and base stripes 52, 50 and 53–54, as previously described. Nitride layer 137 is not needed, nor is it necessary to etch layer 126 using the metal as a mask since localization of polysilicon 126 to just contact regions 95–98 in FIG. 20 has already been accomplished. The finished structure is shown in FIG. 21 or 22.

By comparing FIGS. 16A–18 with FIGS. 19–22. It will be apparent that fifth block-out mask 131 may be omitted when the above described planarization process is employed. This is because the localized portions of poly layer 126 left under openings 95–98 are automatically separated by the planarization etching process and confined within the sidewalls of oxide 44 under openings 95–98. This is a substantial advantage.

A further advantage of the planarized structure, especially the version shown in FIG. 22, is that the series resistance between metal electrodes 50, 52 and diffused regions 124, 62 is reduced. An additional advantage is that silicide forming materials may be preferentially applied to the polysilicon exposed under openings 95–98 prior to metallization. This is useful for further reducing the poly layer thickness and the contact resistance between metal 50, 52 and underlying contact device regions 124, 62. When using silicides, care must be taken not to drive the silicide-poly interface completely through the poly remaining above emitter 62 under opening 95. Methods for preferential application of silicides are well known in the art. For example, a silicide former such as platinum may be deposited everywhere on the planarized substrate and heated to form platinum silicide where it contacts the remaining, separated portions of poly layer 126. The platinum which rests on the oxide between the separated portions of layer 126 does not react and may be readily removed by selective etching to leave the platinum silicide contact regions behind.

In accordance with a further aspect of the invention, transistors of improved performance are obtained using two implants of different penetrations for active base region 64 (see FIG. 11). One implant is a high dose, low energy implant with a peak concentration located in oxide 110 at or near the interface with surface 68B between oxide 110 and epitaxial layer 68 in island 82, and with the bulk of its dose in oxide 110. The other, deeper implant has the bulk of its dose in epi-layer 68 and substantially determines the Gummel number in base 64. The two base implants are also directed into polycrystalline silicon layer 84 in base contact openings 97, 98 and serve to enhance the conductivity of the polycrystalline silicon in that region. The two base implants may be performed in either order prior to heat treatment. Additional details concerning the double implant process are given in copending application of Peter Zdebel et al., entitled, "Integrated Circuit Method Using Double Implant Doping", Serial Number 008,991, now U.S. Pat. No. 4,740,478

The process in accordance with the invention is especially designed for high performance bipolar devices and integrated circuits although other device types can also be fabricated. To achieve the high performance. level, shallow junction depths are required, and especially a shallow active base of relatively high peak impurity concentration is necessary. Control of the device characteristics requires precise control of the doping in the active (intrinsic) base region. Although ion implantation is generally accepted as a preferred doping method for accurately controlled concentrations, it is not perfect. The implanted dose may be disturbed or undesirably redistributed by subsequent processing. For example, dopant segregation into an everlying oxide during subsequent heating of an implanted region can cause a depletion of dopant from the semiconductor. This is particuolarly a concern when boron dopant is used in silicon. Boron segregation into the oxide can cause a significant change in the distribution and concentration of base dopants, particularly in the silicon near the oxide interface. As is discussed in more detail below, if boron depletion occurs the resistance of the extrinsic base immediately adjoining the emitter can rise to unacceptably high levels. Additionally, segregation of boron into the oxide can also lower the Gummel number of shallow active base 64. This makes it difficult to control device characteristics. These problems are overcome by using the low energy implant into screen oxide 110, described above.

Preferably, the deep implant into region 68 is performed first using $B^{11}$ at about 25 KeV and a dose of about $2-3 \times 10^{13}$ cm$^{-2}$. Under these conditions, this implant has its peak concentration about 90 nanometers below the silicone in epitaxial silicon surface region 68. This implant should place most of its dose into region 68 and is the primary determinant of the base Gummel number.

The shallow implant into screen oxide 110 is desirably performed next using $BF_2+$ at an energy of about 20-30 KeV and a dose of about $1 \times 10^{13}$ to $1 \times 10^{14}$ cm$^{-2}$. Boron difluoride is used ad the preferred dopant into screen oxide 110 because the massive molecule has a short range, so that reasonable implant energies can be used and still achieve a shallow implant located mostly within the oxide. The purpose of the shallow oxide implant is to completely saturate that portion of oxide 110 near silicon-oxide interface 68B with boron so that out-diffusion of boron from region 68 into oxide 110 across interface 68B is inhibited, and the deep boron implant remains in silicon region 68 and accurately determines the doping of base 64. The amount of boron implanted into oxide 110 and the energy of the implant are adjusted so that the peak of the shallow implant concentration is located in the oxide and the amount of the shallow implant tailing into the substrate is less than 20% of the deeper implant, preferably less than 10%, so that the shallow implant does not overwhelm the deeper implant and substantially determine the Gummel number in the base. The mechanism by which the shallow implant is believed to prevent dopant loss from the base region is explained in more detail below.

At diffusion temperatures, boron segregates into oxide layer 110 until the concentration at interface 68B satisfies the segregation coefficient. This results in a discontinuity in concentration at interface 68B. Boron from silicon region 68 moves into oxide 110 to adjust the oxide interface concentration upward and at the same time to adjust the silicon interface concentration downwards. As diffusion continues and boron is redistributed within silicon region 68 itself, the silicon interface concentration drops. To maintain equilibrium, the boron concentration at oxide interface 68B must also drop. Boron thus diffuses from oxide 110 into silicon region 68, with implanted oxide 110 becoming a doping source. The effect of boron saturated screen oxide 110 is thus multifold as regards boron doping in the active base.

First, saturated screen oxide 110 acts to reduce segregation of boron from silicon region 68 to oxide 110 and, second, boron saturated screen oxide 110 additionally acts as a near surface doping source. By reducing segregation from the silicon to the oxide, doped screen oxide 110 acts to keep the deep implant dopant in base region 64. The amount of boron in base 64 can thus be controlled by controlling the deep implant; the amount of dopant desired in the base is supplied during this implant. The deep implant of known doping density will substantially remain in the silicon because of the separately doped screen oxide 110.

Second, the dopant in screen oxide 110 provides a means for fine tuning the dopant distribution in the active base. The fine tuning is dependent upon dopant dose, implant energy, and subsequent heat treatment after implant and before etch out of the implanted screen oxide.

Third, the doped screen oxide also serves an important function with respect to reducing the resistance between the active base region and the base contact while preserving adequate emitter-base breakdown voltage. This is explained more fully below.

The double implant process insures that screen oxide 110 is heavily boron doped but does not dominate base doping. Central portion 110B of screen oxide 110 under openings 95-96 is removed leaving behind portions 122 of screen oxide 110 underneath sidewall portions 120 of third poly layer 120L (see FIGS. 13-14). Portions 122 remain after the regions of oxide layers 110 and 118 under openings 95, 96 laterally within sidewall portions 120 are removed. The amount of undercutting of portions 122 beneath sidewall portions 120 may be adjusted as desired by varying the etch conditions. Once the doped oxide has been removed above active base 64 between sidewall portions 120, no further boron diffusion is possible into active base 64 from the removed portions. Except for the effect of arsenic compensation during doping of emitter 62 from layer 126 (see FIGS. 15-18), the base Gummel number is substantially fixed. However, during the emitter drive to form region 62, the boron available in portion 122 of oxide layer 110 continues to act as a boron source for preserving and enhancing the doping of intermediate region 117 between active base 64 and more heavily doped extrinsic base 66. This reduces the overall sheet resistance of the base while at the same time continuing to provide a buffer region between highly doped emitter 62 and highly doped extrinsic base 66. Were hightly doped emitter 62 and extrinsic base regions 66 to be in direct contact, the emitter-base breakdown voltage would be reduced. This is undesirable. Thus, the method and structure described above make it possible to simultaneously achieve lower series base resistance while preserving emitter-base breakdown voltage. Among other things, reduced base resistance improves device speed. The foregoing are particular features of this embodiment of the present invention.

Prior to heat treatment for activation of the deep implant, the two implants may be performed in either order. Based on the foregoing, those of skill in the art will understand how to adjust the deep and shallow implants to obtained the desired base doping profile and Gummel number.

LATERAL BIPOLAR TRANSISTORS

In the foregoing, a process and structure has been described for making a vertical NPN transistor on a P-type substrate (or a vertical PNP on an N-type substrate). The process is also amenable to the fabrication of other active and passive devices. A particular feature of the invented process and arrangement is that lateral PNP devices may be very conveniently fabricated on the same P-type substrate, and at the same time as the vertical NPN devices, using substantially the same layers and arrangement of masks. Such lateral PNP devices have improved performance as compared to the prior art.

In a first embodiment of lateral PNP devices, the base contact is located between the emitter and collector regions. This is referred to as a central base contact device and is a particular feature of the means and method of the present invention. The present invention enables one to fabricate a central base contact lateral transistor where the emitter and collector are very closely spaced and the central base contact is automatically self-aligned between the two and separated therefrom. This makes it possible to achieve high frequency performance not hitherto possible with such lateral devices.

Figure 23B:
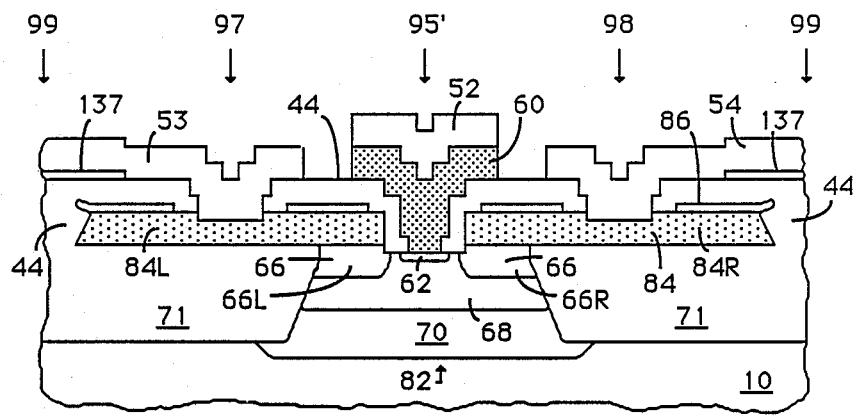
FIGS. 23A and 23B illustrate, in schematic top view and simplified cross-section, respectively, a lateral PNP transistor having a centrally located base contact, fabricated in accordance with another embodiment of the invention.
Figure 23A:
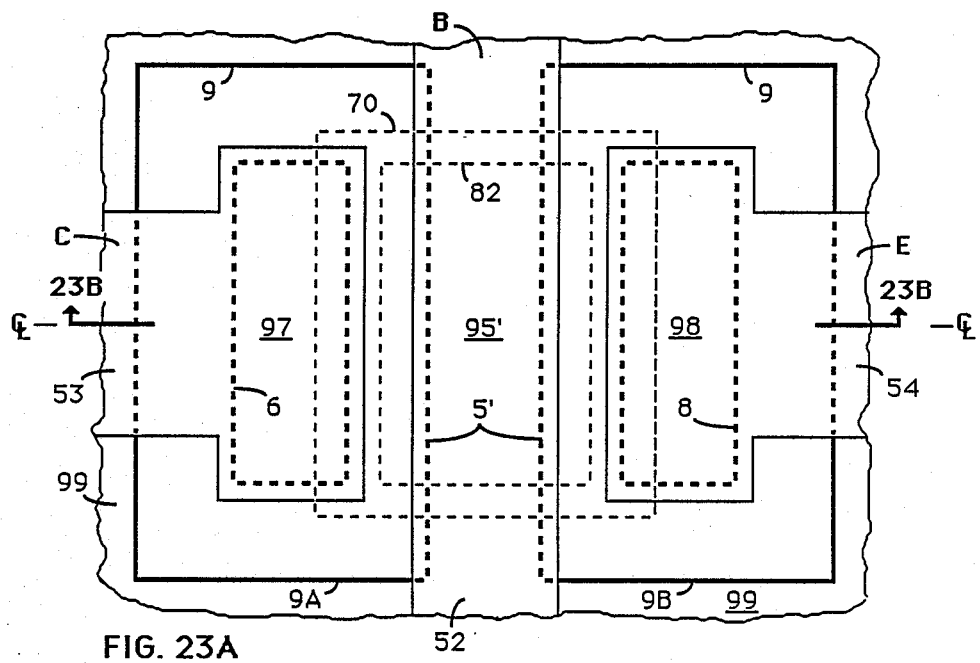

Referring now to FIGS. 23A-35B, the formation of a lateral transistor according to a first embodiment will be described. FIG. 23A shows a top view of a central base contact lateral PNP transistor and FIG. 23B shows a schematic cross-section of the device of FIG. 23A along the centerline. FIGS. 23A-B are analogous to FIGS. 1-2 for the vertical NPN. The same numerals are used in FIGS. 23A-35B to identify the same layers and the equivalent regions to those in FIGS. 1-22, i.e., formed at the same time and/or in substantially the same way. However, those of skill in the art will appreciate that equivalently formed regions of the lateral device may perform different electrical functions than they do in the vertical divice.

In FIGS. 23A-B, the lateral PNP is built in epi-island 82 in N-type epi-layer 68 on P-type substrate 10. Epi-island 82 is laterally surrounded by dielectric isolation region 71. N+ buried layer 70 formed at the same time as region 70 in FIGS. 1-2 is also shown, but this is not essential to the operation of this version of the lateral PNP and may be omitted. The heavy solid and dashed outline 9A ,9C in FIG. 23A indicates the shape and location of the master mask which is used to locate the device contacts and the key device regions within epi-island 82. This is decribed in more detail later.

The lateral PNP structure shown in FIGS. 23A-B is substantially identical to the vertical NPN device of FIGS. 1-2 except for three important differences: (i) epi-island 80 and related mask opening 96 are omitted, the device being built entirely in epi-island 82; (ii) base region 64 shown in FIG. 2 is omitted, and (iii) P-doped polysilicon layer 84 and P-type diffusion 66 are formed so as to each have two electrically separated regions 84L-R and 66L-R respectively (see FIGS. 23A-B). These separated regions act as collector and emitter contacts and regions in the lateral device. N-type epi-region 68 in epi-island 82 serves as the base region of the lateral transistor. Contact to the base region of the lateral PNP is provided by N+ region 62 which is equivalent to N+ emitter region 62 of the vertical NPN and formed in the same fashion. Contact 62 in the lateral PNP of FIGS. 23A-B is automatically self-aligned and centrally located between emitter-collector regions 66L-R by virtue of the same basic process which located emitter region 62 centrally within base contact 66 in the vertical NPN of FIGS. 1-2. This process is now described to illustrate how the above noted structural differences are obtained. Since the process is for the most part the same as for the vertical NPN device, the description is much abbreviated.

FIGS. 24A-35B illustrate the device of FIGS. 23A-B at different stages of fabrication and according to two different embodiments of the process, i.e. FIGS. 24A-29B show a first embodiment and FIGS. 30A-35B showm a second embodiment. Expect as is otherwise noted or as would be readily apparent to one of skill in the art, the steps illustrated in FIGS. 24A-29B and 30A-35A are generally analogous to the process steps illustrated in FIGS. 3-9.

Figure 24A:
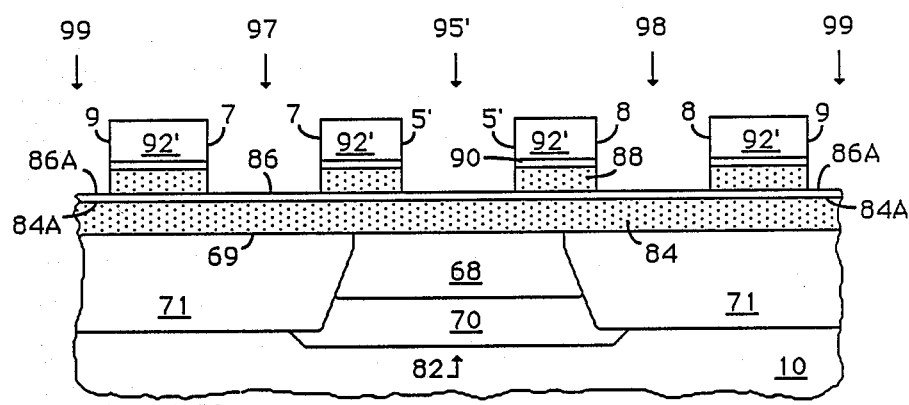
Figure 24B:
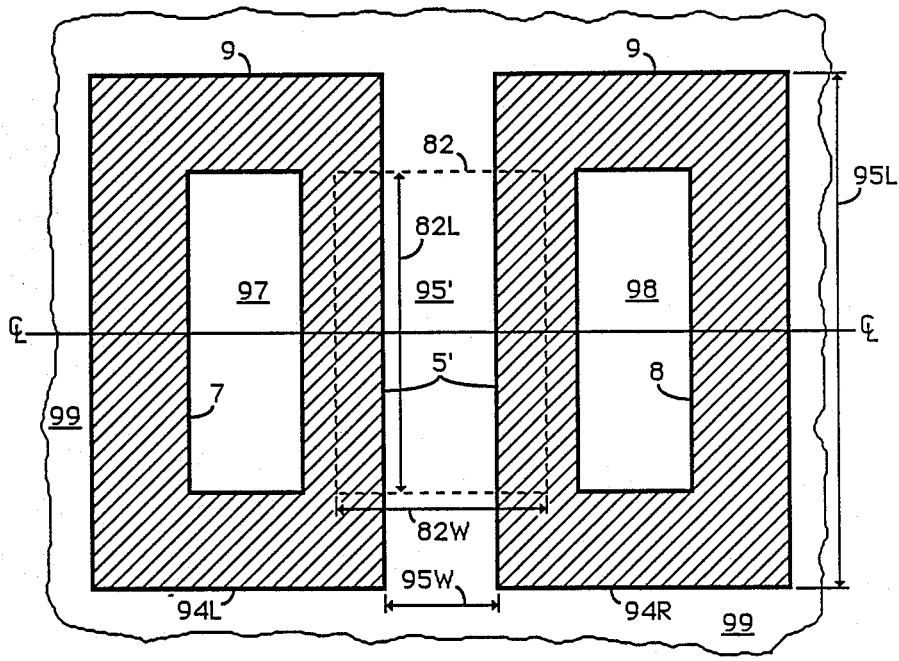

Referring now to FIGS. 24A-29B, substrate 10 has therein epi-island 82 having N-type epi-region 68 laterally surrounded by isolatin region 71. Epi-island 82 and isolation region 71 are covered with first poly layer 84, first oxidation resistant layer 86, second poly layer 88, and masking layer 90, in the same way as for the vertical NPN. Master mask 94' analogous to master mask 94 is applied to pattern resist 92 (see FIGS. 24A-B). Master mask 94' has two closed regions 94L and 94R separated by gap opening 95' of width 95W and length 95L and having edges 5'. Master mask 94' has openings 97 and 98 whose function is identical to opening 97, 98 of master mask 94 for the vertical NPN. Gap opening 95' is aligned over epi-island 82. Great lateral alignment precision is not required. However, width 95W of gap 95' must be less than width 82W of epi-island 82 and both edges 5' of gap opening 95' must lie at least partly within epi-island 82. Lengthwise alignment is also not critical. It is generally desirable that length 95L of gap openig 95' exceed length 82L of epi-island 82. Master mask 94' is used to define resist image 92' which is used in turn to allow removal of the indicated portions of layers 90 and 88 as shown in FIG. 24A.

Figure 25A:
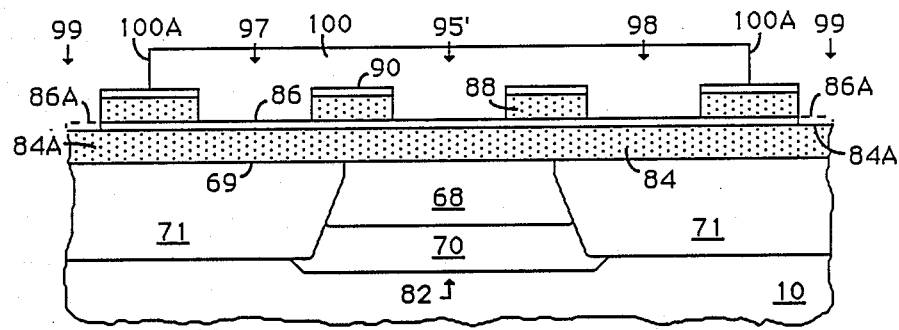
Figure 25B:
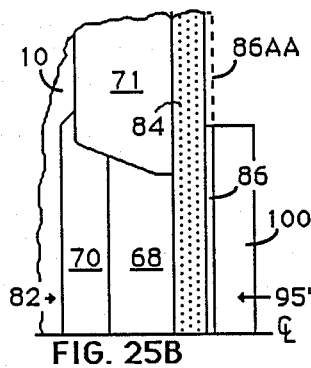
Figure 27B:
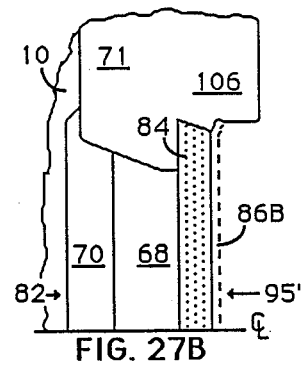
Figure 26:
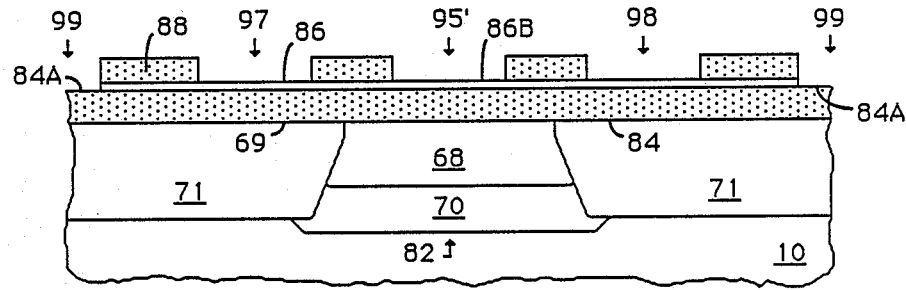
Figure 27A:
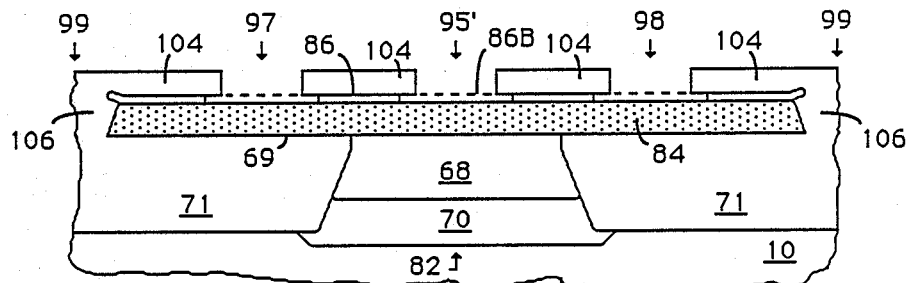

First block-out mask 100 is applied just as for the NPN device and used in conjunction with master mask 94' to allow peripheral portion 86A of nitride layer 86 to be removed. Other than being shorter since opening 96 is missing in the lateral device, the first block-out mask is substantially identical for the two device types. Portion 86AA of layer 86 in the portion of gap 95' exterior to mask 100 is also removed, as is indicated in FIG. 25B which is a cross-section through the device under gap opening 95'. The result is illustrated in FIG. 26. The remaining portions of layer 90 are removed. The exposed portions of layers 84 and 88 are then oxidized in the same manner as has previously been described for the vertical NPN device to produce the structure shown in FIGS. 27A-B. FIG. 27B is a cross-section similar to FIG. 25B but after oxidation. Portions 86B of layer 86 which are exposed between oxide islands 104 are then removed and the second block-out mask applied as shown in FIGS. 28A-C.

Second block-out mask 108 is substantially identical as for the vertical NPN and performs an analogous functions. However, because master mask 94' has a different shape, the effect of the combination of masks 94' and 108 is to allow portion 84C of layer 84 located under gap opening 95' to be etched away, thus separating layer 84 into two regions 84L and 84R aligned on either side of gap 95'. The result is shown in FIGS. 29A-B. FIG. 29B is a cross-section similar to FIG. 28B but after removal of portion 84C. Viewed from the top, sepatated portions 84L, 84R of layer 84 have approximately the shape as portions 94L and 94R of master mask 94' (see FIG. 24B. Note that holes 97, 98 do not extend through layer 84).

The lateral device illustrated in the cross-section of FIG. 29A is at the equivalent stage of manufacture as the vertical NPN in FIG. 9. The remainder of the processing of the lateral device follows substantially the same process as for the vertical NPN, except that those steps or mask images associated with forming regions 124 and 64 in the vertical NPN may be ommitted. Where both types of devices are being formed simultaneously, the subsequent mask are arranged to protect region 82 of the lateral device during such steps. The finished lateral device is shown in FIGS. 23A-B.

Figure 30A:
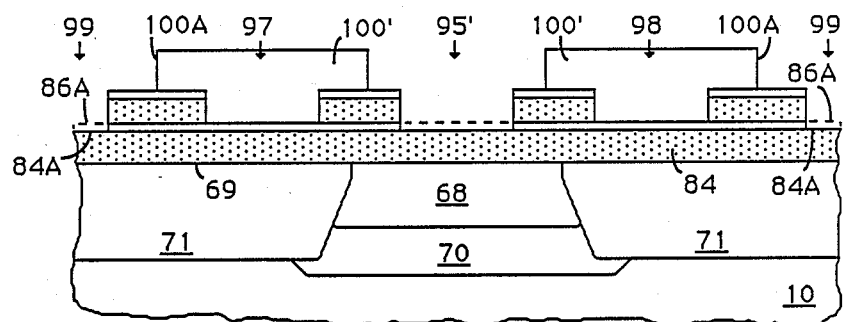
Figure 30C:
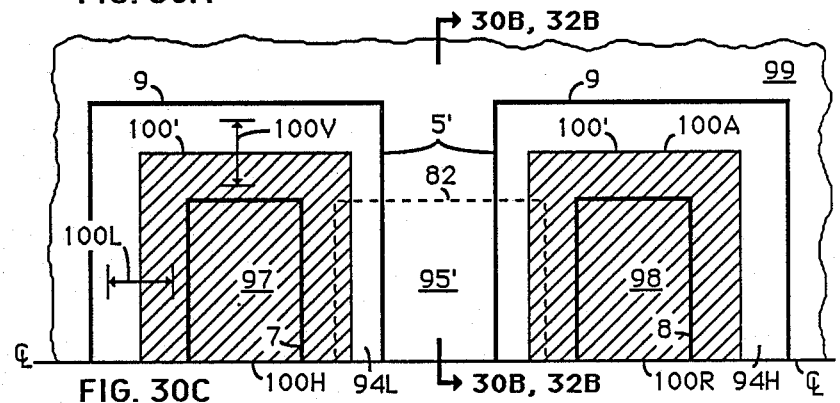
Figure 31:
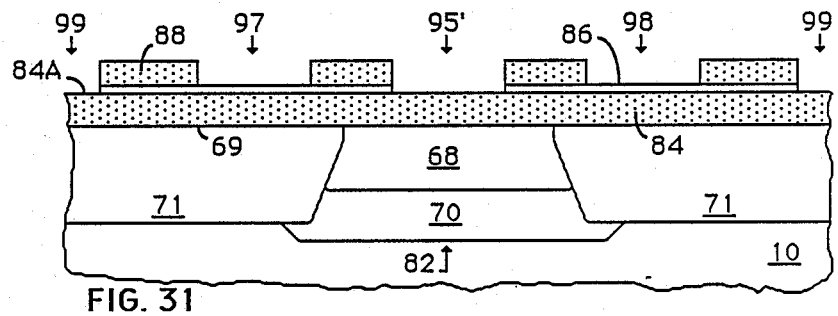
Figure 32A:
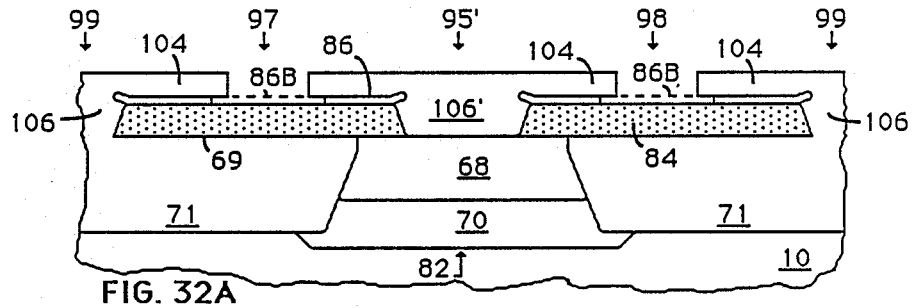
Figure 30B:
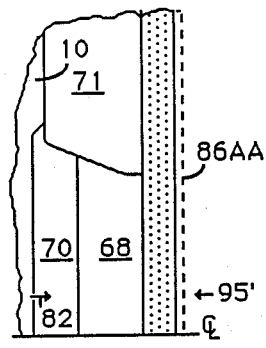
Figure 32B:
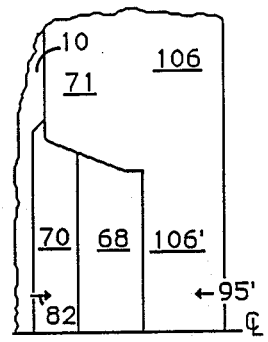

An alternative method of making a lateral PNP having a similar but not identical structure is illustrated, according to a further embodiment in FIGS. 30A-35B. FIGS. 30A-D show the lateral device of FIGS. 23A-B at the same stage of manufacture as in FIGS. 25A-C except that first block-out mask 100' has a different shape and extent. In FIGS. 30A-C, block-out mask 100' substantially covers the regions of the device which underlay portions 94L and 94H of master mask 94', but does not extend across gap 95' as it did in FIGS. 25A-C. As a consequence when layer 86 is etched using the combination of the master mask image and mask 100', portion 86AA of nitride layer 86 in gap 95' is remove to expose the corresponding underlying portion of poly layer 84 in gap 95'. This result is shown in FIGS. 30A-B and 31. Accordingly, when the oxidation step or steps are carried out to convert the exposed portions of layers 84 and 88 to dielectric oxide, the gap is filled with thick oxide 106', as shown in FIGS. 32A-B. FIG. 32B is a cross-section similar to FIG. 30B along gap 95', but after oxidation.

Figure 33B:
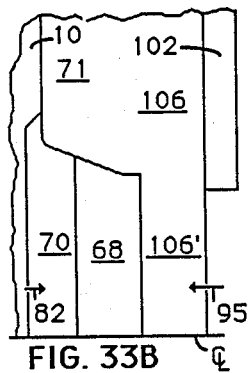
Figure 35B:
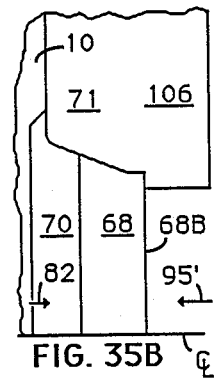
Figure 33A:
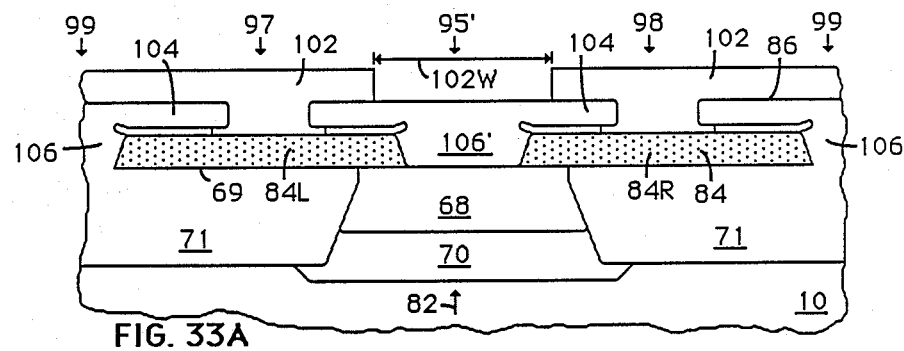
Figure 33C:
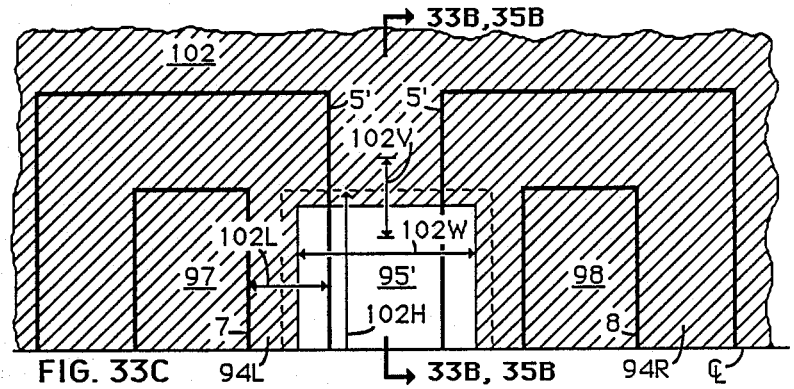
Figure 34:
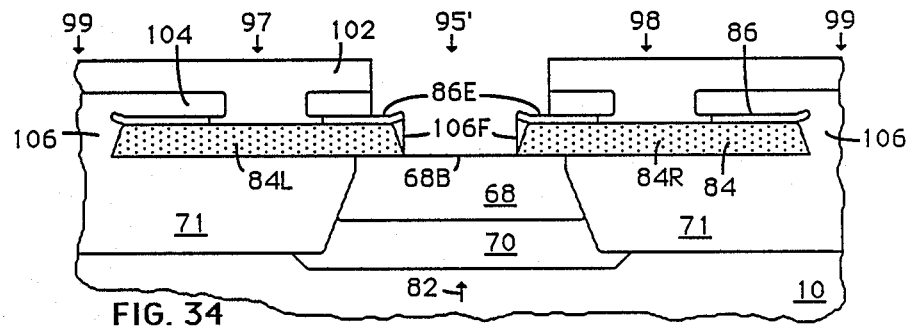
Figure 35A:
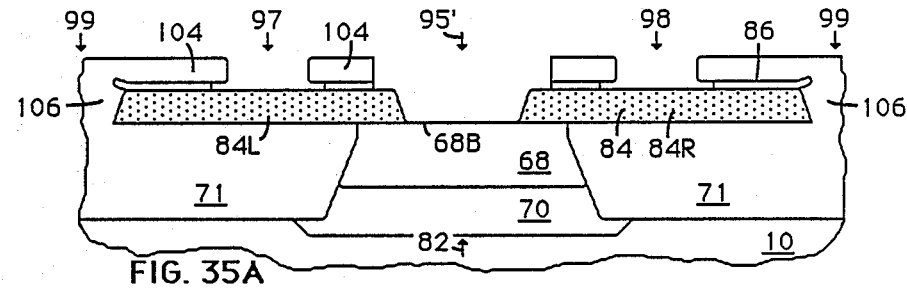

An additional block-out mask 102 is then used to allow thick oxide region 106' to be etched away over epi-island 82, as shown in FIGS. 33A-C. Mask 102 has an opening of width 102W and length 102H. Width 102W must exceed width 95W of gap 95' (see FIG. 24B). Length 102H may be larger or smaller than length 82L of epi-island 82, but it is preferably larger. The alignment of mask 102 to the image of master mask 94' is not critical as shown by arrows 102L and 102V. The lateral edges of the opening in mask 102 should lie on the images of master mask portions 94L and 94R (but not on openings 97, 98) so that edges 5' of the master mask image continue to control the width of the region being etched away (see FIGS. 33A, 33C). The result after a first etching step to remove the bulk of oxide 106' is shown in FIG. 34. Small poritons 106F of oxide may be left if anisotropic etching is used. The etching should be selective so as to cause minimum etching of underlying silicon epi-island 82. Portions 86E of nitride layer 86 exposed in opening 95' are also conveniently etched away along with residual portions 106F if any. Single or multi-step etching may be used as has been described previously at other stages in the process. The result is shown in FIGS. 35A-B wherein surface 68B of the central portion of epi-island 82 is exposed and separated portions 84L and 84R of poly layer 84 are left on either side of region 68 of epi-island 82 and in contact therewith to serve as a source of dopant into region 68 to form a spaced-apart lateral collector and emitter. Contact to separated and spaced apart regions 84L and 84R, which serve respectively as collector and emitter diffusion sources and contacts, is made through openings 97-98 in the same manner as for the vertical NPN device. FIG. 35B is a cross-section along gap 95' similar to FIG. 33B, but after etching of region 106'. The device in FIG. 35A-B is in substantially the same state as the device shown in FIG. 9 and subsequent processing follows substantially the same process described in connection with the vertical NPN except that opening 95' is protected during formation of base region 64 and collector contact region 124, as has been previously explained. The finished device is illustrated in FIGS. 23A-B, except that the difference in the slope of the sidewalls of poly layer 84 in opening 95' produced by the process of FIGS. 30A-35B as compared to the process of FIGS. 24A-29B has been omitted.

Based upon the above description it will be apparent to those of skill in the art that the foregoing lateral device structures lend themselves particularly well to simultaneous fabrication along with the vertical NPN devices previously described.

Lateral PNP devices having the configuration shown in FIGS. 23A-B were fabricated as described above and found to have dc gains as high as 100, but more typically in the range 30-40. Speed simulations indicate that $f_t$ values of about 300 MHz can be expected. This is a 5-10 times improvement over prior art lateral devices.

Figure 36:
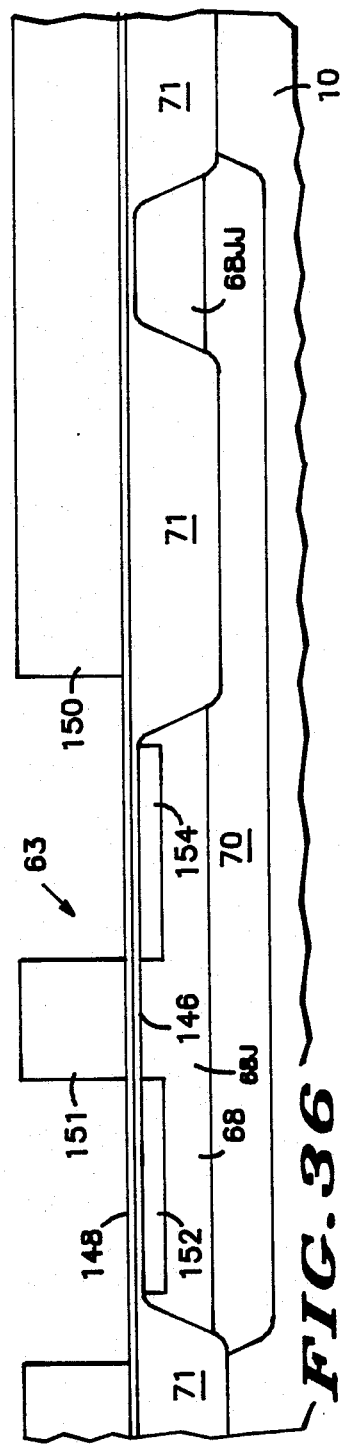
Figure 37:
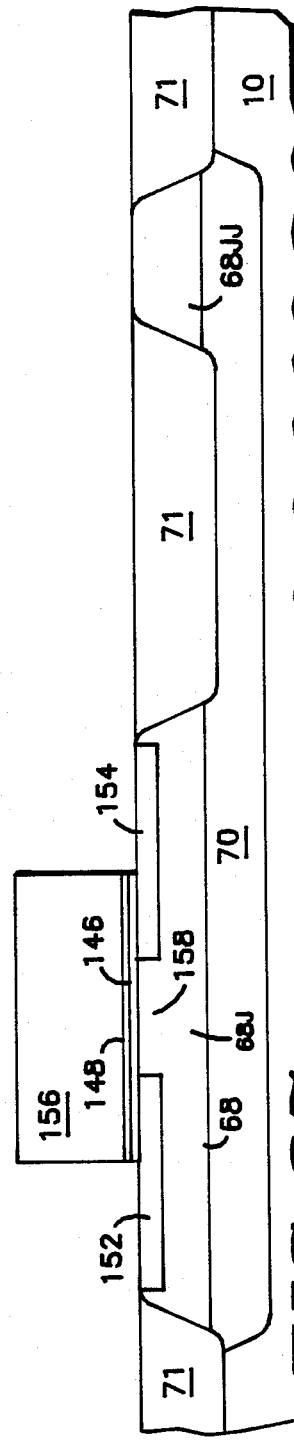
Figure 38:
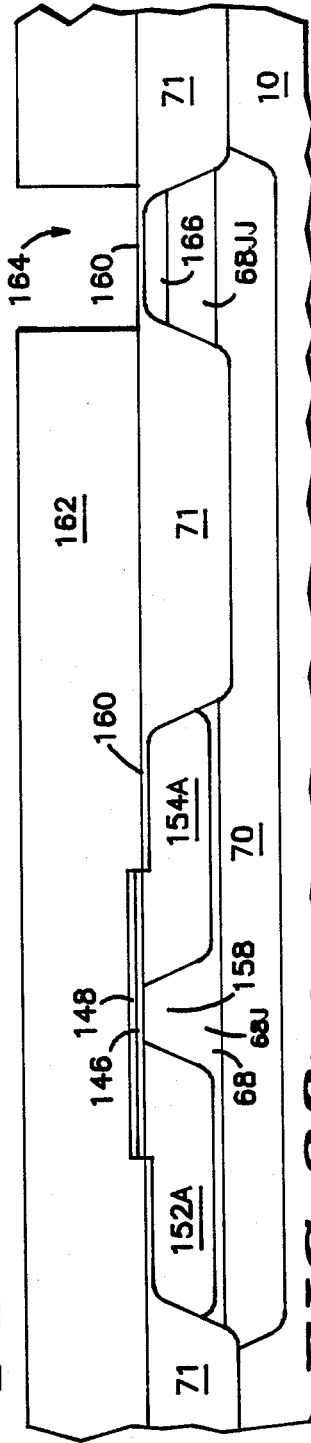

Lateral transistors having a remotely located base contact may be fabricated according to a further embodiment of the present invention. FIGS. 36-49 are schematic cross-sectional views illustrating the fabrication of lateral PNP transistor 63 using a similar process sequence and layers as for the vertical NPN, with several variations. In particaular, FIGS. 36-38 show steps which are generally performed prior to commencing the steps described in FIG. 3 in connection with the vertical NPN device. As compared to FIGS. 3-22, FIGS. 36-49 have been drawn with a greater attention to showning the actual appearance in practice, hence slight differences in the shape of equivalent or identically denoted regions will be apparent between the two sets of figures. This is intended merely to provide additional information.

FIG. 36 illustrates, in cross section, the initial structure of compatible lateral PNP transistor 63 after a few preliminary steps are completed. Consistent with the fabrication of the vertical NPN transistor, the structure includes a P-type substrate 10, N+ buried layer 70, N-type epitaxial layer 68, and recessed field oxide 71 which extends through epitaxial layer 68 and serves to isolate this device from adjacent devices. Field oxide 71 also serves to isolate the remote base contact from the emitter and collector, as will be described below. Epitaxial layer 68 is preferably about 0.7-0.9 micrometers in thickness and has a doping of about $2-4\times 10^{16} cm^{-2}$.

Overlying the surface fo epitaxial layer 68 and field oxide 71 is dielectric layer 146, preferably of thermally grown silicon dioxide, having a thickness of about 20-50 nanometers. Dielectric layer 148, preferably of CVD silicon nitride, having a thickness of about 70 nanometers is deposited over layer 146. As will become apparent, oxide 146 and nitride 148 provide a protective layer over a sensitive portion of the device surface. These layers protect the device surface and remain in place on selected areas throughout the device processing. Layers 146, 148 are not necessary to the fabrication of a vertical NPN transistor as described above, but can be added to the process without affecting the NPN process. Layer 148 of silicon nitride can also be employed as the nitride beneath polysilicon base resistor 142 (to be described later) in the preferred embodiment thereof, i.e., as layer 71A of FIGS. 64A-D.

Following the formation of oxide 146 and nitride 148, layer 150 of photoresist is applied to the surface of nitride 148 and patterned as illustrated in FIG. 36. Portion 151 of photoresist layer 150 is positioned over epitaxial island 68J where lateral PNP transistor 63 is to be fabricated. Epi-island 68J is analogous to epi-island 82 and epi-island 68JJ is analogous to epi-island 80 previously described.

In this embodiment, the width of photoresist portion 151 determines the base width of the lateral PNP transistor. Other than the width of this portion, the photoresist masking operation is relatively tolerant, allowing lateral misalignment of the pattern as long as portion 151 is located approximately centrally on epitaxial island 68J. Using photoresist 150, 151 and field oxide 71 as an implant mask, collector 152 and emitter 154 of the lateral PNP are conveniently implanted through the oxide 146 and nitride 148. The collector and emitter are conveniently implanted with, for example, boron at an energy of about 90 KeV and at a dose of about $5 \times 10^{14}$ cm$^{-2}$. Other dopants can also be used. Those of skill in the art will understand that the energy and dose may also be varied depending upon the desired device characteristics.

Photoresist 150, 151 is removed and another layer of photoresist is applied and patterned to leave portion 156 positioned overlapping the edges of the facing collector and emitter junctions as illustrated in FIG. 37. The alignment of mask 156 relative to mask image 151 is not critical so long as it includes the region previously covered by mask 151. Using photoresist 156 as a mask, nitride layer 148 is patterned by, for example, dry etching. Oxide layer 146 is then patterened by, for example, wet etching using patterned nitride layer 148 as a mask. These patterning steps serve to define the contact areas of the collector and emitter and to make possible the formation of low resistance paths from the contacts to the junction edges. Note that sensitive region near surface region 158 located between collector 152 and emitter 154 remains covered by patterned oxide 146 and nitride 148. Photoresist 156 is removed from the surface of the structure and layer 160 of oxide having a thickness of about 20 nanometers is formed, e.g., by thermal oxidation, on the exposed silicon surfaces. Patterned oxide 146 and nitride 148 serve as an oxidation mask during the growth of oxide layer 160. Implanted regions 152, 154 move deeper into region 68 during high temperature processing to form deeper collector 152A and emitter 154A as shown in FIG. 38.

Following the growth of oxide layer 160, layer 162 of photoresist is applied and patterned to provide opening 164 for making contact via epi-island 68JJ and buried layer 70 to N-type base region 68 of lateral PNP transistor 63 (see FIG. 38). Precision alignment of opening 164 is not required since it may be made larger than epitaxial island 68JJ. Photoresist layer 162 together with field oxide 71 is used as an ion implant mask while, for example, phosphorus ions are implanted through opening 164 to form N+ region 166. Oxide layer 160 exposed in opening 164 acts as a screen oxide during the implantation. Generally, oxide 160 is comparatively thin, e.g., typically about 10–30 nanometers. Suitable phosphorous implant conditions are about 180 KeV energy and a dose of about $1 \times 10^{12} - 1 \times 10^{14}$ ions/cm$^{-2}$. The same implant can also be used, with an appropriate opening in the photoresist layer to enhance the contact of the collector contact epi-island 80 of the vertical NPN transistor, as has been previously described.

After implantation of region 166, photoresist layer 162 and thin oxide layer 160 are removed from the structure. The photoresist is removed by, for example, ashing in an oxygen plasma or by dissolution in a photoresist solvent. Thin oxide layer 160 is etched, for example, in a dilute buffered hydrofluoric acid solution. No masking steps are required.

Thereafter, the process steps are substantially the same as those used for the fabrication of a vertical NPN transistor, as has been previously described and so are only briefly mentioned here. The lateral PNP and vertical NPN devices may be fabricated simultaneously on different areas of a semiconductor die.

First polycrystalline silicon layer 84 is deposited over the surface of the structure and layer 86 of silicon nitride is deposited overlying polysilicon layer 84 (see FIG. 39). Boron is desirably ion implanted into poly layer 85 at an energy of, for example, about 70 KeV at a dose of about $1 \times 10^{16}$ cm$^{-2}$. Poly layer 84 will eventually provide contacts to the emitter and collector regions of the lateral PNP transistor as well as to the base of the vertical NPN transistor.

Second polycrystalline silicon layer 88 is deposited overlying nitride layer 86 (see FIG. 40). Layer 90 of silicon dioxide having a thickness of about 20–40 nanometers is formed, preferably by deposition, overlying second poly layer 88 to produce the structure illustrated in FIG. 40.

Photoresist layer 92 is applied to the surface of layer 90 and patterned with images which are a part of master mask 94". Where lateral and vertical devices are being fabricated simultaneously, master mask 94" for the lateral device is combined with master mask 94 for the vertical device (see FIGS. 4A–B), and of course the appropriate master mask pattern for any other devices being simultaneously fabricated. For the lateral PNP, master mask 94" includes emitter contact opening 165, collector contact opening 168, base contact opening 170, peripheral opening 169, and opening 171 positioned between the collector and emitter and overlying sensitive near surface region 158 therebetween in epi-island 68J. Openings 165 and 168 are analogous to openings 97, 98 of master mask 94, and opening 170 is analogous to opening 96. These openings serve the same function of defining device regions or contacts which are fabricated in the same way even though the regions or contacts formed thereby have different electrical functions in the vertical and lateral devices. Opening 169 extends laterally around the periphery of the lateral PNP and is analogous to peripheral opening 99 of the vertical NPN.

Using patterned photoresist 92 as a mask, oxide 90 and second polycrystalline silicon layer 88 are locally removed to selectively expose portions of nitride layer 86. The resulting structure, illustrated in FIG. 41, is analogous to the structure illustrated in FIGS. 4A–B for the vertical NPN. In the following steps collector contact area 168 and emitter contact area 165 of the lateral PNP are processed in the same way as base contact 97, 98 of the vertical NPN transistor, and base contact area 170 of the lateral PNP is processed in the same way as collector contact 96 of the vertical NPN.

As illustrated in FIG. 42, first block-out mask 100 is applied over the structure. As applied to the PNP transistor, first block-out mask 100 provides an opening to expose areas 169 outside the active device as well as opening 98A which encompasses opening 171 and is centered approximately over region 158 between collector 152A and emitter 154A. Using mask 100, oxide 90, and polysilicon 88 as etch masks, the exposed portion of nitride layer 86 in openings 169 and 171 is removed (see FIG. 42). Mask 100 and the remainder of oxide layer 90 are removed (see FIG. 43). The structure is now in condition for the oxidation of the exposed portions of polycrystalline silicon layers 84, 88 in the same manner as for the vertical NPN device.

The structure is conveniently subjected to high pressure oxidation to form oxide layers 104 and 106 from the oxidation of exposed polycrystalline silicon 88 and 84, respectively (see FIG. 44). The structure illustrated in FIG. 44 is analogous to the structure illustrated in FIG. 7 but with layer 86 still in place.

Following oxidation, the exposed portions of silicon nitride layer 86 are etched to expose further portions of poly layer 84 over collector contact region 168, emitter contact region 165, and base contact region 170 (see FIG. 45). Consistent with the vertical NPN process described above (see FIGS. 8A–B), second block-out mask 108″ is applied to protect collector contact opening 168 and emitter contact opening 165, but expose base contact opening 170. Mask 108″ may cover the entire device area except opening 170, as indicated by the dashed line in FIG. 45. As those of skill in the art will appreciate, a precision alignment is not required. Using photoresist layer 108″ together with oxide 104 and 106 as masks, polycrystalline silicon layer 84 is removed from the base contact area in opening 170 to expose region 166 of the underlying monocrystalline silicon epi layer 68 in island 68JJ, as illustrated in FIG. 45.

The base contact of the lateral PNP is now processed in the same way as the collector contact of the vertical NPN. The resist is stripped and thin screen oxide 110 is grown (FIG. 46) on exposed monocrystalline silicon region 166 of base contact opening 170. At the same time oxide 111 is grown on the surface of polycrystalline silicon layer 84 exposed over the collector and emitter contact regions in openings 168 and 265 and oxide 112 is grown on the edge of polycrystalline silicon layer 84 in opening 170. Dielectric layer 118 is then formed overlying thermal oxide 104, 106 to function as a liner in base contact opening 170 and to further isolate poly layer 84 from the base metallization, which will subsequently be formed. Silicon oxide and/or silicon nitride are suitable materials and are conveniently deposited by CVD although other methods and/or other dielectric materials may also be used. Poly layer 84, which will eventually be part of the emitter and collector contact of the lateral PNP, may laterally surround base contact opening 170.

Third layer 120L of, for example, polysilicon is then formed, preferably by CVD, overlying this structure (see FIG. 46). As has been previously described, poly layer 120L is anisotropically etched to remove all the poly layer except for the sidewall spacers 120. This structure, as illustrated in FIG. 47, corresponds to the analogous structure shown for the vertical NPN transistor in FIG. 14. The structure for teh emitter contact of the lateral PNP, for example, corresponds to the structure for the extrinsic base contact of the vertical NPN. The structure for the base contact of the lateral PNP corresponds to the collector contact of the vertical NPN. Fourth layer 126 of polycrystalline silicon and layer 128 of oxide are then deposited overlying the lateral PNP in the same way as for the vertical NPN. Poly layer 126 may be undoped or may be doped N-type.

As illustrated in FIG. 48, fifth block-out mask 134″ is applied on top of layers 126, 128 to protect the base contact area under opening 170 from etching. Mask 134″ is used to pattern underlying oxide 128 and that oxide is used, in turn, to pattern fourth poly layer 126. Polysilicon 126 is etched to expose underlying poly layer 84 in emitter and collector contact openings 165, 168. When poly layer 126 is undoped a further block-out mask (not shown) is used to protect emitter and collector contact areas 165, 168 while polysilicon 126 remaining in base contact area 170 is implanted with arsenic to enhance the base contact in region 166. The formation of a region of N-doped poly from layer 126 under opening 170 is analogous to the steps for forming regions of N-doped poly in the emitter and collector contact of the vertical NPN transistor and is preferably performed at the same time.

The final structure is illustrated in FIG. 49. This structure is achieved by depositing layer 137 of silicon nitride over the whole structure (not shown), such as was provided over the vertical NPN device (see FIGS. 17A–B and 18), and then forming a single contact opening, analogous to opening 135A in FIGS. 17A–B, through the nitride to simultaneously open contact windows, in the same manner as for the vertical NPN, to collector contact area 168, emitter contact area 165, and base contact area 170. A metal layer is deposited over the structure and into individual contact windows 165, 168, 170 as was done with the NPN transistor. The metal layer is patterned to form collector electrode 173, emitter electrode 174, and base electrode 175 (see FIG. 49). If desired, the metal mask and/or the patterned metal may be used as an etch mask to pattern the remaining part of polycrystalline silicon 126 exposed outside base contact 175.

The processing of the lateral PNP has been described briefly, without reference to specific processing steps since those process steps are equivalent to the processing steps for the vertical NPN. The steps need not be merely equivalent, they can be the identical steps, performed on two portions of the same semiconductor substrate at the same time. For example, the heat treatment steps as well as the double doping steps for the lateral PNP emitter and collector regions (equivalent to the base doping steps in the vertical NPN transistor) have not been described for the lateral PNP. Those of skill in the art will understand based on the description given for the vertical NPN how there are to be included if desired.

Figure 50:
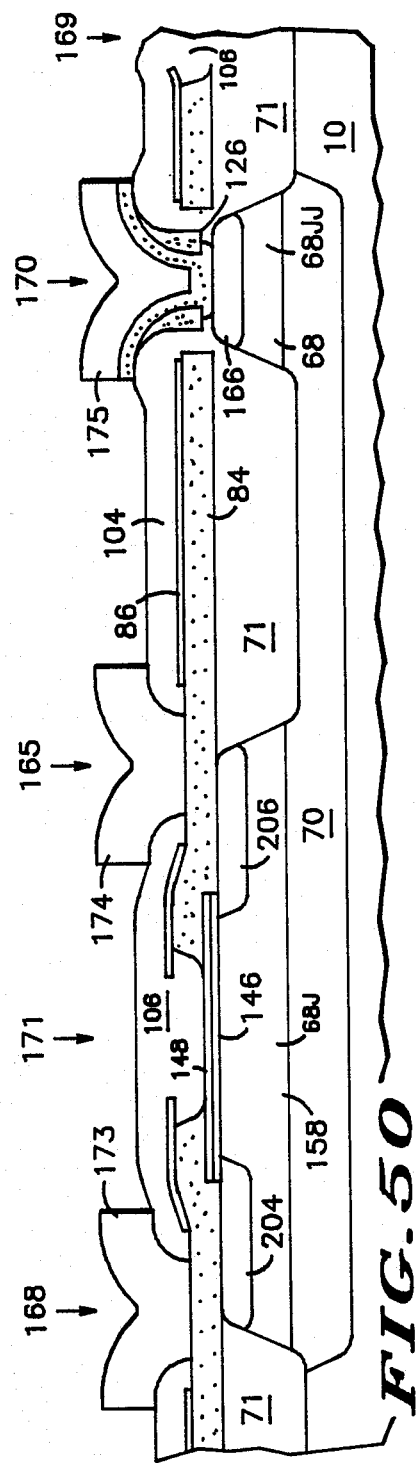

A further embodiment of a lateral PNP transistor, in accordance with the invention, is illustrated in FIG. 50. This device is similar to that illustrated in FIG. 49 and is processed in a similar manner except that the collector and emitter 204, 206, respectively, are formed by doping from first polycrystalline silicon layer 84 and not from the separate ion implantation of regions 152, 154 as in FIG. 36. Accordingly, the spacing between collector and emitter in this case is established by the width of mask 156 and oxide/nitride sandwich structure 146, 148 rather than by the width of mask 151 (see FIGS. 36–37). This allows mask 150, 151 to be eliminated as far as the lateral PNP is concerned.

Other lateral transistor variations include arranging the mask images so that layer 86 is not etched away under opening 171 as previously shown in FIG. 42. Rather, the region under opening 171 is handled in the same way as for an emitter contact in the vertical NPN; layer 84 is etched away, but etching stops at underlying regions 146, 148 which protect this portion of substrate 68 under opening 171 through the process, so that it is unaffected. Other variations are possible without departing from the basic process flow.

A lateral transistor may also be formed by combining the approach illustrated in FIGS. 30A–32B with the remote base contact provided in FIGS. 41–49. In this arrangement, a buried layer is provided extending from the epi-island in which the emitter and collector are to be formed to an adjacent epi-island in which the base contact is to be formed, as shown for example in FIG. 41. The emitter-collector epi-island is processed according to the arrangement taught in connection with FIGS. 30A–32B so as to produce dielectric region 106′ in the center of the active epi-island. Meanwhile, appropriate openings are included in the masks, in the same way as for the collector of the vertical NPN or the remote base of the lateral PNP to provide an enhanced N-type contact to the lateral base region via the adjacent epi-island and the buried layer. The emitter and collector are formed by out-diffusion of P-type dopant from doped first poly layer 84. The lateral base width is determined by gap width 95W (see FIG. 24B), taking into account any laterally outward movement of the edges of portions 84L and 84R at edges 5′ of gap 95′ due to lateral consumption of poly during oxidation and any laterally inward diffusion of dopant from poly regions 84L and 84R toward gap 95′ during formation of the emitter and collector. Persons of skill in the art will understand how to take such oxidation and dopant migration effects into account.

Lateral PNP devices constructed according to the method described above and having the structure illustrated in FIG. 49 were made with a base width of about 0.7–1.0 micron, base doping of about $4 \times 10^{16}/cm^3$, and length (perpendicular to the plane of FIG. 49) of about 3.5 microns. These devices exhibited gains as high as 60–70, but more typically 15–25, and $f_t$ values of 200–250 MHz. These $f_t$ results are about a factor of 5–10 improved over prior art lateral PNP devices.

By comparing the structures of the devices shown in FIGS. 23A and 49, it may be seen that the central base contact structure of FIGS. 23A–B provides a more compact device than the remote base contact structure of FIG. 49. The structures of FIGS. 23A–B and FIG. 49 which are made possible by the processes described in connection therewith have very significant advantages not readily obtainable with prior art methods and structures. For example, in order to obtain high $f_t$ lateral transistors, it is necessary for the emitter and collector to be very closely spaced and for the device to have very low parasitic capacitance. Lateral base widths of about a micron or less, and small device footprints are much desired. The present process allows lateral base widths of a micron or less to be formed. Further, with the configuration of FIGS. 23A–B, the above-described process permits base contact region 62 to be located between and aligned to emitter 66R and collector 66L, and properly spaced therefrom, even though the base width and base contact region 62 have widths in the micron to submicron range. No alignment step is needed between regions 66A–B and region 62 in FIGS. 23A–B or between regions 165, 168 and 170 in FIG. 49, since these regions are automatically self-aligned.

The provision of central base contact 62 in FIGS. 23A–B reduces parasitic base resistance and base-substrate capacitance as compared to the prior art and to the configuration of FIG. 49. With the arrangement of FIGS. 23A–B it is not necessary to provide contact to the base via a buried layer running under a portion of the field oxide to an adjacent epi-island as in FIG. 49.

The above-described arrangements provide a lateral transistor of smaller dimensions, lower base resistance, lower parasitic capacitance, higher gain, and higher $f_t$ than has previously been obtainable with lateral devices, and which may be conveniently fabricated in the same substrate using substantially the same process flow as for a vertical NPN and other devices discussed elsewhere.

VERTICAL PNP TRANSISTORS

A further device which can be made according to the present invention by substantially the same process for forming a vertical NPN and a lateral PNP in a P-type substrate and which is important to the implementation of high performance integrated circuits is a vertical PNP transistor. The implementation of a vertical PNP transistor in a P-type substrate makes possible the fabrication of high performance fully complementary bipolar integrated circuits. Vertical PNP transistors can have significant advantages over lateral PNP transistors. Those of skill in the art will understand that although the examples given here for purposes of explanation refer to PNP transistors formed in a P-type substrate that the same process applies to forming equivalent devices of opposite conductivity type in an N-type substrate by exchanging the various conductivity types.

FIGS. 51A–B illustrate the important elements of a vertical PNP transistor fabricated in accordance with the invention. FIG. 51A is a central cross-section through the vertical PNP and 51B is a composite top view of the structure of FIG. 51A. The structure is conveniently symmetrical about the centerline shown.

The vertical PNP includes P type emitter 208, N type base 210 and P+ collector region 212. Emitter 208 is contacted by doped polycrystalline silicon region 214 and, in turn, by emitter metallization 215. N+ contact 234 to base region 210 is contacted by doped polycrystalline silicon region 216 and, in turn, by base metallization 217. The active regions of the device are formed in island 282 while collector contact 208A, 212A is formed in separated island 280. Dielectric isolation 71 separates islands 282 and 280 and substantially laterally surrounds the device to isolated it from adjacent device. P+ region 212 extends between islands 282 and 280 to connect the collector region of the vertical device to collector contact metallization 219 via isolated portion 214A of poly layer 84.

It is desirable to provide tub 218 of N-type material surrounding P-tub 212 in order that the collector of the device be isolated from P-type substrate 10 by PN junction 218B. The inclusion of N type region 218, together with recessed field oxide 71, provides isolation for the vertical PNP device. Means for forming tubs of N-type material in a P substrate (or vice-versa) are well known in the art. Alternatively, tub 218 may be omitted and region 212 placed directly in the substrate. In this situation and with a P-type substrate, the collector of the vertical PNP is not isolated from the substrate. In order to prevent the vertical PNP from latching up due to SCR action, tub 218 is normally tied to a fixed potential. This is conveniently accomplished at a location (not shown) laterally outside the vertical PNP device represented here where tub 218 extends to the surface, using the same procedure already described for forming an N-type contact, as for example, analogous to the collector of the vertical NPN.

FIGS. 51A–B also show the location of openings 221–224 having perimeters 221′–225′ located in master mask 94" analogous to master mask 94 used in connection with the vertical NPN device. Mask opening 94" is optionally merely another part of mask 94. Openings 221-225 are denoted by the heavy lines and dashes in FIG. 51B, while the locations of tubs 212, 218 and islands 280, 282 are shown by lightly dashed lines. The device of FIG. 51B is conveniently symmetrical about the indicated centerline.

The fabrication of the vertical PNP transistor, in accordance with the invention, is similar to the process flow set forth above for the fabrication of a vertical NPN transistor. Accordingly, the process steps for fabricating the vertical PNP transistor, which are illustrated in FIGS. 52-59 are described only briefly, and for the case where an N-type tub is provided. The same numbers are used in these figures for elements which are also found in the process flow for the vertical NPN and lateral PNP transistors.

FIG. 52 illustrates, in cross-section, the structure of the vertical PNP transistor after the initial substrate preparation steps have been completed. The device illustrated is formed on P-type silicon substrate 10. N-type tub 218 is formed in substrate 10 by means well known in the art, for example, by a tub diffusion or by etch out and epi-refill or a combination thereof. Other means of providing tub 218 may also be used. Generally it is desirable for tub 218 to be more lightly doped than buried layer 70.

P+ region 212 is formed in tub 218, for example, by ion implantation. Region 212 serves as a collector of the vertical PNP transistor. The same implant can be used to provide enhanced localized isolation between vertical NPN structures formed on the same wafer by locating part of the P-type implant beneath recessed oxide 71 to serve as channel stoppers. After forming N-type tub 218 and P collector region 212 and N-type base region 210, P+ deep collector contact 212A is formed in or on P-type region 212 by any convenient means. Individual regions of the vertical PNP device are isolated by recessed field oxide 71 as has been previously described.

N-type region 210 may be formed in one step using, for example ion implantation through hole 209A in mask 209 (see FIG. 52) or may be formed in two steps by (i) first forming a very lightly doped N-type epitaxial region and (ii) using mask 209 and ion implantation to increase the N-type doping density in island 282. The N-type epitaxial layer may be formed simultaneously with or as a part of N-type epitaxial layer 68 used in conjunction with the vertical NPN and lateral PNP devices.

Phosphorus is a convenient N-type dopant for the implant step used to form vertical PNP base 210. The same implant may also be utilized to enhance the doping of the deep collector contact in epi-island 80 of the vertical NPN transistor and as a base contact enhancement for the remote base contact lateral transistor. It is desirable to tailor the phosphorus implant dose and energy to the values optimal for the base of the vertical PNP, since the requirements for the deep collector contact of the vertical NPN and base contact for the lateral PNP are less critical.

Referring now to FIG. 53, first polysilicon layer 84, silicon nitride layer 86, second polysilicon layer 88 and oxide layer 90 are formed on the surface of the substrate over regions 210, 212A and 71. These are the same layers as have been previously described in connection with the vertical NPN and lateral PNP. First poly layer 84 is doped P type with a shallow boron ion implantation. Master mask 94" shown in FIG. 51B is used to provide photoresist mask 92". This provides the basic footprint of the device, just as for the vertical NPN. Mask 92" is used, in turn, to pattern oxide layer 90 and second polycrystalline silicon layer 88.

As illustrated in FIGS. 51-53, master mask 94" defines emitter contact opening 220, base contact openings 221, 222, collector contact opening 224, gap 225, and peripheral opening 223. So far as the processing is concerned, these openings are analogous to those of the vertical NPN as follows: openings 221, 222 to opening 95, opening 220 to openings 97, 98, opening 224 also to openings 97, 98, and opening 223 to opening 99. Gap 225 is used to separate portion 214A of layer 84 under opening 224 from poriton 214 under opening 220.

Referring now to FIG. 54, first block-out mask 100" is used to permit removal of portions 86A of nitride layer 86 at periphery 223 of master mask 94", in the same manner as for the vertical NPN, and to remove portion 86A" in gap 225. The resulting structure is oxidized in the manner previously described to convert the exposed portions of first poly 84 and second poly 88 to oxide 106, 106' and 104 respectively as indicated in FIG. 55. Portions 86B of layer 86 exposed between oxide regions 104 are then removed. The procedure for this has already been described.

Second block-out mask 108" is then applied (FIG. 56) and used in conjunction with oxide 104, 106, 106' to permit the portions of first poly layer 84 exposed under openings 221, 222 to be etched away until region 210 is reached. This is analogous to FIG. 9. The process steps described in connection with FIGS. 10A and 12 are then followed to produce the structure shown in FIG. 57 where oxide regions 110, 111 and oxide layer 118 have been formed. The heating used in connection with the oxidation for forming oxide regions 110, 111 causes the boron dopant in layer 84 to diffuse into region 210 in island 282 and region 212A in island 280 thereby forming P-type emitter region 208 in island 282 and enhance P-type contact 208A in island 280.

Block-out mask 119" is then optionally applied as shown in FIG. 57 and ion implantation through openings 119A" used to provide enhanced P-doping in regions 228 in layer 84 under openings 220, 224. Block-out mask 119" is optionally merely another part of block-out mask 119 (see FIG. 11A) used to provide P-base region 64 of the vertical NPN. If it is not desired to provide this enhanced doping in these regions of the vertical PNP, then no openings are provided.

The structure of FIG. 57 is then processed in the same manner as has been described in connection with FIGS. 12-15 in order to produce the structure shown in FIG. 58. Consistent with the convention adopted in connection with the discussion of the vertical NPN process, the remaining oxide regions are designated collectively by the number 44. Fourth poly layer 126 with or without overlying oxide 128 is applied. Block-out mask 134", analogous to block-out mask 134 of FIG. 16A is applied to permit the portions of layer 126 except under openings 221 and 222 to be removed as has been previously described (see FIG. 17A), leaving portions 216 of layer 126 under openings 221, 222 (see FIG. 59).

As noted in connection with the vertical NPN, layer 126 may be uniformly doped N-type when deposited or thereafter since the portions which contact P-doped poly layer 84 are subsequently removed (see FIG. 59). Alternatively, layer 126 may be deposited undoped and a block-out mask provided over the exposed portions of layer 84 so that regions 216 of layer 126 may be N-doped, for example by ion implantation. Mask 232 in FIG. 59 illustrates how this may be done. In either case, when the structure of FIG. 59 is heated after doping, N+ base contacts 234 are fomed in region 210 under openings 221, 222. The doping of layer 126 may be performed at the same time and in substantially the same way as for the vertical NPN devices.

Layer 137 is then optionally applied and patterned in a manner analogous to the vertical NPN (see FIGS. 17A-18). Metallization is applied and patterned in the same way (see FIG. 18) to yield the structure of FIGS. 51A-B, with emitter contact metal 215, base contact metal 217, and collector contact metal 219.

To ensure low resistance at the vertical PNP collector contact, the collector contact region is desirably doped with the doping used for the vertical NPN base, the lateral PNP emitter and collector dopings, and any P type resistor doping. This is accomplished by including in the masks and layers which control introduction of the various P-type dopants, an opening encompassing island 280 in which the vertical PNP collector contact region is formed.

Vertical PNPN devices fabricated simultaneously with vertical NPN devices according to the method described herein were observed to have dc gains of 80-120 and $f_t$ values of 2-3 GHz. Such performance has never before been achieved under these circumstances.

Those of skill in the art will appreciate that the ability to make a vertical PNP simultaneously with a vertical NPN and/or a lateral PNP is of great utility, and that the vertical PNP performance obtained by the invented method and structure is highly desirable.

JETs, SITs, and MOSFETs

Other devices can also be made with a similar process flow and integrated into a common overall structure. For example, the process, in accordance with the invention, can also be used to fabricate a static induction transistor (SIT) or vertical JFET. The completed device is illustrated, in cross section, in FIG. 60. FIG. 60 is identical to FIG. 2 except that region 64 is omitted. The structure of FIG. 60 is formed by the same process used to form the structure of FIG. 2 except that blockout mask 119 (FIG. 11A-B) is modified to cover the portion of hte structure which would underlie master mask opening 95 so that region 64 is not formed.

For the vertical JFET/SIT, N+ region 62 forms the source of the device and N-epi region 68 with N+ buried layer 70 forms the drain (or vice-versa). Conduction through N-region 68 is modulated by the depletion regions formed around P-regions 66 which function as the gate of the JFET/SIT. The structure of FIG. 60 is able to function effectively as a SIT or vertical JFET because of the very small spacings which may be achieved between gate regions 66. Connection to the drain is achieved through buried layer 70 passing under the intervening isolation region 71 into epi-island 80 and thence to contact diffusion 124 and contact 72, 50. Conncetion to source 62 is via poly region 90 and metal 52. Connection to gate diffusion 66 is via poly region 84 and metal 53, 54.

A lateral JFET may be obtained from the structure illustrated in FIGS. 51A-B and formed by the same process described in connection with FIGS. 52-59. N+ regions 234—234 contacted by poly 216, 217 and metall 221, 222 serve as the source-drain of the device. N-type region 210 serves as the channel, and P+ regions 208 and 212 serve as upper and lower gates respectively. By suitably biasing regions 208, 212 with respect to region 210 the depletion regions extending from regions 208, 212 into region 210 will pinch off majority carrier conduction between N+ contacts 234—234. The arrangement of the device of FIGS. 51A-B lends itself conveniently to such usage as a lateral JFET because of separated, isolated, double base contacts 217, 216, 234 created under openings 221 and 222 are available to function as independent source-drain connections, and because self-aligned gate region and contact 208, 214, 215 created under opening 220 extends over all of single crystal semiconductor island 282 between source-drain regions 234.

In the foregoing description of various embodiments, connection to device regions has been made through doped polycrystalline silicon which contacts the monocrystalline silicon substrate. These contacts may be ohmic or rectifying.

Figure 61:
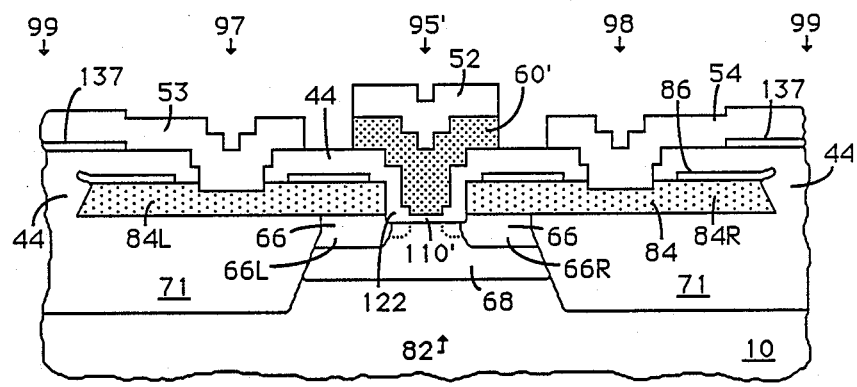

MOSFETs may also be readily prepared using the method and arrangement of the present invention. FIG. 61 is a cross-section similar to that shown in FIG. 23B and produced by substantially the same process described in connection with FIGS. 23A-35B. FIG. 61 differs from FIG. 23B in that oxide 110' or equivalent has been left in place under opening 95' to act as the gate dielectric of a MOSFET. In FIG. 61 poly electrode 60', which is otherwise analogous to poly electrode 60 of FIGS. 23A-B, is formed on thin oxide 110' and acts as the insulated gate of the field effect device. N+ diffused contact 62 does not form because of the presence of dielectric 110'. Regions 66L, 66R and portions 84L, 84R and 53, 54 now serve as source-drain regions and contacts of the MOSFET. Buried layer 70 is ont necessary and has been omited from the structure of FIG. 61. Region 68 in which the MOSFET channel is formed is isolated from substrate 10 by the PN junction between N region 68 and P substrate 10. However, where it is desired to control the potential of region 68 below the channel, e.g., where a particular back gate bias is desired, then a buried layer region may be provided and connected to another epi-island for external contact, e.g., via a buried layer 70 to a further epi-island 80, in a manner analogous to the structure shown in FIGS. 1-2 or 60. Those of skill in the art will understand that P-type substrate 10 is not essential to the operation of the device and that it could be built directly on an N-type substrate.

While dielectric 110 formed as described in connection with the vertical NPN or lateral PNP may be left in place to serve as gate dielectric 110', it is more desirable to regrow or deposit a dielectric particularly formed for that purpose. Such dielectric is conveniently formed after the stage of processing illustrated in FIG. 14.

Figure 62:
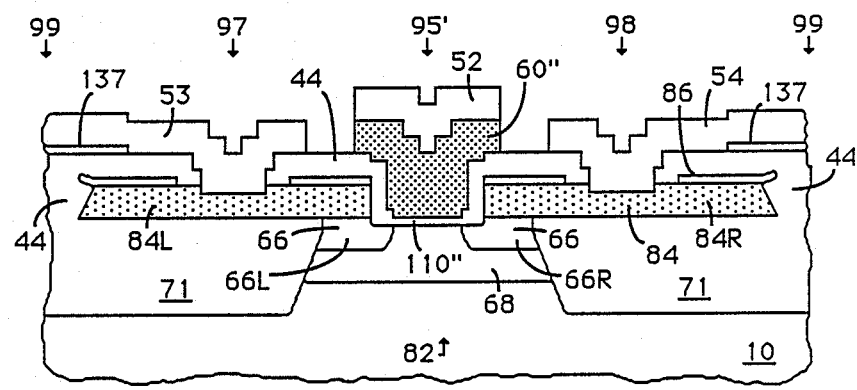

A disadvantage of the MOSFET structure of FIG. 61 is that gate 60' may not extend completely between source-drain 66, 66. This can adversely affect the MOSFET characteristics under some circumstances. Whether there is a gap between the channel and the source-drain may depend on whether oxide 110 was initially doped in this device location and whether there was substantial undercutting of oxide 110 during etch and regrowth of oxide 110'. If there was no undercutting, then out-diffusion into region 68 from residual doped oxide portions 122 (see FIG. 14) will extend source-drain regions 66 substantially to the edges of the channel formed under gate 60'. This is indicated by the dotted lines extending from regions 66 in FIG. 61.

another embodiment of the MOSFET process is shown in FIG. 62. FIG. 62 is a schematic cross-section substantially similar to that of FIG. 61 except that the process has been modified to widen opening 95' in layer 84 after regions 66 have been formed. This is conveniently accomplished at the processing stage represented by FIG. 10A where regions 66 have been formed and thin oxides 110-112 grown, but without mask 113. (Mask 113 and implant 124 are not utilized in forming the JFET or MOSFET.) An implant may be used to adjust the threshold or produce a normally on MOSFET. Procedures for such implants are well known in the art.

A block-out mask is provided to cover the rest of the circuit except the particular island 82 where the MOSFET is to be formed. Oxides 110 and 112 are removed by, for example a quick dip etch, leaving oxide 104 substantially in place. The edges of poly layer 84 thereby exposed in opening 95, 95' are then laterally etched back by a predetermined distance. This distance should be sufficient to bring the edges of diffusions 66 under the edges of later deposited poly region 60' (see FIG. 62). Some etching of the substrate will also occur, but will be less than the etching of layer 84, since poly tends to etch at a higher rate than single crystal material. After the lateral etch-back, the exposed silicon can be reoxidized if desired to replace oxides 112 and 110 in the etched region. Regrown oxide 110" analogous to oxide 110' of FIG. 61 is shown in FIG. 62. The process then resumes as before with the deposition of conformal oxide 118. The gate dielectric is formed as already described in connection with FIG. 61. The result of this embodiment of the process is to produce the structure illustrated in FIG. 62 wherein poly gate electrode 60", otherwise analogous to gate 60', now extends laterally to or over the edges of source-drain regions 66.

Note that gates 60', 60" are self aligned with respect to source drain regions 66L, 66R and source drain electrodes 84L, 84R and 53, 54. This is a particular feature of the present invention. Those of skill in the art will also appreciate that the planarization techniques shown in FIGS. 19-22 are also applicable to the structures described above.

DISCRETE DEVICES

Figure 63B:
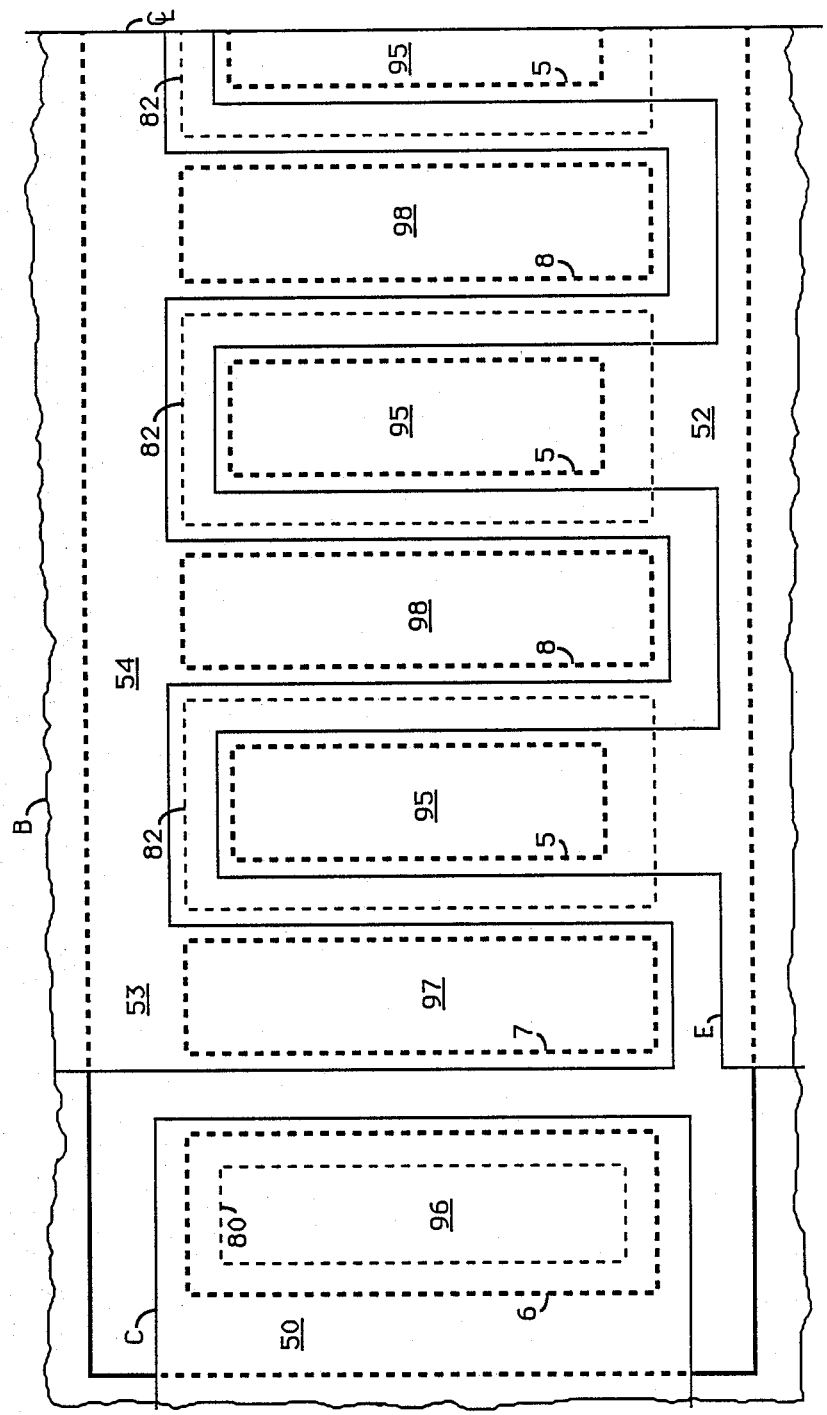

The foregoing description has been directed to an improved integrated circuit structure and steps for the fabrication thereof. Those steps can be also used, however, for the fabrication of discrete transistors. For example, a discrete vertical NPN transistor having a collector contact on both the front surface and back surface of the semiconductor substrate is illustrated in FIGS. 63A-B. The illustrated discrete transistor is fabricated on heavily doped N-type substrate 177 having overlying N-type epitaxial layer 68 which may have the same or different properties than already described in connection with the vertical NPN formed on P-type substrate 10. N-type epitaxial layer 68 forms the active collector of the transistor while heavily doped substrate 177 provides a low resistance path between collector 68 and collector electrode 181 located on the back of the substrate.

The device of FIGS. 63A-B is similar to that of FIGS. 1-2 except that the emitter-base structure has been repeated many times in order to increase the emitter-base periphery and the emitter areas, as are often desired for discrete devices. As many sections as are needed may be used. Except for the difference in starting substrate and the number of emitter-base sections, the device of FIGS. 63A-B is constructed by substantially the same process used for the vertical NPN and already described in connection with FIGS. 1-22. Similar numbers are used in FIGS. 63A-B to identify elements of the device consistent with the numbering of elements in the description of the vertical NPN integrated circuit transistor. Individual process steps have not been explained here since they are substantially identical to those described previously.

To illustrate the capability of the invented process and arrangement, a front surface collector contact has been provided under opening 96. Those of skill in the art will recognize that this may be preferable where the device is to be used in an IC, but can be omitted entirely if a device having only a back surface collector contact is desired, or both may be provided, as where it is desired to have a portion of the collector current available on the front surface and a portion on the back surface.

It will also be apparent, that the multiple emitter structure illustrated in FIGS. 63A-B could likewise be built in a P-type substrate similar to substrate 10 by providing a buried layer analogous to buried layer 70 extending underneath the emitter-base regions to collector island 80.

Those of skill in the art will also appreciate that the devices illustrated in FIGS. 23A-B, 50 51A-B, 60-62 and elsewhere herein could also be fabricated in discrete form by making an analogous substitution for the substrate and omitting the top contact collector, drain or gate as desired.

INTEGRATED RESISTORS

Figure 64A:
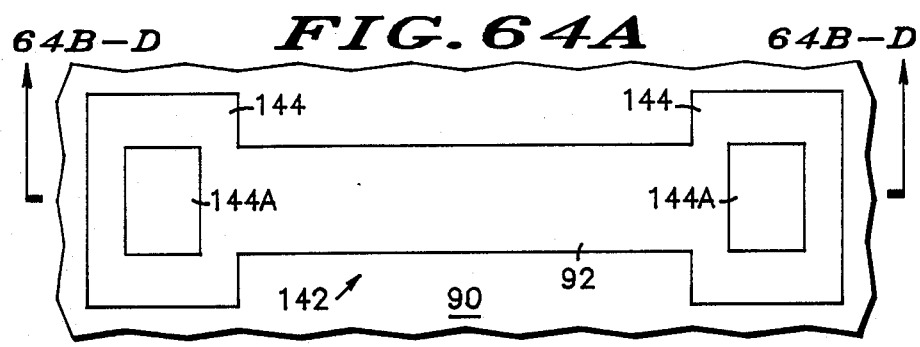
FIGS. 64A–D show an integrated resistor fabricated according to another embodiment of the invention.

In a further embodiment of the invention, polysilicon resistors may be formed from the same layer 84 used for making base contacts to vertical devices, or emitter and collector contacts to lateral devices, or for other purposes described herein. For convenience such resistors will be referred to as base resistors even though they need not be in series with the base leads, although as those of skill in the art will appreciate, that is easily achieved. Base resistors are generally formed without additional process steps, by following a similar procedure to that used for the above-described vertical NPN transistor. More specifically, the resistor is formed by adding patterns to existing mask layers, but without requiring any additional masking or other processing steps. FIG. 64A illustrates a composite mask used in the fabrication of simple "dog-bone" shaped base resistor 142, including central portion 142A of the shape and size to provide the desired resistance, and contact regions 144 at each end for providing electrical contact. Other shapes, of course, can be implemented to achieve the desired resistance value and fit into the available space. For example, central portion 142A may have a folded shape to permit a long resistor to be located in a compact area. Such variations are well known in the art.

Figure 64B:
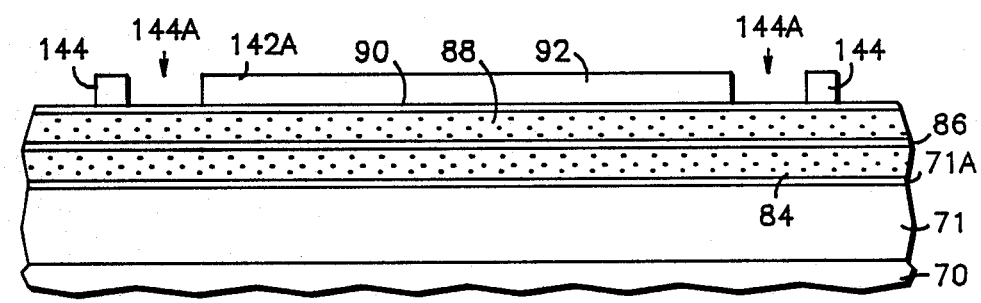
Figure 64C:
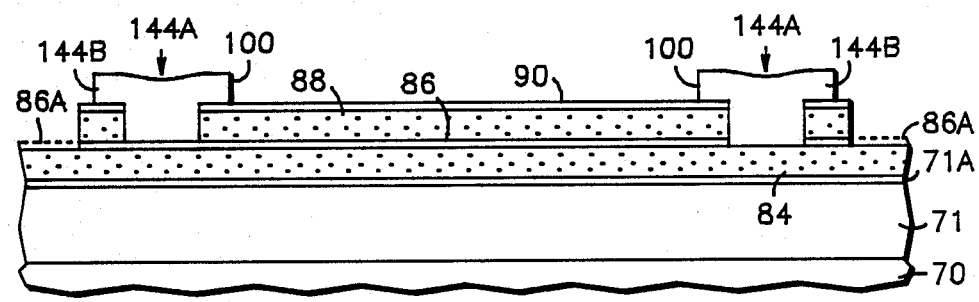
Figure 64D:
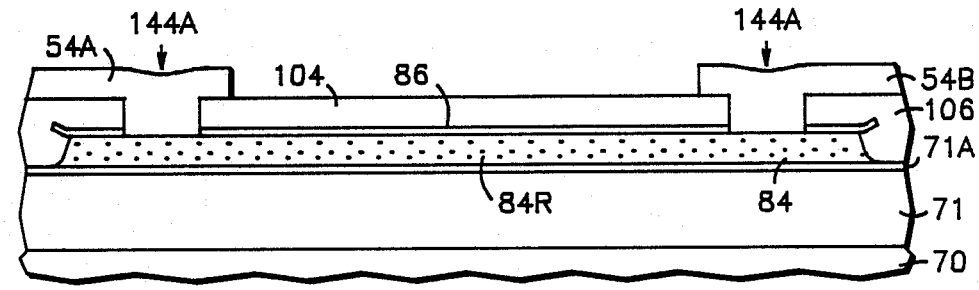

FIGS. 64B-D show cross-sections through FIG. 64A at different stages of fabrication. The same identifying numbers are used in FIGS. 64A-C to refer to the same layers or portions thereof already described in connection with the fabrication of the vertical NPN device. The desired shape of dog-bone resistor 142 is conveniently included on master mask 94, described in connection with FIGS. 4A-B, and results in photoresist 92 being left over the desired resistor region. The photoresist is used to pattern underlying oxide 90 and second poly layer 88 to expose underlying silicon nitride 86 outside dog-bone 142 and in holes 144A. The resulting structure, illustrated in cross-section in FIG. 64B, corresponds to that found in FIGS. 4A–B. Base resistor 142 is formed in layer 84 overlying a part of field oxide region 71. An optional initial nitride layer 71A may be provided between field oxide 71 and first polysilicon layer 84, but this is not essential. Its use is illustrated in FIGS. 64B–D.

Contact block-out areas 144B for polycrystalline silicon base resistor 142 are included as part of the first block-out mask 100. Portions 144B substantially cover resistor contact areas 144 including holes 144A at each end of resistor 142 as illustrated in FIG. 64C. Using portions 144B of block-out mask 100 and remaining portions of layer 88 and 90 as etch masks, those portions 86A of silicon nitride layer 86 which are not covered by photoresist or by polycrystalline silicon 88 and oxide 90 are removed. The resulting structure illustrated in FIG. 64C is achieved at the same time as the structure illustrated in FIGS. 5A–B and 6.

Following the same steps as for the vertical NPN transistor described in connection with FIG. 6, the portion of polycrystalline silicon 88 on dog-bone 142 and the portion of polysilicon 84 outside of dog-bone 142 are coverted to oxide e.g., by thermal oxidation, to form isolated region 84R of polycrystalline silicon layer 84 of the desired size and shape. Block-out mask portions 144B are removed prior to oxidation. The portion of nitride layer 86 exposed in the bottom of holes 144A protects the underlying portion of poly layer 84 during oxidation.

Region 84R of layer 84 may be doped at the same time as the portions of layer 84 used to form the base contact region as has been previously described in connection with the vertical NPN device, or may be left undoped if high resistance is desired, or may be separately doped using a further block-out mask. Doping with boron to a resistivity of about 100 ohms per square with the same ion implantation used to dope base contact polysrystalline silicon 84 is convenient.

Following oxidation, the nitride in the bottom of holes 144A is etched away and contacts made to resistor 142 in the same way as to the base contact layer 84 of the vertical NPN transistor (e.g. see FIGS. 18–22). Metal contact 54A–B are provided in the same manner and at the same time as contacts 50–54, and routed in an appropriate manner to accomplish the desired interconnections. The resulting structure is illustrated in FIG. 64D. As those of skill in the art will appreciate, resistor 142 may be connected in series with any circuit element. Because it is made in layer 84, it may be conveniently made a part of any device contact formed from layer 84 without need for a metal interconnection.

Throughout the processing, doped polycrystalline silicon layer 84 is covered by layer 86 of silicon nitride. Layer 86 minimizes segregation of boron from doped silicon layer 84. The value of resistor 142, therefore, may be accurately controlled since little or no correction need be made for dopant depletion from the top surface of polysilicon layer 84. If the bottom surface of resistor 142 rests directly on field oxide 74, then some depletion of boron from polysilicon 84 into field oxide 71 can occur. In a further embodiment of the invention this depletion into oxide 71 is avoided and the value of resistor 142 is more closely controlled by first depositing layer 71A of silicon nitride overlying field oxide 71. Layer 71A of silicon nitride may be patterned prior to the deposition of polycrystalline silicon layer 84 to remove those poritons of nitride layer 74A overlying the active transistor areas, if that is desired. Layer 71A may be the same nitride layer as layer 148 used in connection with FIGS. 36–50. It is desirable to use nitride layer 71A generally over isolation oxide 71 to block migration of mobile species.

POLY DIODES

In accordance with a further embodiment of the invention, very fast switching diodes can be fabricated and integrated with other circuit devices by forming a PN junction between P doped first layer 84 of polysilicon and the N doped fourth layer 126 of polysilicon. The resulting poly-poly diode exhibits extremely fast switching speed and, if fabricated over field oxide 71, very low parasitic capacitance. Fabricating the poly diode over the field oxide also isolates it from the semiconductor substrate.

Poly diodes are formed by providing a region of N+ poly layer 126 in contact with a region of P-type poly layer 84 and then heating the sandwich to form a PN junction therein. Such a structure would occur, for example, if N-doped poly 126 were left in contact with P-doped poly 84 under arrows 97, 98 in FIG. 20 and the structure heated. Thus, it will be apparent to those of skill in the art that the invented process and arrangement make it easy to obtain poly diodes.

Two poly diodes D1, D2 are illustrated in FIG. 65. In the left half of FIG. 65 is poly diode D2 constructed in an isolated island of poly 84, and in the right half is poly diode D1 constructed in a portion of poly 84 which forms a base contact for a vertical NPN transistor of the sort already described. At the extreme right of FIG. 65 is a portion of the emitter structure formed under opening 95, exactly as for the vertical NPN, with extrinsic base 66 and base contact poriton 84BC of layer 84 connected thereto. PN junction 126J1 of poly diode D1 is provided in portion 84BC by providing portion 126D1 of N+ layer 126 in contact with portion 84BC under opening 98D1 and heating. Second poly diode D2 is constructed in isolated portion 84I of layer 84 at the left, by providing second portion 126D2 of layer 126 in contact thereto and heating to form junction 126J2, usually at the same time as junction 126J1. Metallization 54I is used to tie the two diodes together in series, if desired, and metallization 54J connects to other portions of the circuit.

Figure 66:
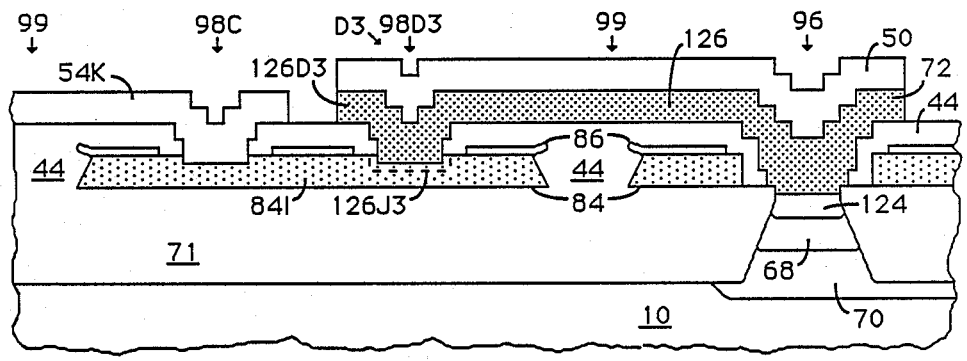

FIG. 66 illustrates third poly diode D3 having junction 126J3 formed in isolated poly island 84I under opening 98D3. Poly diode D3 is connected by portion 72 of poly layer 126 and optional overlying metal 50 to collector contact 124 under opening 96 at the right of the figure. Lead 54K connects the other terminal od diode D3 to the rest of the circuit. Collectors series diodes are much used in integrated circuits.

Master mask openings 98D1, 98D2, 98D3, and 98C are analogous in function to opening 98 already described in connection with the vertical NPN (see FIGS. 1–22), except that the process step shown in FIGS. 16A–B is modified to leave portions 126D1, 126D2 and 126D3 of layer 126 under openings 98D1, 98D2 and 98D3, respectively. Openings 95, 96 and 99 have the same function as previously described. Since many of the steps for forming such diodes are common to procedures which have already been described, the process is only briefly summarized here.

In order to obtain the sturcture of FIG. 65, an additional area of field oxide is provided as a site for poly diode D2, D3 and the masks modified to provide the appropriate portions of poly layers 84 and 126 during the process for poly diodes D1-D3. For example, the master mask described in connection with FIGS. 1-2 and 4A-B, is modified to have an additional portion extending over the additional field oxide region and have openings 98C and 98D2, 98D3 therein analogous to openings 97, 98. This additional mask portion is isolated by providing surrounding opening 99. The portion of layer 84 under opening 99 around the diode is oxidized so that isolated region 84I of polycrystalline silicon layer 84 is formed for diode D2, D3. To form diode D1 in, for example, the base contact portion 84BC of a device, an opening 98D1 analogous to openings 97, 98 is provided in the master mask.

The block-out masking step illustrated in FIGS. 16A-B is then modified to leave portions 126D1, 126D2, 126D3 under openings 98D1, 98D2, 126D3 and the structure heated to form PN junctions 126J1, 126J2, 126J3. Except for the variation in the master mask and the fifth block-out mask of FIGS. 16A-B, the process is substantially the same as for the vertical NPN previously described with the metal-poly contact formed under opening 98C being the same as the metal-semiconductor contact formed under openings 97, 98 of the vertical NPN process. PN junctions 126J1, 126J2, 126J3 form near the interface between the portions of layers 84 and 126 set aside to provide the diodes. The PN junction will be located just below the surface of the more lightly doped layer, typically in layer 84.

Test diodes made according to the above-described method and having a structure similar to that illustrated at the left in FIG. 65 exhibited excellent stable electrical characteristics and I-V curves more suited to typical circuit applications than are integrated diodes fabricated in the single crystal material in the conventional IC fashion by shorting together two of the three terminals of an integrated transistor. In particular, it has been observed that the slope of the Log I versus V characteristic is approximately half that obtained from conventional IC diode equivalents. This is advantageous because a single poly diode fabricated according to the present invention provides twice the incremental voltage drop of conventional diode for the same incremenrtal current. Thus, one poly diode serves in place of two conventional diodes in most circuit applications. This reduces the chip area required to implement a given circuit function and provides an important saving in cost and improvement in performance.

INTEGRATED JUNCTION CAPACITORS

A small area junction capacitor is often implemented in integrated circuit structures by fabricating an NPN transistor, shorting together the collector and emitter of that transistor and then separately contacting the base. The capacitance of the device is then the parallel combination of the base-emitter and base-collector junction capacitance. Such a device is implemented, in accordance with the invention, by shorting together the collector and emitter of, for example, an NPN transistor by a continuous electrode formed from fourth layer 126 of poly silicon. One simple way of accomplishing this with the transistor configuration of FIGS. 1-2 is to omit opening 97 extending to layer 84 and then pattern layer 126 so that it bridges between emitter opening 95 and collector opening 96. This shorts the emitter and collector of that individual device. Contact is still made to the base through opening 98. No rerouting of the metal stripes is required. The layer of silicon nitride passivation 137 then overlays the device with an opening to allow contact to the base of the capacitor structure and to one portion of the shorted together collector and emitter combination. Unrelated metallization (e.g., base lead 53 in FIG. 1) can be routed over the silicon nitride so that little surface area on the integrated structure is used for implementing the capacitor. Other topological arrangements are also possible, such as for example, omitting opening 97 entirely and moving collector opening 96 to the right in FIGS. 1-2 toward emitter opening 95 so that less total area is occupied.

COLLECTOR CONTACT VARIATIONS

While the vertcial NPN transistor and analogous structures described herein have substantially advantages over the prior art, both in terms of performance and ease of manufacture, the collector contact structure is surrounded by a portion of layer 84 that is also used for making electrical contact to the base. Collector contact 72 is electrically insulated from base contact poly region 84 by oxide 44. This arrangement (shown in FIGS. 1-2) provides the smallest pitch between emitter, base and collector contacts. Under some circumstances it may be desirable to be able to separate the collector contact more completely from the portion of poly layer 84 used for the base contact. This may be accomplished in a number of different ways explained below. For purposes of simplicity, the explanation given here is in terms of a collector contact to a vertical NPN device. However, those of skill in the art will appreciate that the processes and arrangements described apply to any device or device structure where contact is being made to an underlying substrate region insulated from poly layer 84.

Many of the mask shapes and fabrication steps are the same. The same identifying numbers are used to refer to equivalent regions or layers. Only the differences in mask shapes or process steps are described in any detail. The objective of all of the variations described below is to either eliminate the portion of poly layer 84 which surrounds the collector contact or else physically and electrically separate it from the portion of poly layer 84 used for the base contact or equivalent. The various figures showing partially or completely finished devices according to these embodiments illustrate the use of the contact planarization methods described elesewhere. However, this is not essential to these embodiments.

A first embodiment for separating the portion of poly layer 84 around the collector contact is shown in FIGS. 67A-B. FIG. 67A is a schematic cross-section of a finished vertical NPN transistor similar to that shown in FIG. 2 but with portion 842 of layer 84 around collector contact 72 separated from portion 841 of layer 84 used for contacting base region 64, 66. FIG. 67B is a top view similar to FIG. 4B showing master mask 941 and block out mask 1001 used to produce the structure of FIG. 67A.

As compared to master mask 94 in FIG. 4B, master mask 941 has additional opening 99G in the form of a slot which separates portion 9Y of master mask 941 containing emitter and base contact openings 95, 97, 98 from portion 9X containing collector contact opening 96. First block-out mask 1001 is also divided into two parts as shown in FIG. 67B. When the structure is processed according to the steps described in connection with FIGS. 3–22, but with masks 941 and 1001 instead of masks 94 and 100, additional oxide region 1060 is formed between portions 841 and 842 of layer 84. Portion 842 around collector contact 72 is entirely above field oxide 71 and is physically and electrically separated from portion 841 used for the base contact. Thus, the desired objective is achieved.

It will be noted that no additional masking steps are required and that the self-aligned nature of the emitter, base, and collector contacts is still preserved.

Figure 68B:
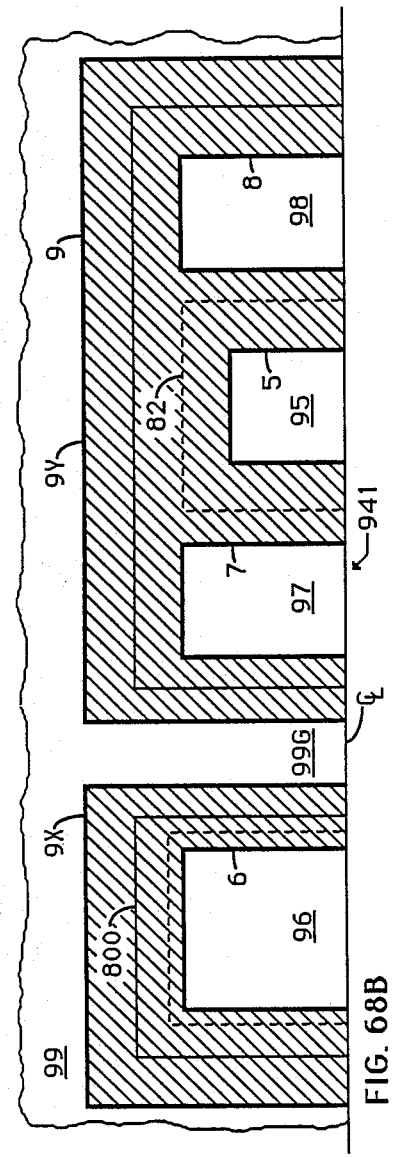
Figure 72A:
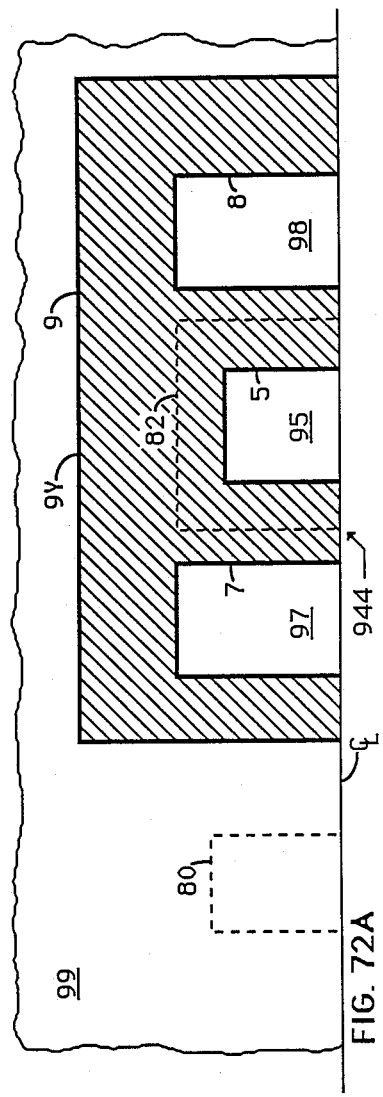

A second embodiment for isolating portion 842 of layer 84 around collector contact 72 under opening 96 from portion 841 of layer 84 in contact with base 64, 66 is shown in FIGS. 68A–B. FIGS. 68A–B are very similar to FIGS. 67A–B except that collector contact epi-island 800 in FIGS. 68A–B is larger than opening 96 in master mask 941, whereas in FIGS. 67A–B, collector contact epi-island 80 was smaller than opening 96. Opening 99G is also used in FIGS. 68A–B to create oxide region 1060 separating 841 and 842.

Because epi-island 800 is larger than opening 96 (FIGS. 68A–B), P-type portions 661 form in N-type epi-island 800 around collector contact 72. This is not harmful, since N-region 68 in epi-island 800 has been reinforced in conductivity by several diffusions during fabrication of the finished device. For example, deep N+ implant 124 was provided (see FIGS. 10A–B) in the collector contact epi-island. As those of skill in the art will understand, during the course of subsequent heat treatments, this deep implant will spread out as indicated by arrows 124A until region 124 intersects buried layer 70, as shown in FIG. 68A. Further, N+ region 621 is also formed in the collector epi-island by diffusion from layer 126 at the same time that emitter region 62 is being formed in the emitter epi-island. For simplicity these details have been omitted from the other process cross-sections shown herein. Poly region 841 is isolated from poly region 842 by oxide 1060. Accordingly, the objective of isolating the first level poly surrounding the collector contact has been achieved and the presence of the additional PN junctions in collector contact epi-island 800 is not deleterious. As with the process and structure of FIGS. 67A–B, the self-aligned feature is preserved and no additional masking steps are needed.

Figure 69A:
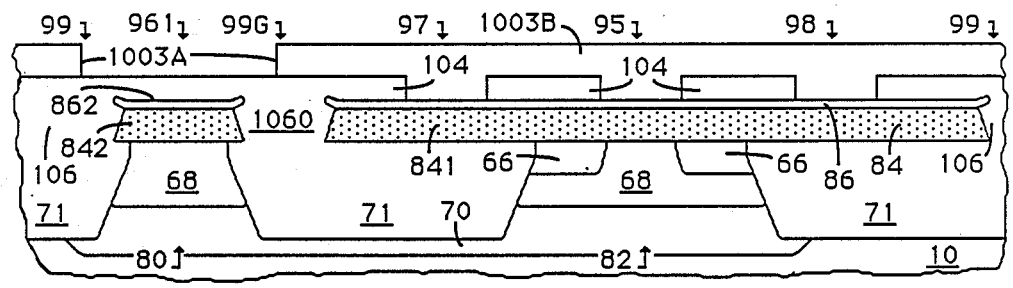
Figure 69B:
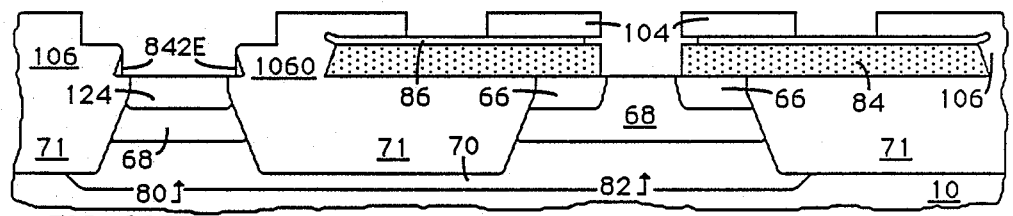

A third embodiment for providing a collector contact is illustrated in FIGS. 69A–C and 70A–B. FIGS. 69A–B are schematic cross-sections similar to those illustrated in FIGS. 3–18, but corresponding to the particular steps which are modified, and FIGS. 70A–B show the associated masks. FIG. 69A corresponds approximately to the stage of manufacture shown in FIG. 7 but with portions 86B of nitride layer 86 still in place. The structure of FIG. 69A has been produced by use of master mask 943 and first block-out mask 1003 of FIG. 70A. Portion 9Y of master mask 943 is substantially the same as in FIGS. 67A'B and 68A–B with openings 95, 97, 98 and epi-island 82 as before. However, the portion of master mask 942 over collector contact epi-island 80 is different. Rather than having opening 96 as has been used previously, solid mask portion 961 extending slightly beyond epi-island 80 is provided for portion 9X of master mask 943. First block-out mask 1003 need only lie within portion 9Y as shown in FIG. 70A.

Figure 69C:
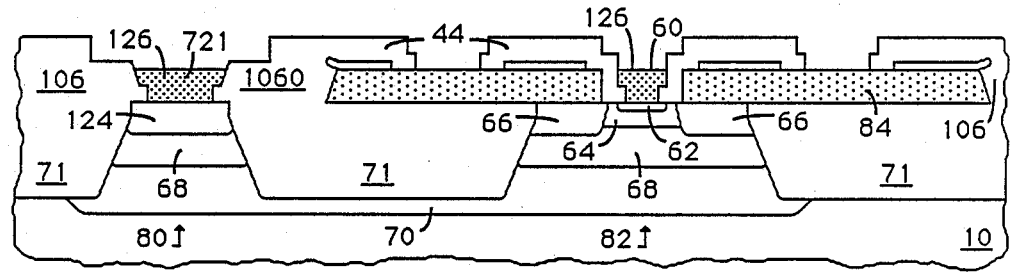

When the structure exposed to master mask 943 and first block-out mask 1003 is processed as explained in connection with FIGS. 3–7, the structure of FIG. 69A results. Additional block-out mask 1003B having opening 1003A is then applied as shown in FIGS. 69B and 70B and the structure etched to remove the portion of oxide region 104 underlying opening 1003A. Mask 1003B may then be removed and the regular process picked up at the step of FIG. 8A with the removal of the exposed portions of layer 86, including portion 862. FIG. 69B corresponds to the stage shown in FIG. 9 where poly layer 84 has been removed over the emitter and collector contact regions. Selective anisotropic etching is convenient and leaves fragments 842E of region 842. These disappear when the structure is oxidized as in connection with the step illustrated in FIG. 10A. FIG. 69C shows the result corresponding to the stage of processing just before metallization. It can be seen that collector contact 721 formed from fourth poly layer 126 is completely surrounded by oxide. No portions of first poly layer 84 are left around the collector contact.

It will be noted that the third embodiment preserves the self-alignment feature, but that an additional block-out mask is required. The portion of first poly layer 84 surrounding the collector contact is completely eliminated.

Figure 71A:
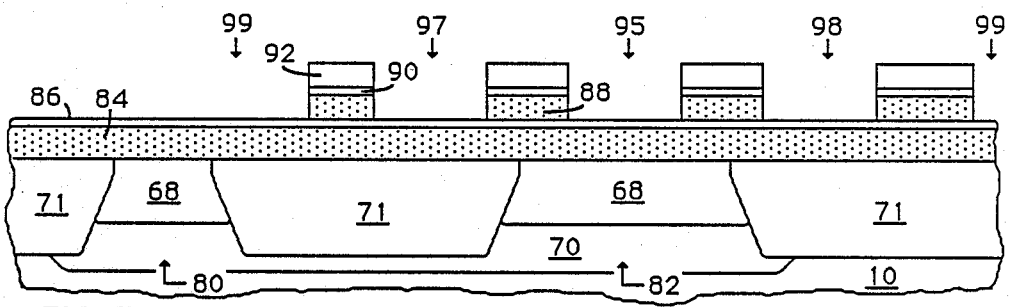
Figure 71B:
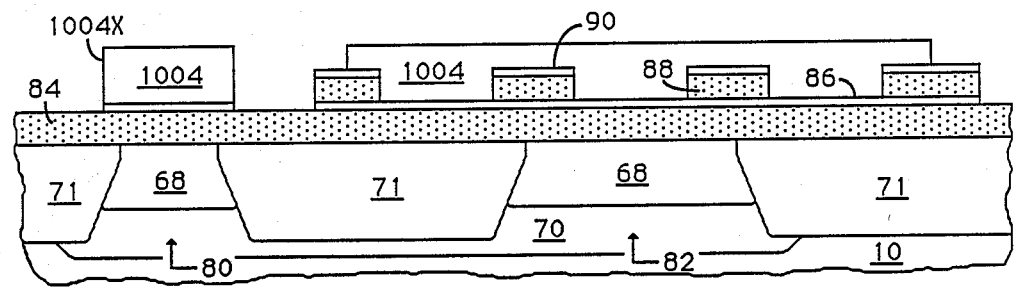
Figure 71C:
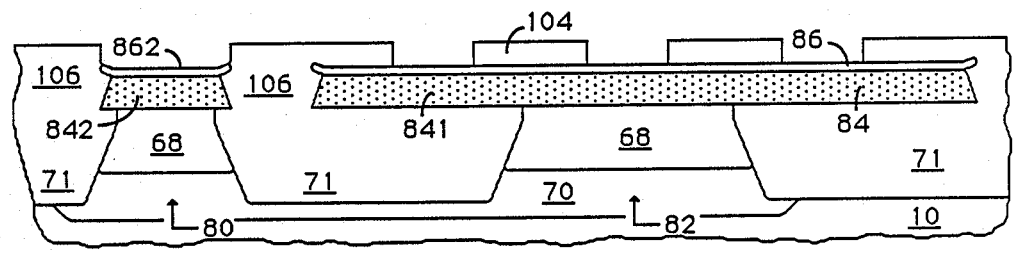

A fourth embodiment for providing a collector contact is illustrated in FIGS. 71A–D and 72A–C. FIGS. 71A–D are cross-sections analogous to FIGS. 69A–C and FIGS. 72A–C are masks analogous to FIGS. 70 A–B. FIG. 71A shows the device at the stage corresponding to FIG. 4A but having been processed with master mask 944 of FIG. 72A. Portion 9Y is as was used in connection with FIGS. 69A–B and 70A–B. However, there is no portion of mastermask 944 over collector contact epi-island 80. First block-out mask 1004 is then applied in a manner analogous to FIG. 5A, but with the shape shown in FIGS. 71B, 72B. Portion 1004X is located over collector contact epi-island 80. The previously described etching and oxidation procedure is followed with the result shown in FIG. 71C.

Figure 71D:
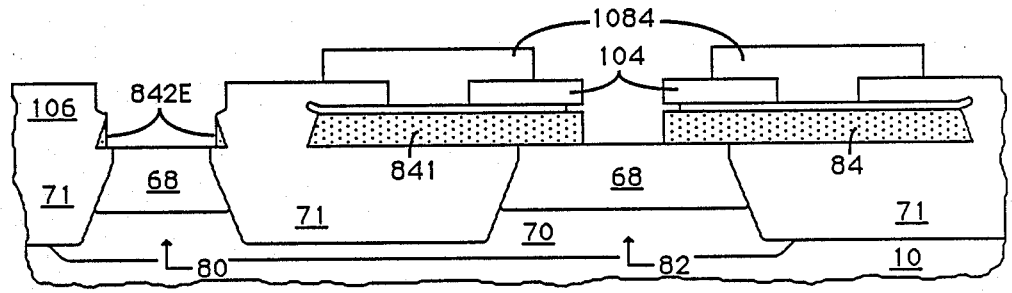

Second block-out mask 1084, analogous to mask 108 in FIG. 8A is applied as shown in FIGS. 71D and 72C with the result shown therein. At this stage the structure picks up the process after FIG. 8A as previously described. Fragments 842E which may be left in the hole etched under the location of mask portion 1004X disappear during surface oxidation to form oxides regions 110–112, as already described. It will be noted that the cross-section in FIG. 71D has substantially the same appearance as the cross-section in FIG. 69B. Accordingly, when the structure of FIG. 71D is completed to a point just before metallization it will have substantially the same appearance as FIG. 69C.

The result is a structure wherein the portions of poly layer 84 surrounding the collector contact have been eliminated. Note that no additional masks are needed. However, only the emitter and base portion remains self-aligned from the master mask. The self-alignment of the collector contact to the emitter-base contacts is lost. However, alignment of the collector contact is less critical, since it is essentially localized by epi-island 80.

Figure 73A:
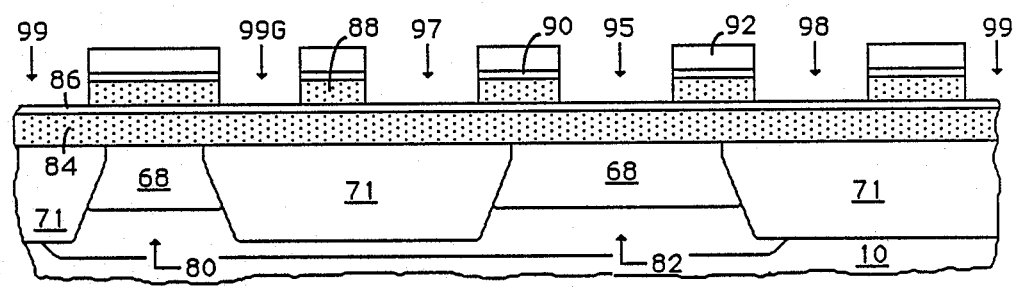
Figure 73B:
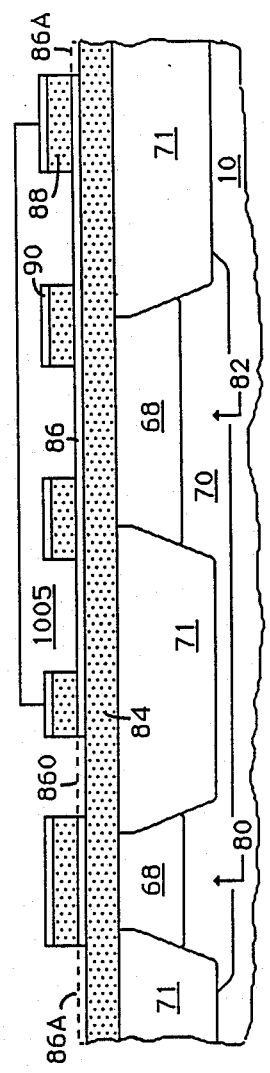
Figure 73C:
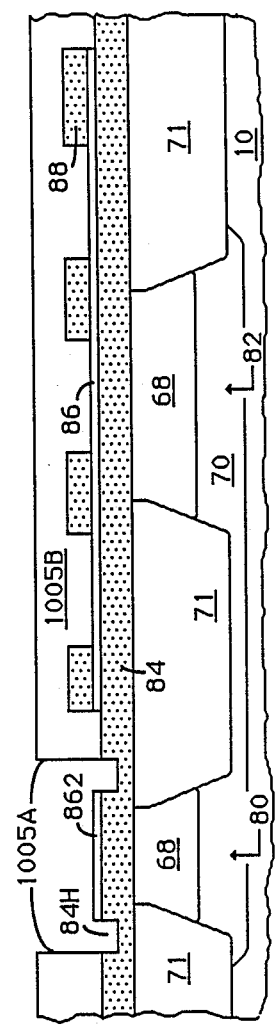
Figure 73D:
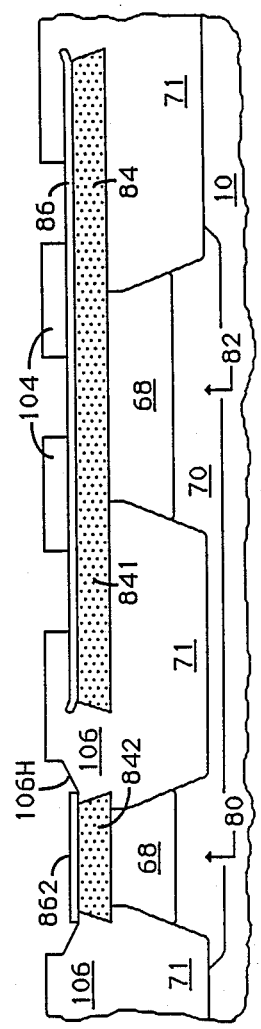
Figure 73E:
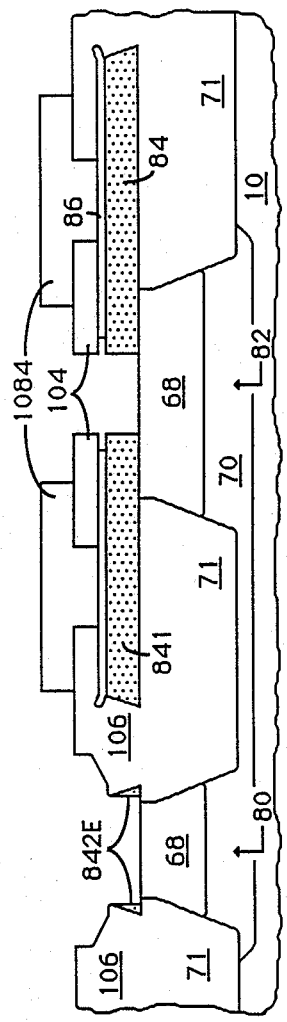
Figure 74A:
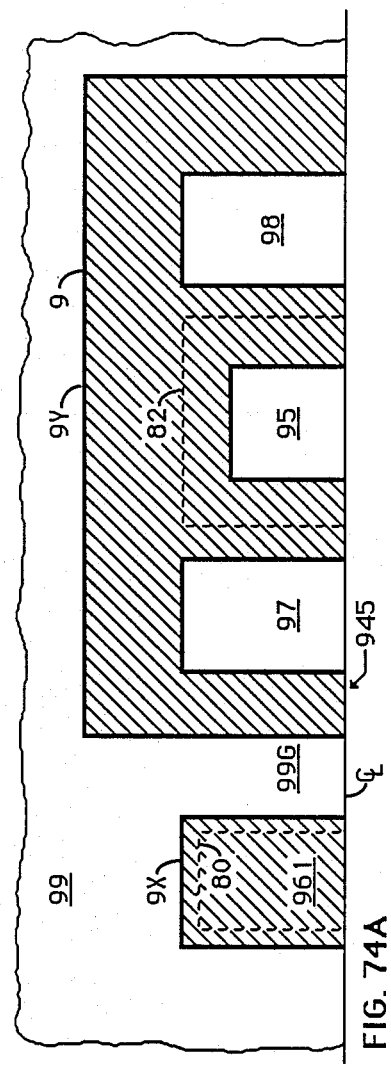
Figure 74B:
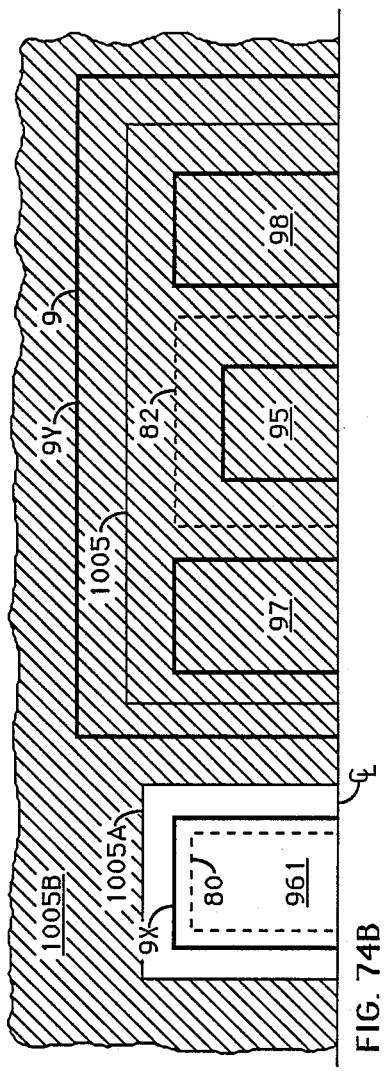

A fifth embodiment for providing a collector contact is illustrated in FIGS. 73A–E and 74A–B. FIGS. 73A–E are cross-sections analogous to FIGS. 71A–D. and FIGS. 74A–B are mask images analogous to FIGS. 72A–C. FIG. 73A shows a cross-section of the structure at a stage analogous to FIG. 4A, but having used master mask 945 depicted in FIG. 74A. Master mask 945 is similar to master mask 943 already discussed. First block-out mask 1005 is analogous to first block-out mask 100 in FIG. 5A, except that the shape is as shown in FIG. 73B and 74B. This allows portions 86A and 86O of nitride layer 86 to be removed (see FIG. 73B). Additional block-out mask 1005B having opening 1005A as shown in FIG. 73C and 74B is then applied and layer 84 partially etched through in the open region around portion 862 of nitride layer 86 (see FIG. 73C). The regular process now recommences and the resulting structure after oxidation of the exposed portions of layers 84 and 88 is shown in FIG. 73D. The structure of FIG. 73D closely resembles that of FIG. 71C except that the etching of portions 84H of layer 84 using mask 1005B results in sloped oxide portions 106H around nitride region 862 and poly region 842. Thereafter, the next block-out mask 1084 is applied just as in connection with FIG. 71D with the result shown in FIG. 73E. Thereafter the process continues as has been previously described.

The resulting structure has all of poly layer 84 removed around the collector contact and replaced by oxide. It will be noted that the self-aligned feature is retained but that an additional block-out mask is required.

Figure 75A:
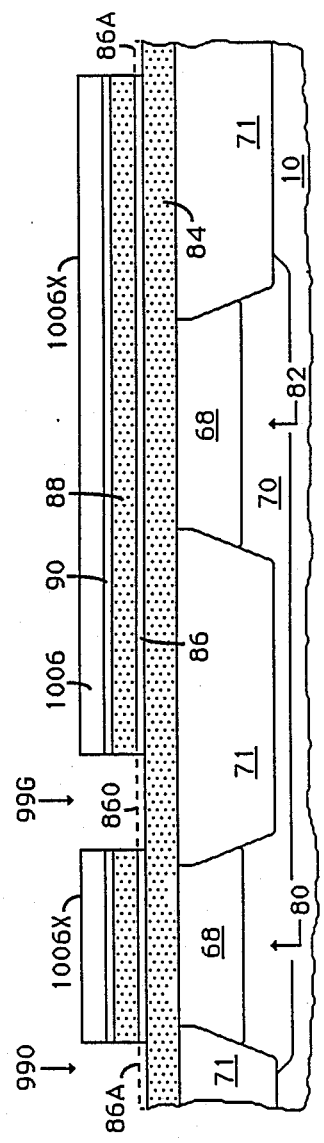
Figure 75B:
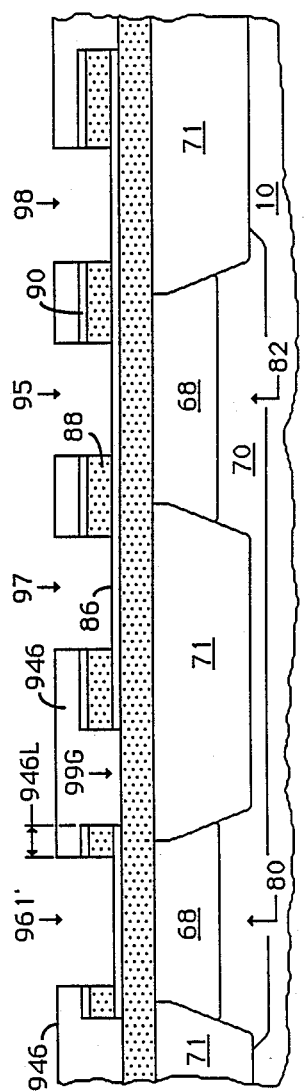
Figure 75C:
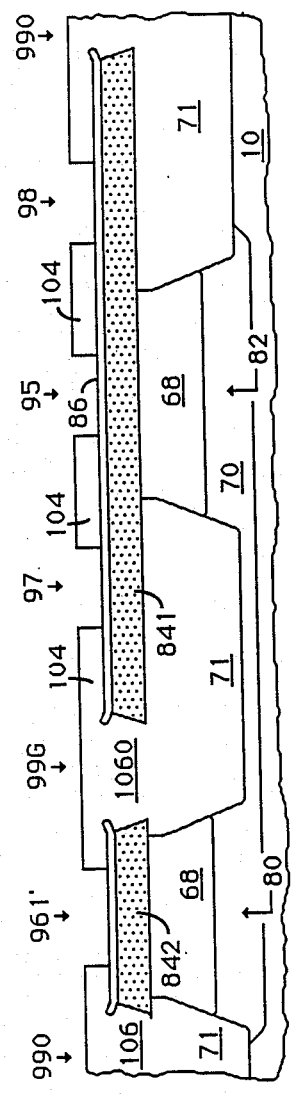

A sixth embodiment for providing a collector contact is illustrated in FIGS. 75A-C and 76A-B. FIGS. 75A-C are schematic cross-sections analogous to FIGS. 73A-D and FIGS. 76A-B are mask images analogous to FIGS. 74A-B. In this and the next embodiment, the order of the first block-out mask and the master mask are reversed. As shown in FIGS. 75A and 76A, a first mask 1006 is applied to the previously unetched stack of layers 84, 86, 88, 90. The images of openings 95, 97, and 98 shown in FIG. 76A are dashed to indicate the location that they will have since they have not yet been applied. Epi-islands 80, 82 are indicated as before. The function of mask 1006 having two parts 1006X, 1006Y is to permit removal of the portions of layers 90, 88, 86 under openings 99O, 99G, especially portions 86A and 86O of nitride layer 86. Then when the subsequent oxidation is performed, the underlying portions of layer 84 will not be protected and will convert to oxide. Master mask 946 is then applied as shown in FIGS. 75B, 76B. Master mask 947 has openings 961', 97, 95, and 98 as shown which are used to etch the underlying portions of layers 90 and 88 to expose corresponding portions of layer 86. The oxidation step is then performed to form oxides 104, 106, and 106O as shown in FIG. 75C. This isolates portion 842 of layer 84 from portion 841. The structure is now in substantially the same stage of fabrication as in 71C or 73D and processing continues as has been previously described.

Opening 961' in FIGS. 75B, 76B is laterally smaller than mask 1003X (see FIGS. 75A, 76A) by the alignment tolerance amount 946L. As a result, the opening in oxide 104 over poly portion 842 is smaller than poly portion 842. Thus, when the structure is etched in a manner analogous to the etch performed in FIGS. 69B, 71D, or 73E, larger fragments analogous to fragments 842E will be left behind. These may not completely oxidize during formation of regions 110, 111, 112 (see FIGS. 9-10A). Thus portions of region 842 may be left above epi-islan 80 in this embodiment with the effects already discussed in connection with FIG. 68A. However, this does no harm, since any portions of region 842 which remain in the structure of FIG. 75C above epi-island 80 after subsequent processing are isolated and separated from portion 841 of layer 84 around emitter island 82.

It will be noted that the self-aligned contact feature is retained and any remaining portions of poly 84 around the collector contact are isolated from the remainder of poly 84. Further, no additional mask is needed to accomplish this. The portions of nitride layer 86 exposed above the collector, base, and emitter contacts all have the same environment, in that their peripheries are all covered by oxide 104. This simplifies control of subsequent etching processes. Self-alignment between openings 95, 97, 97 and 961' is maintained, but they are no longer self-aligned to outer isolation periphery 990 (see FIGS. 75A-C).

Figure 77A:
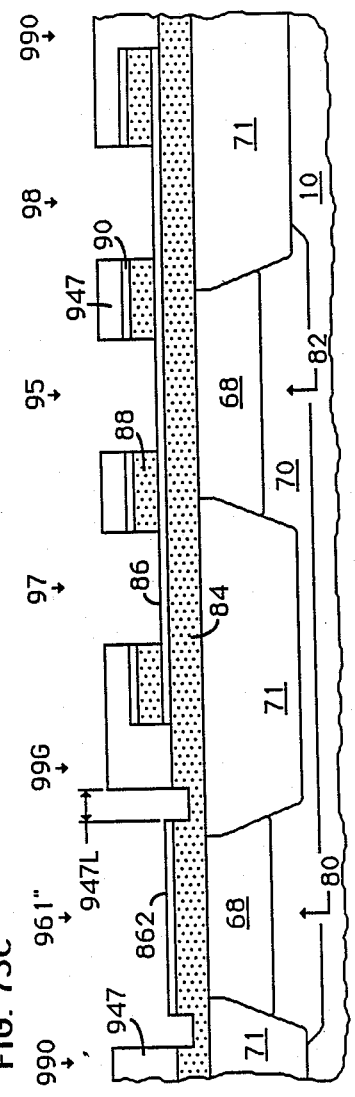
Figure 77B:
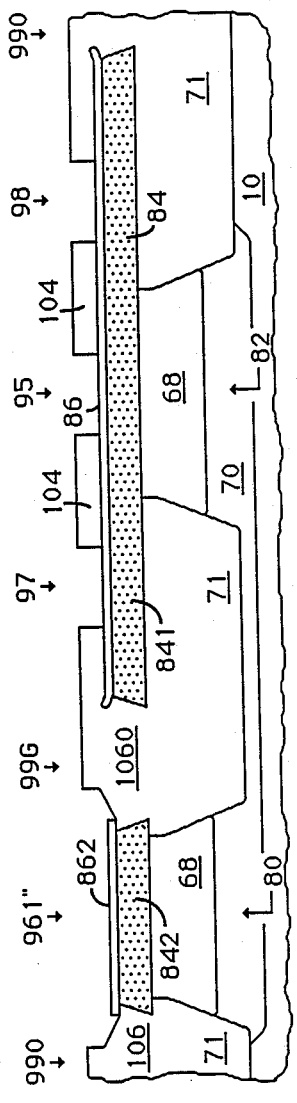

A seventh embodiment for forming a collector contact is illustrated in FIGS. 76A-B and 77A-B. FIGS. 77A-B are cross-sections analogous to FIGS. 75B-C. The procedure of this embodiment is identical to the sixth embodiment described immediately above except that master mask 947 shown in FIGS. 76B and 77A has an opening 961" which is larger than previous mask image 1006X. Opening 961" is indicated by the heavy dashed line in FIG. 76B and it will be understood that in mask 947 the portion of the mask interior to the heavy dashed outline indicated by the identifying number 961" is open. Otherwise the masks and processes of embodiments six and seven are substantially identical. The results of applying the combination of first block-out mask 1006 and master mask 947 is shown in FIG. 77A. Because opening 961" is laterally larger than image 1006X, a portion of layer 84 is exposed around the periphery of nitride portion 862 in FIG. 77A. This exposed portion of poly layer 84 is partially etched through as indicated and as has been previously described in connection with FIG. 73C in order that the amount of oxide formed in the immediate vicinity of opening 961" and nitride portion 862 is reduced. When the structure is oxidized as shown in FIG. 77B, then the oxide at the edges of nitride region 862 is outwardly tapered. This aids in step coverage. The alignment tolerance between masks 1006 and 947 is indicated by arrow 947L. As can be seen, alignment is not critical. The structure obtained in FIG. 77B is substantially identical to that shown in FIG. 73D and processing resumes in the same manner as has been previously described.

This seventh embodiment completely eliminates poly 84 around the collector contact. Self-alignment is maintained (a) between collector and outer isolation, and (b) between base and emitter contacts. Self-alignment is lost (a) between emitter-base and collector contacts, and (b) between emitter-base and outer isolation periphery. This embodiment is accomplished without need for any additional masks. As those of skill in the art will appreciate, the seven embodiments described above are all useful for producing collector contact structures where poly 84 is either eliminated from around the collector contact or is isolated and separated from other portions of poly 84 used for base contacts or other things. The choice from among the various alternatives presented can be made by persons of skill in the art depending upon what arrangement most easily suits his particular manufacturing capabilities or the particular structural configuration desired. Those of skill in the art will also appreciate, that the foregoing processes and structures can also be applied to other types of contacts besides collector contacts, where it is desired to make contact to a portion of the monocrystalline substrate and have that contact separated from or not surrounded by a portion of poly layer 84 being used to contact another nearby substrate region.

SUMMARY

Thus, it is apparent that there has been provided, in accordance with the invention, device structures and processes for their fabrication which fully meet the objects and advantages set forth above. The various devices described may be fabricated simultaneously on a common substrate with particular ease, in very small areas and pitch, and with high density. Further, the devices obtained exhibit outstanding performance and manufacturability.

Although the invention has been described and illustrated with reference to particular embodiments, as for example particular NPN or PNP transistors, it is not intended that the invention be limited to these illustrative embodiments. Those skilled in the art will recognize, after a review of the foregoing detailed description, that variations and modifications are possible which differ from the illustrative embodiments without departing from the spirit of the invention. For example, other methods for forming certain layers, such as other deposition techniques, or deposition instead of other deposition techniques, or deposition instead of thermal growth, or other methods and chemicals for etching, and other thicknesses and doping concentrations, are among the possible modifications. In addition, other doping techniques than ion implantation can be used in certain of the doping steps. Further, while materials such as silicon nitride and silicon oxide are particularly illustrated as being used at various stages of the process, for example as dielectrics and as differentially etchable masks, other materials having equivalent properties can also be utilized. Similarly, polycrystalline silicon is used as a mask, dopant source, conductor, and source for growing dielectric oxide. Those of skill in the art will understand that other materials having the combination of properties required of a particular poly layer can also be used. A number of binary and ternary silicides well known in the art have appropriate properties and are believed useful. Further, while the substrates illustrated have been of silicon single crystal material, those of skill in the art will understand that other semiconductor materials may also be used. Further, the substrates need not be homogeneous single crystal wafers. Composite substrates having, for example, single crystal layers formed on amorphous or other base materials may also be used. Those of skill in the art will understand, after reading the foregoing descriptions, when such variations are appropriate and how they may be accomplished. Accordingly, it is intended to include within the invention all such variations and modifications as fall within the scope of the appended claims.

We claim:

1. A process for fabricating a semiconductor device comprising the steps of:

providing a semiconductor substrate having a first surface; forming a lateral isolation region at least partially surrounding an exposed first region of said semiconductor substrate extending to said surface;

forming on said surface a first layer wherein said first layer is of a first material which is conductive but can be locally converted to a dielectric;

forming a second layer overlying said first layer, wherein said second layer is of a second material which can protect first portions of said first layer while second portions of said first layer are converted to dielectric;

forming a third layer overlying said second layer, wherein said third layer comprises a third material which can be locally converted to a dielectric;

patterning said third layer to define first and second contact regions and an external region lying outside a perimeter surrounding and spaced apart from said first and second contact regions, said first contact region being located at least partially over said exposed region of said substrate and said second contact region being located at least partially over said lateral isolation region, whereby said third layer is removed in said first and second contact regions and outside said perimeter;

removing portions of said second layer exposed outside said perimeter to expose said second portion of said first layer;

exposing remaining portions of said third layer within said perimeter; and converting said exposed portions of said first and third layers to form a first dielectric.

2. The process of claim 1 further comprising:

providing a block-out mask having a closed portion covering at least the second contact region and an opening exposing the first contact region:

removing a portion of said first layer in said first contact region to form a first opening therethrough re-exposing a first part of the first region of said substrate thereunder and edges of said first layer in said opening; and forming a second dielectric on said exposed first part, and further on said edges of said first layer exposed in said first opening to form dielectric side-walls thereon.

3. The process of claim 2, wherein said exposed first region of said substrate is of a first conductivity type, and further comprising prior to said step of forming said third layer, doping said first layer with a first dopant of a second opposite type, and further comprising after said step of doping said first layer, diffusing said first dopant from said first layer into a second part of said substrate to form a first device region therein, and further comprising after said step of doping said second part, doping at least some of said first part of said substrate with a second dopant of the first type to form a second device region therein.

4. The process of claim 1 further comprising the step of selecting the thickness of said first and third layers such that after said converting step, the dielectric formed from said first layer has substantially the same thickness as the sum of the thicknesses of the dielectric formed from said third layer plus the thickness of the unconverted portion of said first layer plus the thickness of said second layer.

5. A process for fabricating an electronic device, comprising:

providing a substrate having an exposed surface;

forming a first layer of oxidizable conductor material on said exposed surface;

forming a second layer of an oxidation resistant material on said first layer;

forming a third layer of oxidizable material on said second layer;

at least temporarily applying a fourth layer of masking material on said third layer, having at least first and second openings therein extending to the third layer and a closed region therebetween wherein said first opening surrounds said closed region;

removing first portions of said second and third layers at least under said first opening thereby exposing a first portion of said first layer while leaving in place other portions of said first, second and third layers which lay under said closed region; and oxidizing said first portion of said first layer and said other portion of said third layer.

6. The process of claim 5 wherein said oxidizing step comprises oxidizing completely through said first portion of said first layer.

7. A process for fabricating an electronic device, comprising:

providing a substrate having an exposed surface;

forming a first layer of oxidizable conductor material on said exposed surface;

forming a second layer of an oxidation resistant material on said first layer;

forming a third layer of oxidizable material on said second layer:

at least temporarily applying a fourth layer of masking material on said third layer, having at least first and second openings therein extending to the third layer and a closed region therebetween:

removing a first portion of said third layer under at least said first and second openings and removing a first portion of said second layer under at least said first opening while leaving a second portion of said second layer under said second opening which is retained in place during a subsequent oxidation step; and oxidizing said first portion of said first layer and a portion of said third layer underlying said closed region.

8. The process of claim 7 further comprising after said oxidizing step, removing said second portion of said second layer to expose a second portion of said first layer, and applying a conductor in contact with said second portion of said first layer.

9. The process of claim 7 wherein said applying step comprises applying the fourth masking layer also having third and fourth openings, and furhter comprising after said oxidizing step, removing second, third and fourth portions of the second layer under the second, third and fourth openings, respectively.

10. The process of claim 9 further comprising removing a part of the first layer under said third opening thereby creating a hole in said first layer having sidewalls extending to said surface.

11. The process of claim 10 further comprising forming a further dielectric on said sidewalls of said first layer.

12. The process of claim 11 further comprising forming a doped semiconductor region of a first conductivity type in said surface underneath the third opening.

13. The process of claim 12 wherein the substrate comprises a semiconductor at the exposed surface and wherein the step of forming the doped semiconductor region underneath the third opening comprises forming a doped conductor layer in contact with a region of the surface underneath the third opening and doping the region of the surface from the doped conductor layer.

14. A process for forming an electronic device comprising:

providing a substrate having, in a first location, an insulating surface;

providing a first layer of polycrystalline conductor material on said surface;

providing a second layer of oxidation resistant material on said first layer;

providing a third layer of polycrystalline conductor material on said second layer;

removing first portions of said second and third layers so as to expose a first portion of said first layer and removing a second portion of said third layer so as to expose a second portion of said second layer, wherein said first portion laterally encloses said second portion, and wherein third portions of said second and third layers remain laterally between said first and second portions, and wherein said third portion of said third layer is exposed;

converting said first portion of said first layer and said third portion of said third layer to dielectric leaving second and third portions of said first layer underlying, respectively, said second and third portions of said second layer;

removing said second portion of said second layer to exposed said second portion of said first layer lying thereunder; and applying a conductor in contact with said second portion of said first layer.

15. The process of claim 14 wherein said second portion of said second layer has first and second separated parts and wherein said applying step comprises applying separated conductors in contact, respectively, with first and second connected parts of said first layer underlying said first and second separated parts of said second layer.

16. A process for forming a semiconductor device comprising:

providing a substrate having a surface;

forming a first layer of plycrystalline semiconductor overlying said surface;

covering said first layer with a second layer of oxidation resistant material and a third layer of oxidizable material;

removing first portions of said second and third layers to expose a first portion of said first layer while second and third portions of said first layer, underlying second and third portions respectively of said second and third layers remain covered;

removing said second portion of said third layer to expose said second portion of said second layer, leaving said third portion of said second layer covered and said third portion of said third layer exposed;

after said step of forming said first layer of polycrystalline semiconductor and prior to a following oxidation step, doping said first layer with a dopant of a first type;

oxidizing said first portion of said first layer and said third portion of said third layer to form a dielectric through said oxidized portions;

removing said second portion of said second layer to expose said second portion of said first layer;

depositing another layer of polycrystalline semiconductor on said exposed second portion of said first layer;

during or after said depositing step and before said following heating step, doping said another layer with a dopant of a second type opposite said first type; and heating to form a PN junction between said another layer and the first layer.

17. The process of claim 16 wherein said step of providing said substrate comprises providing a semiconductor substrate having a dielectric surface for receiving a part of said first layer.

18. A process for fabricating a semiconductor device including the steps of:
providing a semiconductor substrate having a surface of a first conductivity type and with an insulation region laterally enclosing a semiconductor device region extending to said surface;
forming overlying said surface and said insultation region a first polycrystalline layer containing a semiconductor, a second oxidation masking layer, and a third oxidizable layer;
doping said first layer with impurities of a second conductivity type opposite said first type;
patterning said third layer with a mask to define a first contact pattern, a second contact pattern, and a third contact pattern of said semiconductor device, said first contact pattern at least partly overlying said surface and said second and third contact patterns at least partly overlying said lateral insulation region;
patterning said third layer and said second layer to expose part of said first layer outside said semiconductor device region;
oxidizing said third layer and said exposed part of said first layer;
forming an opening underneath the first contact pattern through said first layer to expose said surface for locating a first contact region therein;
forming a dielectric spacer on sidewalls of said opening;
depositing a fourth layer of polycrystalline material containing a semiconductor for contacting said surface in said first contact region;
after said first doping step and before said step of forming said fourth layer, heating to diffuse said impurities of said second type from aid first layer into said surface to form second and third contact regions in said substrate; and
doping said first contact region with impurities of said first type.

19. The process of claim 18 wherein said step of providing said substrate having an insultation region laterally enclosing a semiconductor device region comprises providing a semiconductor device region having two islands connected within said substrate and separated at said surface by a further insulation region, and wherein said step of patterning said third layer with a mask to define first, second, and third contact patterns comprises locating at least one of these patterns at least partly above one of said two islands of said device region and locating a further opening at least partly above another of said two islands.

20. A process for forming a semiconductor device including the steps of:
providing a semiconductor substrate having a surface region of a first conductivity type and of a first width and first length and laterally surrounded by an isolation region;
providing a first conductor layer overlying said isolation region and contacting said surface region;
providing an oxidation resistant layer overlying said first layer;
providing an oxidizable layer overlying said oxidation resistant layer;
providing an etching mask having first and second openings located respectively in first and second spaced apart protective portions wherein said first and second protective portions are separated by a gap;
wherein said gap has a second width narrower than said first width and aligned to be located therein, and wherein said gap has a second length longer than said first length;
wherein said openings are laterally separated from said gap and are located at least partly above said isolation region;
removing a first portion of said oxidizable layer underlying said gap and said openings, leaving undisturbed a second portion of said oxidizable layer underlying said protective portions of said mask;
removing at least a first portion of said oxidation resistant layer lying laterally outside said protective portions of said mask and said gap, thereby exposing a corresponding first portion of said first layer, while leaving undisturbed a second portion of said oxidation resistant layer underlying said openings and a third portion of said oxidation resistant layer underlying said protective portions; and
converting at least said second portion of said oxidizable layer and said first portion of said first layer to a first dielectric.

21. The process of claim 20 further comprising:
leaving said oxidation resistant layer in place under said gap during said converting step so that a corresponding portion of the first layer underlying said gap is not converted to a dielectric during said converting step; and then
removing said oxidation resistant layer under said gap to expose a corresponding portion of said first layer underlying said gap; and
etching away said portion of said first layer underlying said gap so as to expose a first part of said surface region underlying said gap and divide said first layer into two portions separated by said gap wherein said two portions comprise a second portion of said first layer in contact with a second part of the substrate surface region and a third portion of the first layer in contact with a third part of the substrate surface region, wherein said second and third separated portions of said first layer have exposed sidewalls adjacent said gap extending to said substrate.

22. The process of claim 21 further comprising treating said exposed sidewalls of said first polycrystalline semiconductor layer and said exposed part of said surface region under said gap to form a second dielectric thereon.

23. The process of claim 22 further comprising providing a conductor in contact with said second dielectric under said gap.

24. The process of claim 21 further comprising treating said exposed sidewalls of said first layer to form a second dielectric thereon and thereafter forming a conductor in contact with the substrate surface region at least partly under said gap.

25. A process for fabricating a semiconductor device which comprises the steps:
providing a semiconductor substrate having a surface of a first conductivity type;
forming an isolation region lateriall separating first and second regions of said surface;

forming in stacked relationship overlying the surface a first conductor containing layer, a second oxidation masking layer, and a third layer;

doping said first layer with a dopant of a second type;

patterning said third layer with a single mask to define an active device area including a current source contact area in said first region of said substrate, a current sink contact area in said second region of said substrate, and a control region contact area overlying said isolation region;

removing a portion of said third layer and said second layer surrounding said first and second surface regions thereby exposing a portion of said first layer;

oxidizing said third layer and said exposed portion of said first layer;

forming a first opening having sidewalls extending through said first layer overlying said current source contact area to expose a first portion of said first region of said surface;

forming a second opening overlying said current sink contact area to expose a first portion of said second region of said surface;

forming an insulator on said exposed sidewalls;

diffusing said dopant from said first layer into a second portion of said first region of said substrate surface to form a control region adjacent said current source contact area; and then in either order, (i) doping at least part of said first portion of said first region with impurities of said first conductivity type to form a doped current source region separated from said control region, and (ii) forming a fourth conductor layer having an area contacting said current source region.

26. A process for forming a semiconductor device comprising:

providing a semiconductor substrate having first and second interconnected regions laterally separated by an isolation wall and extending to a surface of said substrate;

providing a first conductor layer on said surface overlying said first and second regions of said substrate and said separating isolation wall;

providing a mask overlying said first layer for simultaneously locating and aligning a device region and a contact region in said substrate;

wherein said mask comprises a protective region with a first opening for locating said device region within said first region of said substrate and a second opening for locating said contact region in said second region of said substrate;

wherein said mask has a first exterior perimeter enclosing said first opening and separated therefrom by a first part of said protective region;

wherein said mask has a second exterior perimeter enclosing said second opening and separated therefrom by a second part of said protective region;

wherein said first and second parts of said protective region do not overlap and said first and second perimeters are spaced apart to form an unprotected gap therebetween; and forming said device region in said first region of said substrate under said first opening and said contact region in said second region of said substrate under said second opening.

27. A process for forming a semiconductor device, comprising:

providing a semiconductor substrate having first and second regions extending to a surface, laterally separated by a dielectric isolation region at said surface, and internally connected within said substrate;

forming on said surface and above said isolation region a first layer of conductor;

forming a second layer of dielectric on said first layer;

forming a third layer on said second layer;

using a single mask, etching said third layer to define a first contact location at least partly above said first substrate region, and a second contact location at least partly above said second substrate region, a separator location between said first and second contact locations, and a perimter location laterally surrounding said contact locations, to remove part of said third layer thereby exposing part of said second layer underneath said locations and leaving a remainder of said third layer;

removing a first portion of said second layer in said separator and perimeter locations to expose a first portion of said first layer thereunder; and converting said first portion of said first layer and said remainder of said third layer to dielectric.

28. A process for forming a semiconductor device comprising:

providing a semiconducor substrate having a first and second interconnected regions of a first conductivity type laterally separated by an isolation region and extending to a surface of said substrate;

forming first and second spaced apart doped portions of a second conductivity type opposite said first type in the first substrate region separated by a third portion of the first substrate region;

providing a first conductor layer over the substrate in contact with the first and second portions of the first substrate region;

providing a second oxidation resistant layer on the first layer;

providing a third layer on the second layer; and patterning a third layer with a single mask to form therein first, second and third openings at least partially overlying, respectively, the first, second and third portions of the first region of the substrate, a fourth opening above the second region of the substrate, and a fifth opening surrounding and separated from the first through fourth openings 29. A process for forming a semiconductor device comprising:

providing a semiconductor substrate having first and second interconnected regions laterally separated by an isolation region and extending to a surface of said substrate;

providing a first conductor layer overlying the substrate;

providing an oxidation resistant layer overlying the first layer;

providing a third layer overlyping the second layer;

patterning the third layer to provide therethorugh first and second spaced apart openings at least partly overlying the first substrate region, a third opening at least partly overlying the separating isolation region, a fourth opening overlying the second substrate region and a fifth opening surrounding the first through fourth openings and separated from the first, second and fourth openings;

removing the second layer under the third and fifth openings, thereby exposing third and fifth portions of the first layer;

converting the third and fifth portions of the first layer to dielectric; and removing a first portion of the first layer underlying the first opening.

30. The process of claim 29 wherein the third and fifth openings are connected.

31. The process of claim 30 wherein the converting step comprises separating the first layer into two electrically isolated portions, a first portion in contact with the first substrate region and a second portion in contact with the second substrate region.

32. The process of claim 31 wherein a first portion of the substrate underlies the first opening, a second portion of the substrate underlies the second opening, a third portion of the substrate underlies the third opening and a fourth portion of the substrate underlies the fourth opening, and wherein, at the surface, the first region of the substrate has a first conductivity type and the second region of the substrate has a second, opposite, conductivity type, and further comprising introducing a first dopant of the second type into the second and fourth portions of the substrate.

33. The process of claim 32 further comprising doping the first portion of the substrate with a second dopant of the first type.

34. The process of claim 29 wherein the step of providing the internally connected first and second semiconducting regions extending to the surface of the substrate comprises providing at least one PN junction between the surface of the first region and the surface of the second region.

35. The process of claim 28 further comprising, removing the portions of the second layer exposed in the third and fifth openings, thereby exposing, respectively, third and fifth portions of the first layer, and converting the third and fifth portions of the first layer and exposed portions of the third layer to dielectric.

* * * * *